United States Patent
Fang et al.

(10) Patent No.: US 8,178,376 B2
(45) Date of Patent: May 15, 2012

(54) METHOD FOR FABRICATING LED CHIP COMPRISING REDUCED MASK COUNT AND LIFT-OFF PROCESSING

(75) Inventors: Kuo-Lung Fang, Hsinchu (TW); Chien-Sen Weng, Hsinchu (TW); Chih-Wei Chao, Hsinchu (TW)

(73) Assignee: Lextar Electronics Corp., Hsinchu (TW)

( * ) Notice: Subject to any disclaimer, the term of this patent is extended or adjusted under 35 U.S.C. 154(b) by 0 days.

(21) Appl. No.: 13/046,619

(22) Filed: Mar. 11, 2011

(65) Prior Publication Data

US 2011/0159613 A1 Jun. 30, 2011

Related U.S. Application Data

(62) Division of application No. 12/252,370, filed on Oct. 16, 2008, now Pat. No. 7,927,901.

(30) Foreign Application Priority Data

Jul. 18, 2008 (TW) ............................... 97127462 A

(51) Int. Cl.
*H01L 21/00* (2006.01)

(52) U.S. Cl. ............ 438/46; 438/670; 438/951; 257/79; 257/E33.065

(58) Field of Classification Search .................. None
See application file for complete search history.

(56) References Cited

U.S. PATENT DOCUMENTS

| | | |
|---|---|---|
| 4,999,310 A | 3/1991 | Kim |
| 6,583,443 B1 | 6/2003 | Chang et al. |
| 6,936,860 B2 | 8/2005 | Sung et al. |
| 7,335,519 B2 | 2/2008 | Shei et al. |
| 7,687,821 B2 * | 3/2010 | Jeon et al. .................. 257/99 |
| 2004/0209407 A1* | 10/2004 | Chae .......................... 438/149 |
| 2004/0266044 A1* | 12/2004 | Park et al. .................... 438/46 |
| 2006/0121634 A1 | 6/2006 | Ahn |
| 2007/0153857 A1 | 7/2007 | Chua et al. |
| 2008/0003726 A1 | 1/2008 | Park |

FOREIGN PATENT DOCUMENTS

| JP | 03066181 | 3/1991 |
|---|---|---|
| JP | 2007103433 | 4/2007 |

\* cited by examiner

*Primary Examiner* — Evan Pert
*Assistant Examiner* — Andres Munoz
(74) *Attorney, Agent, or Firm* — Thomas|Kayden

(57) ABSTRACT

A method for fabricating a light emitting diode chip is provided. In the method, a half-tone mask process, a gray-tone mask process or a multi-tone mask process is applied and combined with a lift-off process to further reduce process steps of the light emitting diode chip. In the present invention, some components may also be simultaneously formed by an identical process to reduce the process steps of the light emitting diode chip. Consequently, the fabricating method of the light emitting diode provided in the present invention reduces the cost and time for the fabrication of the light emitting diode.

7 Claims, 75 Drawing Sheets

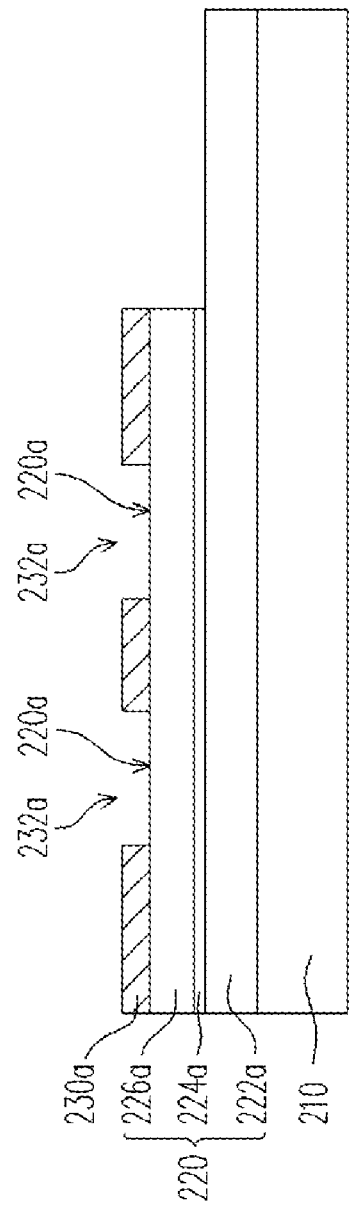
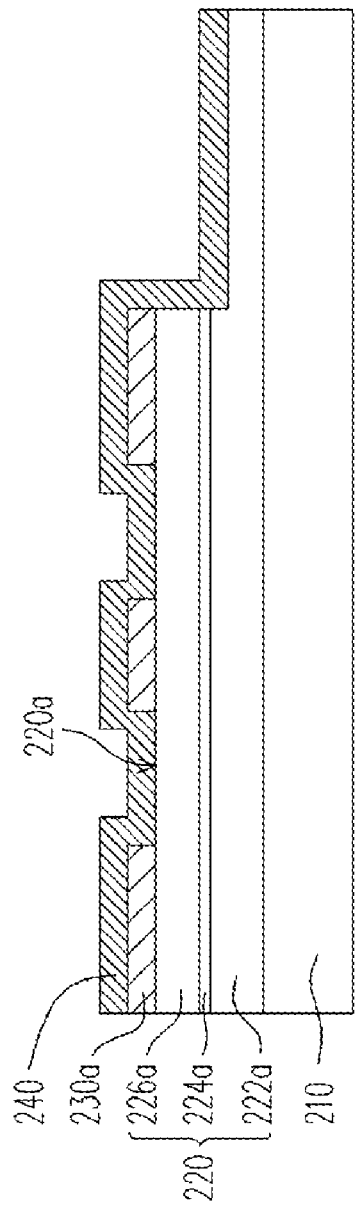
FIG. 4A
FIG. 4B

METHOD FOR FABRICATING LED CHIP COMPRISING REDUCED MASK COUNT AND LIFT-OFF PROCESSING

CROSS REFERENCE TO RELATED APPLICATION

This application is a divisional application of U.S. patent application Ser. No. 12/252,370, filed Oct. 16, 2008, now U.S. Pat. No. 7,927,901, which claims the priority benefit of Taiwan application serial no. 97127462, filed on Jul. 18, 2008. The entirety of the above-mentioned patent application is hereby incorporated by reference herein and made a part of specification.

BACKGROUND OF THE INVENTION

1. Field of the Invention

The present invention relates to a method for fabricating a chip, and more particularly to a method for fabricating a light emitting diode chip.

2. Description of Related Art

FIGS. 1A through 1F show a fabrication flowchart of a conventional light emitting diode chip. First, a first type semiconductor material layer 122, a light emitting material layer 124 and a second type semiconductor material layer 126 are sequentially formed on a substrate 110 to further form a semiconductor layer 128, as shown by FIG. 1A. A method for forming the semiconductor layer 128 is, for example, a chemical vapor deposition (CVD) process, during which the first type semiconductor material layer 122, the light emitting material layer 124 and the second type semiconductor material layer 126 are sequentially formed on the substrate 110.

Afterwards, the semiconductor layer 128 is patterned to form a semiconductor device layer 120, as shown in FIG. 1B. The semiconductor device layer 120 is formed by a conventional photolithography and etching process (PEP), for example.

Thereafter, a current blocking layer 130 is formed on an upper surface 120a of the semiconductor device layer 120, as shown by FIG. 1C. The current blocking layer 130 is formed by a conventional PEP, for example. To give an example, after a dielectric material layer (not shown) is formed entirely on the substrate 110, the dielectric material layer is patterned to form the current blocking layer 130 as shown by FIG. 1C.

Then, a current spreading layer 140 is formed on the upper surface 120a of the semiconductor device layer 120 to cover the current blocking layer 130, as shown by FIG. 1D. The current spreading layer 140 is formed by a conventional PEP, for example. To give an example, a conductive layer (not shown) is first formed entirely on the substrate 110 to cover the semiconductor device layer 120 and the current blocking layer 130. Next, the conductive layer is patterned to form the current spreading layer 140, as shown by FIG. 1D.

After the foregoing steps are completed, a plurality of electrodes 150 is formed on the current spreading layer 140 and the semiconductor device layer 120, as shown by FIG. 1E. The electrodes 150 are formed by a conventional PEP, for example. To give an example, an electrode material layer (not shown) is formed entirely on the current spreading layer 140 and the semiconductor device layer 120. Next, the electrode material layer is patterned to form the plurality of electrodes 150 on the current spreading layer 140 and the semiconductor device layer 120, as shown by FIG. 1E.

Then, a passivation layer 160 is formed on the current spreading layer 140 and the semiconductor device layer 120 which are not covered by the electrodes 150, as shown by FIG. 1F. The passivation layer 160 is formed by a conventional PEP, for example. To give an example, a dielectric material layer (not shown) is formed entirely to cover the current spreading layer 140, the electrodes 150 and the semiconductor device layer 120. Then, the dielectric material layer is patterned to form the passivation layer 160 on the current spreading layer 140 and the semiconductor device layer 120 which are not covered by the electrodes 150, as shown by FIG. 1F. So far, the process steps of the conventional light emitting diode chip 100 are generally completed.

In view of the foregoing, the method for fabricating the conventional light emitting diode chip 100 performs at least five mask processes to form a plurality of components respectively, such as the semiconductor device layer 120, the current blocking layer 130, the current spreading layer 140, the electrodes 150 and the passivation layer 160. Thus, the light emitting diode chip 100, which requires at least five mask photo processes to fabricate, needs to use a plurality of masks having different patterns. Since each of the masks is rather costly, the fabrication cost and the fabrication time of the light emitting diode chip 100 cannot be reduced.

SUMMARY OF THE INVENTION

In light of the foregoing, the present invention provides a method for fabricating a light emitting diode chip. The method applies a half-tone mask process, a gray-tone mask process or a multi-tone mask process, a lift-off process or an identical mask process to simultaneously form a plurality of components to reduce the process steps of the light emitting diode chip and thereby reduce the fabrication cost and the fabrication time.

The present invention provides a method for fabricating a light emitting diode chip. First, a semiconductor device layer is formed on a substrate and a current spreading layer is formed on the semiconductor device layer. Afterwards, a dielectric layer is formed on the substrate to cover the semiconductor device layer and the current spreading layer. Thereafter, a patterned photoresist layer is formed on the dielectric layer. The patterned photoresist layer includes a first photoresist block and a second photoresist block. A thickness of the first photoresist block is thinner than a thickness of the second photoresist block. Then, a portion of the dielectric layer is removed using the patterned photoresist layer as a mask to form a patterned dielectric layer. The patterned dielectric layer exposes a portion of the semiconductor device layer and a portion of the current spreading layer. Afterwards, a thickness of the patterned photoresist layer is reduced until the first photoresist block is removed completely. Next, an electrode material layer is formed entirely. Next, the patterned photoresist layer is removed to strip the electrode material layer thereon to form the plurality of electrodes. The electrodes are electrically connected with the semiconductor device layer and the current spreading layer.

According to an embodiment of the present invention, the semiconductor device layer and the current spreading layer are formed by the following steps. First, a semiconductor layer is formed on a substrate. Then, the semiconductor layer is patterned to form a semiconductor device layer. Next, a current spreading layer is formed on the semiconductor device layer.

According to an embodiment of the present invention, the semiconductor layer is formed by the following steps. First, a first type semiconductor material layer, a light emitting material layer and a second type semiconductor material layer are sequentially formed on the substrate. Afterwards, the first type semiconductor material layer, the light emitting material layer and the second type semiconductor material layer are patterned to form a first type semiconductor device layer, a light emitting layer and a second type semiconductor device layer. The light emitting layer is disposed on a portion of the first type semiconductor device layer, and the second type semiconductor layer is disposed on the light emitting layer.

According to an embodiment of the present invention, the current spreading layer is formed by the following steps. First, a conductive layer is formed on the semiconductor device layer. Then, the conductive layer is patterned to form the current spreading layer.

According to an embodiment of the present invention, the semiconductor device layer and the current spreading layer are formed by the following steps. First, a semiconductor layer is formed on the substrate. Next, a conductive layer is formed on the semiconductor layer. Then, the semiconductor layer and the conductive layer are patterned to form the semiconductor device layer and the current spreading layer simultaneously.

According to an embodiment of the present invention, the semiconductor device layer and the current spreading layer are formed by the following steps. First, a first type semiconductor material layer, a light emitting material layer, a second type semiconductor material layer and a conductive layer are sequentially formed on the substrate. Next, the conductive layer, the second type semiconductor material layer, the light emitting material layer and the first type semiconductor material layer are patterned to form a first type semiconductor device layer, a light emitting layer, a second type semiconductor device layer and the current spreading layer simultaneously. The light emitting layer is disposed on a portion of the first type semiconductor layer; the second type semiconductor layer is disposed on the light emitting layer, and the current spreading layer is disposed on the second type semiconductor layer.

According to an embodiment of the present invention, the photoresist layer is developed by a half-tone mask process, a gray-tone mask process or a multi-tone mask process.

The present invention further provides a method for fabricating a light emitting diode chip. First, a semiconductor layer and a conductive layer are sequentially formed on a substrate. Thereafter, a first patterned photoresist layer is formed on the conductive layer. The first patterned photoresist layer includes a first photoresist block and a second photoresist block. A thickness of the first photoresist block is thinner than a thickness of the second photoresist block. Then, a portion of the conductive layer and a portion of the semiconductor layer are removed using the first patterned photoresist layer as a mask to form a semiconductor device layer. Next, the thickness of the first patterned photoresist layer is reduced until the first photoresist block is completely removed. A portion of the conductive layer is removed using the remaining second photoresist block as a mask to form a current spreading layer. The current spreading layer partially exposes the semiconductor device layer. Then, the remaining second photoresist block is removed. Afterwards, a patterned dielectric layer and a plurality of electrodes are formed on the current spreading layer and the semiconductor device layer.

According to an embodiment of the present invention, the current spreading layer has an opening to expose an upper surface of the semiconductor device layer. The dielectric layer contacts with the upper surface of the semiconductor device layer through the opening.

According to an embodiment of the present invention, the electrodes and the patterned dielectric layer are fabricated by different mask processes respectively.

According to an embodiment of the present invention, the patterned dielectric layer and the electrodes are formed by the following steps. First, a dielectric layer is formed on the substrate to cover the semiconductor device layer and the current spreading layer. Next, a second patterned photoresist layer is formed on the dielectric layer. Then, a portion of the dielectric layer is removed using the second patterned photoresist layer as a mask to form a patterned dielectric layer. The patterned dielectric layer exposes a portion of the semiconductor device layer and a portion of the current spreading layer. Next, an electrode material layer is formed entirely. Thereafter, the second patterned photoresist layer is removed to strip the electrode material layer thereon to form plurality of electrodes. The electrodes are electrically connected with the semiconductor device layer and the current spreading layer.

According to an embodiment of the present invention, the patterned dielectric layer and the electrodes are formed by the following further steps. First, a dielectric layer is formed on the substrate to cover the semiconductor device layer and the current spreading layer. Thereafter, a third patterned photoresist layer is formed on the dielectric layer. The third patterned photoresist layer includes a third photoresist block and a fourth photoresist block. A thickness of the third photoresist block is thinner than a thickness of the fourth photoresist block. Then, a portion of the dielectric layer is removed using the third patterned photoresist layer as a mask to form a patterned dielectric layer. The patterned dielectric layer exposes a portion of the semiconductor device layer and a portion of the current spreading layer. Afterwards, the thickness of the third patterned photoresist layer is reduced until the third photoresist block is removed completely. Next, an electrode material layer is formed entirely. Thereafter, the third patterned photoresist layer is removed to strip the electrode material layer thereon to form a plurality of electrodes. The electrodes are electrically connected with the semiconductor device layer and the current spreading layer.

According to an embodiment of the present invention, the third patterned photoresist layer is formed by a half-tone mask process, a gray-tone mask process or a multi-tone mask process.

The present invention further provides a method for fabricating a light emitting diode chip. First, a semiconductor layer and a dielectric layer are sequentially formed on a substrate. Thereafter, a first patterned photoresist layer is formed on the dielectric layer. The first patterned photoresist layer includes a first photoresist block and a second photoresist block. A thickness of the first photoresist block is thinner than a thickness of the second photoresist block. Then, a portion of the dielectric layer and a portion of the semiconductor layer are removed using the first patterned photoresist layer as a mask to form a semiconductor device layer. Next, the thickness of the first patterned photoresist layer is reduced until the first photoresist block is completely removed. Then, a portion of the dielectric layer is removed using the remaining second photoresist block as a mask to form a patterned dielectric layer. The patterned dielectric layer partially exposes the semiconductor device layer. Then, the remaining second photoresist block is removed. Afterwards, a current spreading layer and a plurality of electrodes are formed on the patterned dielectric layer and the semiconductor device layer.

According to an embodiment of the present invention, the current spreading layer and the electrodes are fabricated by different mask processes respectively.

According to an embodiment of the present invention, the method for fabricating the light emitting diode chip further includes forming a passivation layer on the current spreading layer and the semiconductor device layer which are not covered by electrodes.

According to an embodiment of the present invention, the current spreading layer and the electrodes are formed by the following steps. First, a current spreading layer is formed on the patterned dielectric layer and the semiconductor device layer. Afterwards, a passivation layer is formed on the current spreading layer and the semiconductor device layer. Then, a second patterned photoresist layer is formed on the passivation layer. Thereafter, a portion of the passivation layer is removed using the second patterned photoresist layer as a mask to form a patterned passivation layer. The patterned passivation layer exposes a portion of the semiconductor device layer and a portion of the current spreading layer. Next, an electrode material layer is formed entirely. Next, the second patterned photoresist layer is removed to strip the electrode material layer thereon to form a plurality of electrodes. The electrodes are electrically connected with the semiconductor device layer and the current spreading layer.

The present invention further provides a method for fabricating light emitting diode chips. First, a semiconductor layer and a conductive layer are sequentially formed on a substrate. Thereafter, a first patterned photoresist layer is formed on the conductive layer. The first patterned photoresist layer includes a first photoresist block and a second photoresist block. a thickness of the first photoresist block is thinner than a thickness of the second photoresist block. Then, a portion of the conductive layer and a portion of the semiconductor layer are removed using the first patterned photoresist layer as a mask to form a semiconductor device layer and a current spreading layer. Next, the thickness of the first patterned photoresist layer is reduced until the first photoresist block is removed completely. The remaining second photoresist block exposes a portion of the semiconductor device layer and a portion of the current spreading layer. Then, an electrode material layer is formed entirely. Thereafter, the remaining second photoresist block is removed to strip the electrode material layer thereon and form a plurality of electrodes. The electrodes are electrically connected with the semiconductor device layer and the current spreading layer.

According to an embodiment of the present invention, the first patterned photoresist layer is developed by a half-tone mask process, a gray-tone mask process or a multi-tone mask process.

The present invention further provides a method for fabricating a light emitting diode chip. First, a semiconductor layer, a conductive layer and a dielectric layer are sequentially formed on a substrate. Afterwards, a first patterned photoresist layer is formed on the dielectric layer. The first patterned photoresist layer includes a first photoresist block and a second photoresist block. A thickness of the first photoresist block is thinner than a thickness of the second photoresist block. Then, a portion of the dielectric layer, a portion of the conductive layer and a portion of the semiconductor layer are removed using the first patterned photoresist layer as a mask to form a patterned dielectric layer, a current spreading layer and a semiconductor device layer simultaneously. Next, a thickness of the first patterned photoresist layer is reduced until the first photoresist block is removed completely. The remaining second photoresist block exposes a portion of the semiconductor device layer and a portion of the patterned dielectric layer. Then, the patterned dielectric layer is partially removed using the remaining second photoresist block as a mask to partially expose the current spreading layer. Afterwards, an electrode material layer is formed entirely. Thereafter, the remaining second photoresist block is removed to strip the electrode material layer thereon to form a plurality of electrodes. The electrodes are electrically connected with the semiconductor device layer and the current spreading layer.

According to an embodiment of the present invention, the first patterned photoresist layer is formed by a half-tone mask process, a gray-tone mask process or a multi-tone mask process.

The present invention also provides a method for fabricating a light emitting diode chip. First, a semiconductor device layer, a patterned dielectric layer on the semiconductor device layer, and a current spreading layer on the semiconductor device layer to cover the patterned dielectric layer are sequentially formed on a substrate. Afterwards, a dielectric layer is formed on the semiconductor device layer and the current spreading layer. Next, a patterned photoresist layer is formed on the dielectric layer. Then, the dielectric layer is partially removed using the patterned photoresist layer as a mask to form a patterned dielectric layer. The patterned dielectric layer exposes a portion of the semiconductor device layer and a portion of the current spreading layer. Afterwards, an electrode material layer is formed entirely. The patterned photoresist layer is removed to strip the electrode material layer thereon to form a plurality of electrodes. The electrodes are electrically connected with the semiconductor device layer and the current spreading layer.

According to an embodiment of the present invention, the semiconductor device layer, the patterned dielectric layer and the current spreading layer are formed by the following steps. First, a semiconductor layer is formed on the substrate. Then, the semiconductor layer is patterned to form a semiconductor device layer. Next, a patterned dielectric layer is formed on the semiconductor device layer. Thereafter, a current spreading layer is formed on the semiconductor device layer to cover the patterned dielectric layer.

According to an embodiment of the present invention, the semiconductor device layer, the patterned dielectric layer and the current spreading layer are fabricated by different mask processes respectively.

According to an embodiment of the present invention, the semiconductor device layer, the patterned dielectric layer and the current spreading layer are formed by the following steps. First, a semiconductor layer is formed on the substrate. Next, a patterned dielectric layer is formed on the semiconductor layer. Thereafter, a conductive layer is formed on the semiconductor layer to cover the patterned dielectric layer. Then, the conductive layer and the semiconductor layer are patterned to form the current spreading layer and the semiconductor device layer simultaneously.

The present invention further provides a method for fabricating a light emitting diode chip. First, a semiconductor layer and a conductive layer are sequentially formed on a substrate. Then, the semiconductor layer and the conductive layer are patterned to form a semiconductor device layer and a current spreading layer simultaneously. Afterwards, a patterned dielectric layer and a plurality of electrodes are formed on the current spreading layer and the semiconductor device layer.

According to an embodiment of the present invention, the semiconductor layer is formed by the following steps. A first type semiconductor material layer, a light emitting material layer and a second type semiconductor material layer are sequentially formed on the substrate.

According to an embodiment of the present invention, the electrodes and the patterned dielectric layer are fabricated by different mask processes respectively.

The present invention further provides another method for fabricating a light emitting diode chip. First, a first patterned photoresist layer is formed on a substrate. The first patterned photoresist layer includes a first photoresist block and a second photoresist block. A thickness of the first photoresist block is thinner than a thickness of the second photoresist block. Thereafter, a surface of the substrate is partially removed using the first patterned photoresist layer as a mask to form a first patterned substrate. Next, a thickness of the first patterned photoresist layer is reduced until the first photoresist block is removed completely. The remaining second photoresist block partially exposes the first patterned substrate. Then, the first patterned substrate is partially removed using the remaining second photoresist block as a mask to form a second patterned substrate. Afterwards, a semiconductor device layer, a current spreading layer and a plurality of electrodes are sequentially formed on the second patterned substrate. The electrodes are electrically connected with the semiconductor device layer and the current spreading layer.

The present invention further provides yet another method for fabricating light emitting diode chips. First, a patterned photoresist layer is formed. The patterned photoresist layer includes a first photoresist block and a second photoresist block. A thickness of the first photoresist block is thinner than a thickness of the second photoresist block. The patterned photoresist layer is formed by a half-tone mask process, a gray-tone mask process or a multi-tone mask process.

According to an embodiment of the present invention, adopting a half-tone, gray-tone or multi-tone mask process can reduce the process steps of the light emitting diode chip. If combined with a lift-off process, the process of the light emitting diode chip is further simplified. Further, in the present invention, a plurality of components may be formed by the same process, which also saves some steps in the process. In other words, the fabricating method of the light emitting diode chip in the present invention reduces the fabrication cost and the fabrication time.

In order to make the aforementioned and other objects, features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A through 2I are schematic diagrams showing a flowchart of fabricating a light emitting diode chip according to the first embodiment of the present invention.

FIGS. 4A through 4G show a flowchart of fabricating a light emitting diode chip according to yet another mode of embodiment of the present invention.

DESCRIPTION OF EMBODIMENTS

The First Embodiment

Figure 1A:
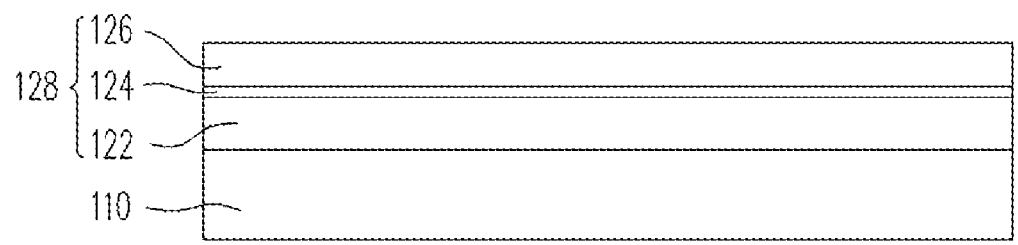
FIGS. 1A through 1F show a flowchart of fabricating a conventional light emitting diode chip.
Figure 1B:
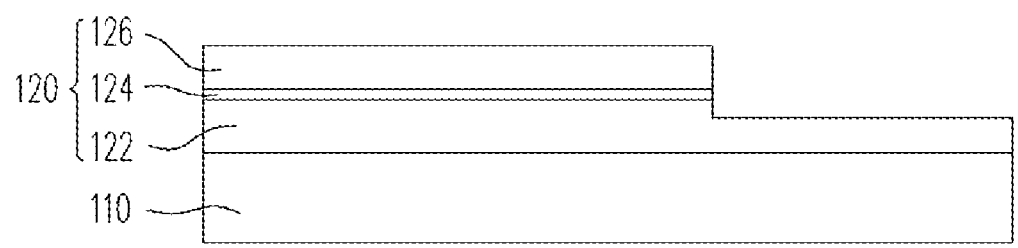
Figure 1C:
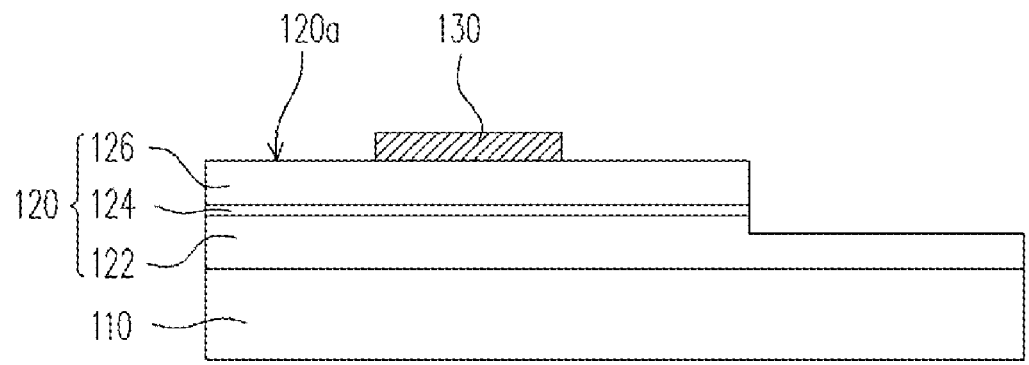
Figure 1D:
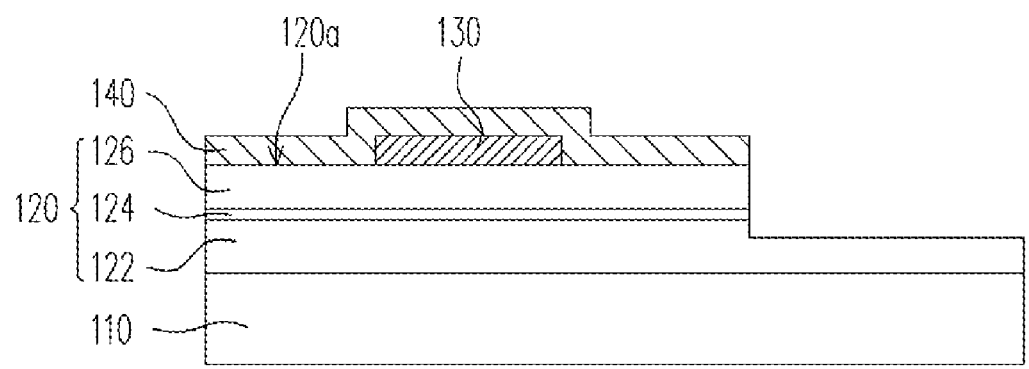
Figure 1E:
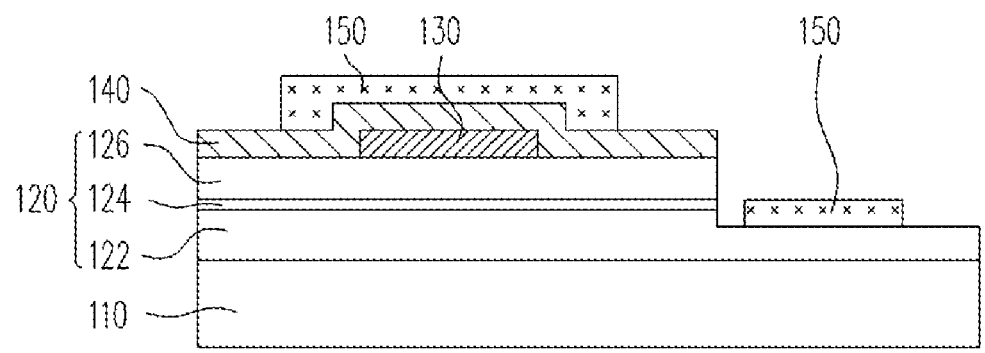
Figure 1F:
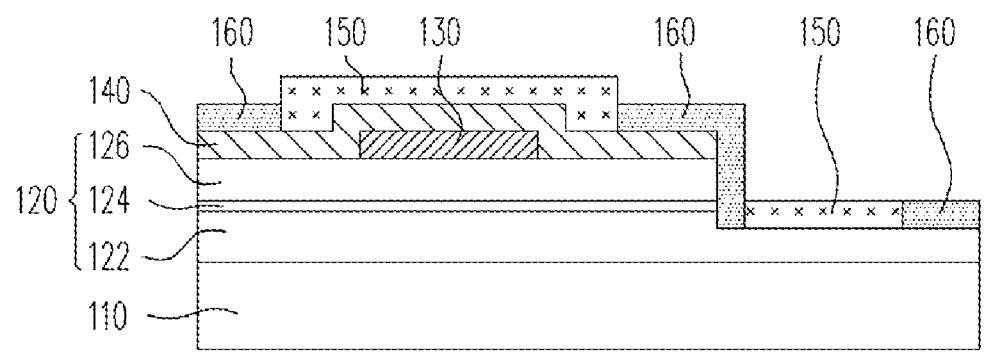
Figure 2A:
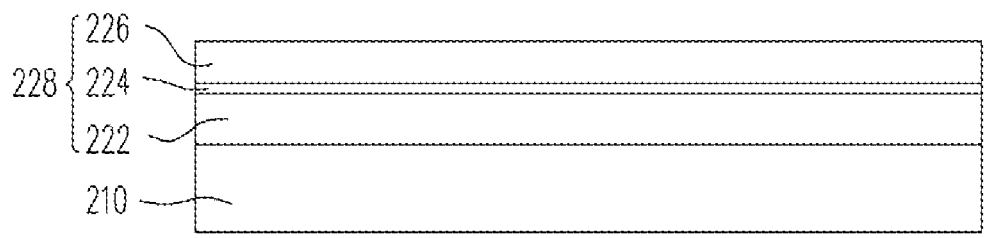

FIGS. 2A through 2I show a schematic flowchart of fabricating a light emitting diode chip according to the first embodiment of the present invention. First, a first type semiconductor material layer 222, a light emitting material layer 224 and a second type semiconductor material layer 226 are sequentially formed on a substrate 210 to further form a semiconductor layer 228, as shown by FIG. 2A. The semiconductor layer 228 is formed, for example, by a metal organic chemical vapor deposition (MOCVD) process, a molecular beam epitaxial (MBE) process, or other suitable epitaxial growth processes, to sequentially form the said material layers 222, 224 and 226 on the substrate 210. The present embodiment is exemplified by an MOCVD process as an example of embodiment but not limited thereto. According to the present embodiment, a material of the substrate 210 is aluminum oxide with good transmittance, for example. Furthermore, to give some examples, a material selected for the first type semiconductor material layer 222 may be an N-type semiconductor material; a material selected for the light emitting material layer 224 may be a multiple quantum well (MQW) light emitting material, and a material selected for the second type semiconductor material layer 226 may be a P-type semiconductor material. However, the materials for the first type semiconductor material layer 222 and the second type semiconductor material layer 226 may also be a P-type semiconductor material and an N-type semiconductor material respectively.

Figure 2B:
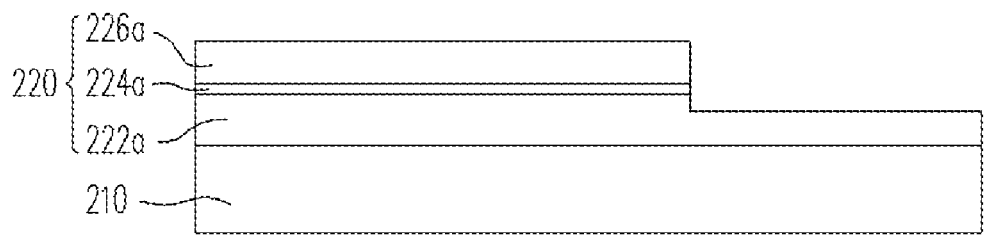

Afterwards, the semiconductor layer 228 is patterned to form a semiconductor device layer 220, as shown by FIG. 2B. According to the present embodiment, the semiconductor device layer 220 is formed, for example, by a conventional photolithography and etching process (PEP). For example, after the semiconductor layer 228 is formed on the substrate 210, the second type semiconductor material layer 222, the light emitting material layer 224 and the first type semiconductor material layer 226 are patterned to form a first type semiconductor layer 222a, a light emitting layer 224a and a second type semiconductor layer 226a. The light emitting layer 224a is disposed on a portion of the first type semiconductor layer 222a, and the second type semiconductor layer 226a is disposed on the light emitting layer 224a, as shown by FIG. 2B. According to the present embodiment, the first type semiconductor layer 222a, the light emitting layer 224a and the second type semiconductor layer 226a constitute the semiconductor device layer 220.

Figure 2C:
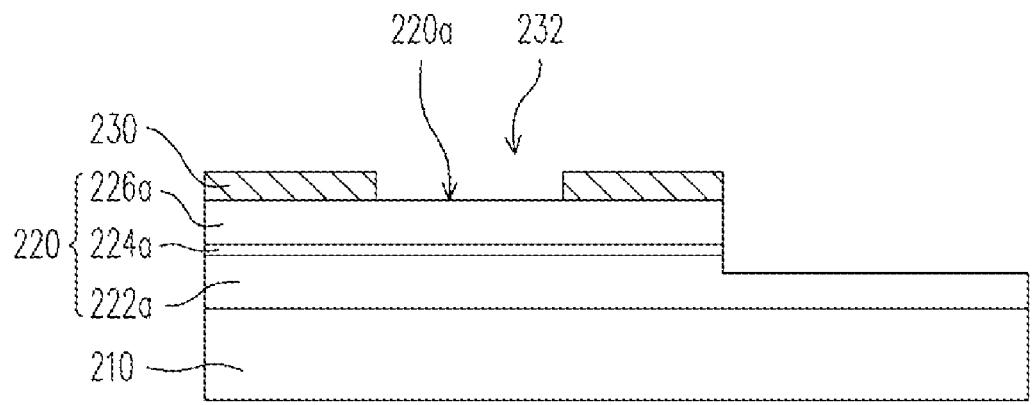

Afterwards, a current spreading layer 230 is formed on the semiconductor device layer 220, as shown by FIG. 2C. According to the present embodiment, the current spreading layer 230 is formed, for example, by a conventional PEP. To give an example, after the semiconductor device layer 220 is formed on the substrate 210, a conductive layer (not shown) is formed entirely on the semiconductor device layer 220. Then, the conductive layer is patterned to form the current spreading layer 230. The current spreading layer 230 has an opening 232 to expose an upper surface 220a of the semiconductor device layer 220, as shown by FIG. 2C. According to the present embodiment, the opening 232 may be a circular opening, an annular opening or an opening in other shapes. Moreover, a material of the current spreading layer 230 is, for example, indium tin oxide (ITO), indium zinc oxide (IZO), indium tin zinc oxide (ITZO), hafnium oxide, zinc oxide, aluminum oxide, aluminum tin oxide, aluminum zinc oxide, cadmium tin oxide, cadmium zinc oxide or other suitable materials. The present embodiment is exemplified by ITO as an example for embodiment but not limited thereto.

Figure 2D:
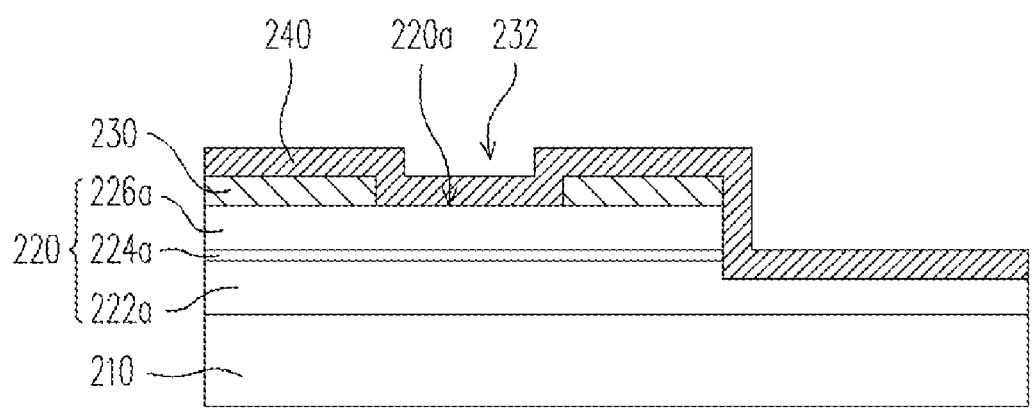

Thereafter, a dielectric layer 240 is formed on the substrate 210 to cover the semiconductor device layer 220 and the current spreading layer 230. The dielectric layer 240 contacts with the upper surface 220a of the semiconductor device layer 220 through the opening 232, as shown by FIG. 2D. According to the present embodiment, the dielectric layer 240 is formed, for example, by a chemical vapor deposition (CVD) process, but the present embodiment is not limited to this. Other suitable processes may also be used, such as a screen printing process, a coating process or an inkjet printing process. The dielectric layer 240 may be a single-layered or a multi-layered structure, and a material of the dielectric layer 240 can be classified as an organic or an inorganic material. An organic material is, for example, silicon oxide, silicon nitride, silicon oxynitride, silicon carbide, hafnium oxide, aluminum oxide or other suitable materials. An inorganic material is, for example, photoresist, benzocyclobutene, cycloalkene, polyimide, polyamide, polyester, polyester polyol, polyethylene oxide, polyphenylene, resin, polyether, polyketide or other suitable materials. The present embodiment is exemplified by silicon dioxide or silicon nitride but not limited thereto.

Figure 2E:
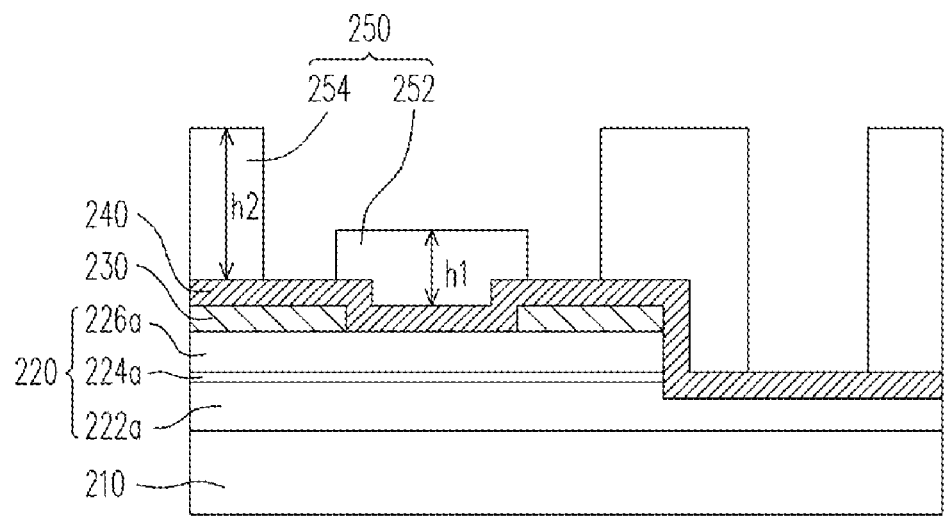

Then, a patterned photoresist layer 250 is formed on the dielectric layer 240, as shown by FIG. 2E. The patterned photoresist layer 250 is formed, for example, by a half-tone mask process, a gray-tone mask process or a multi-tone mask process. The present embodiment is exemplified by a half-tone mask process as an example for embodiment but not limited thereto. For example, a photoresist material layer (not shown) is formed entirely on the dielectric layer 240 first. Afterwards, the photoresist material layer is patterned by a half-tone mask process to form the patterned photoresist layer 250. The patterned photoresist layer 250 includes a first photoresist block 252 and a second photoresist block 254. A thickness h1 of the first photoresist block 252 is thinner than a thickness h2 of the second photoresist block 254, as shown by FIG. 2E.

Figure 2F:
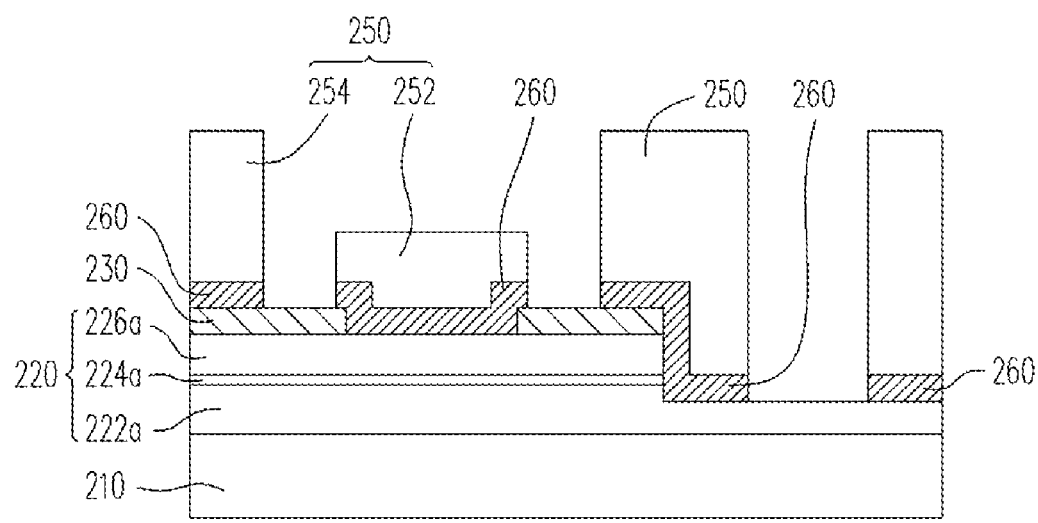

Then, the dielectric layer 240 is partially removed using the patterned photoresist layer 250 as a mask to form a patterned dielectric layer 260, as shown by FIG. 2F. The patterned dielectric layer 260 is formed by using a dry etching process or a wet etching process to partially remove the dielectric layer 240 such that a portion of the semiconductor device layer 220 and a portion of the current spreading layer 230 are exposed, as shown by FIG. 2F. The said method of partially removing the dielectric layer 240 is only described as an example, and other suitable etching processes may also be adopted.

Figure 2G:
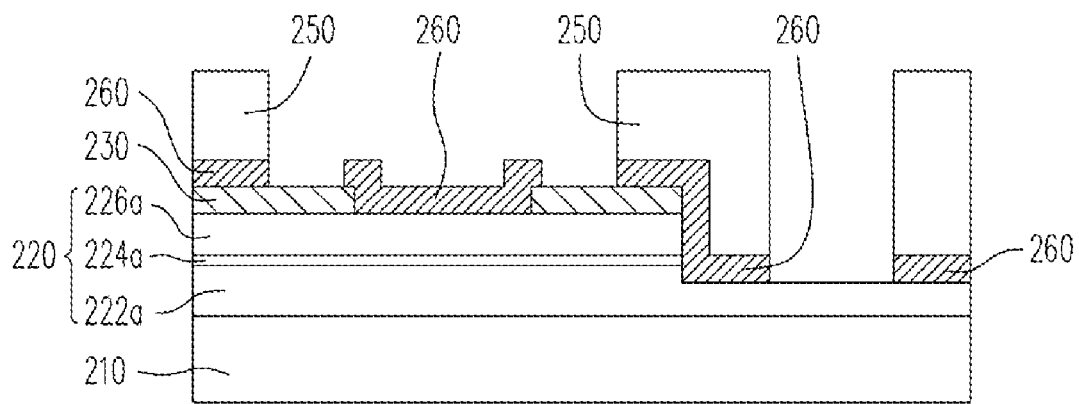

Thereafter, a thickness of the patterned photoresist layer 250 is reduced, for example, by a plasma ashing process until the first photoresist block 252 is removed completely to form a structure as shown by FIG. 2G.

Figure 2H:
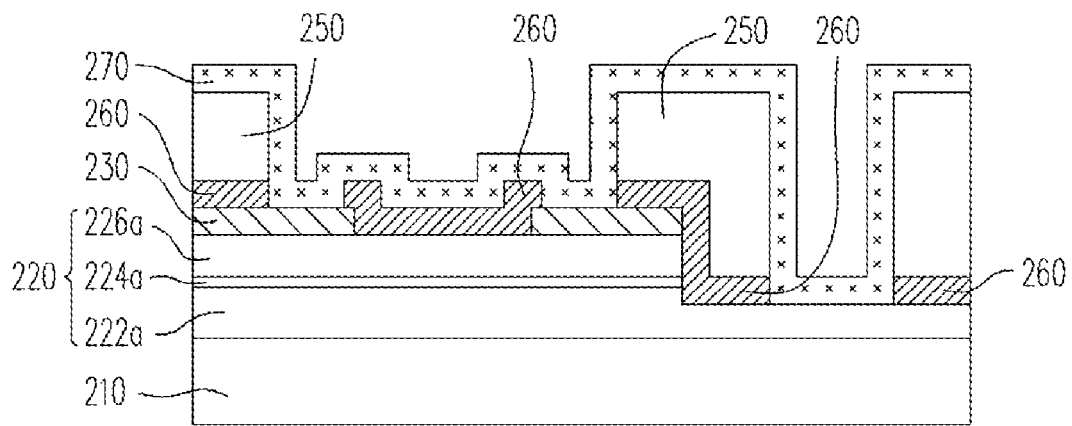
Figure 21:
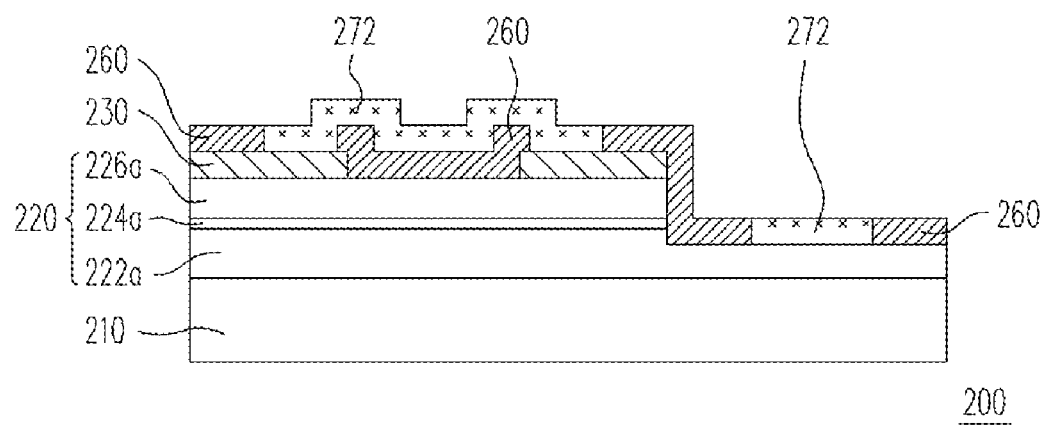
FIGS. 21A and 21B are schematic diagrams of light emitting diode chips according to different modes of embodiment for the eighth embodiment of the present invention.

After the foregoing step is completed, then an electrode material layer 270 is formed entirely on the substrate 210, as shown by FIG. 2H. The electrode material layer 270 is formed, for example, by CVD, as mentioned above, sputtering, evaporation or other suitable processes.

Next, the patterned photoresist layer 250 is removed to strip the electrode material layer 270 thereon and form a plurality of electrodes 272. The electrodes 272 are electrically connected with the semiconductor device layer 220 and the current spreading layer 230, as shown by FIG. 2I. To give an example, the patterned photoresist layer 250 is removed to form the plurality of electrodes 272 by a lift-off process so as to complete a structure as shown by FIG. 2I. Specifically, when the patterned photoresist layer 250 is removed, the electrode material layer 270 covering the patterned photoresist layer 250 is also removed simultaneously. As a result, the electrode material layer 270 forms the plurality of electrodes 272 as shown by FIG. 2I. Up to this step, a fabrication flowchart of a light emitting diode chip 200 is generally completed.

In the light emitting diode chip 200, the patterned dielectric layer 260 covered by the electrodes 272 is defined as a current blocking layer, and the patterned dielectric layer 260 not covered by the electrodes 272 is defined as a passivation layer. In detail, when the light emitting diode chip 200 is emitting the light, the current blocking layer is suitable for exciting a more even light from the light emitting layer so that the light emitting diode chip 200 has better light emitting. Moreover, the passivation layer is suitable for preventing the semiconductor device layer from being damaged or oxidized by influences of the exterior environment and then affecting electrical characteristics of the light emitting diode chip 200 when emitting the light.

According to the present embodiment, the process steps of the light emitting diode chip 200 adopt a half-tone mask process and a lift-off process to form the passivation layer, the current blocking layer and the electrodes. Only one mask pattern is required to complete the fabrication. In other words, the said fabricating method of the light emitting diode chip 200 effectively reduces the fabrication cost and the fabrication time.

According to a mode of embodiment, the foregoing process steps may be adjusted to form light emitting diode chips in other modes of embodiment. A detailed description thereof is provided below.

FIGS. 3A through 3E show a flowchart of fabricating a light emitting diode chip according to another mode of embodiment of the present invention. First, a light emitting diode chip 200a is formed by applying the process steps as shown by FIGS. 2A through 2D first; a relevant description thereof is not repeated herein.

Figure 3A:
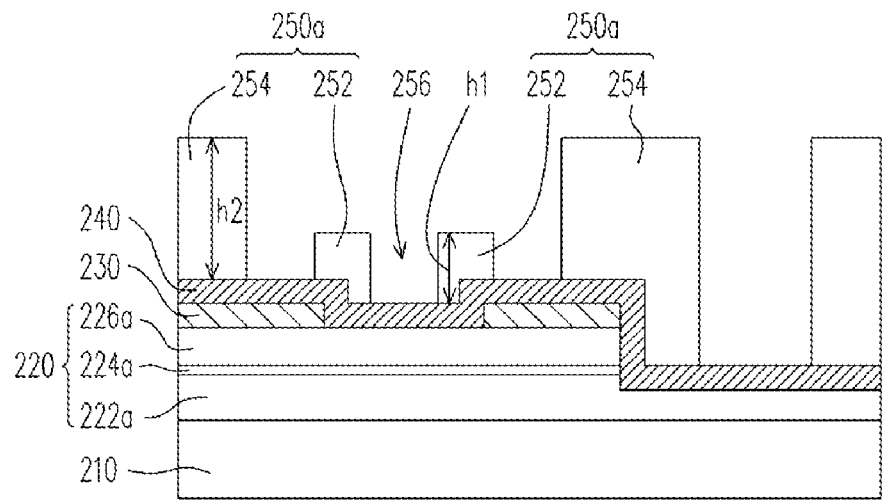
FIGS. 3A through 3E show a flowchart of fabricating a light emitting diode chip according to another mode of embodiment of the present invention.

After completing the foregoing step, a patterned photoresist layer 250a is formed on the dielectric layer 240, as shown by FIG. 3A. The patterned photoresist layer 250a is formed, for example, by a half-tone mask process, a gray-tone mask process or a multi-tone mask process. The present embodiment is exemplified by a half-tone mask process as an example for embodiment but not limited thereto. For example, a photoresist material layer (not shown) is formed entirely on the dielectric layer 240 first. Afterwards, the photoresist material layer is patterned by a half-tone mask process to form the patterned photoresist layer 250a. The patterned photoresist layer 250a includes a first photoresist block 252 and a second photoresist block 254. A thickness h1 of the first photoresist block 252 is thinner than a thickness h2 of the second photoresist block 254, as shown by FIG. 3A. It should be noted that the patterned photoresist layer 250a and the patterned photoresist layer 250 have similar structures. The difference between the two lies in that an opening 256 between the first photoresist blocks 252 partially exposes the dielectric layer 240, as shown by FIG. 3A. According to the present embodiment, only a mask is required to be adjusted in order to form the patterned photoresist layer 250a, and no additional exposing and developing process are needed.

Figure 3B:
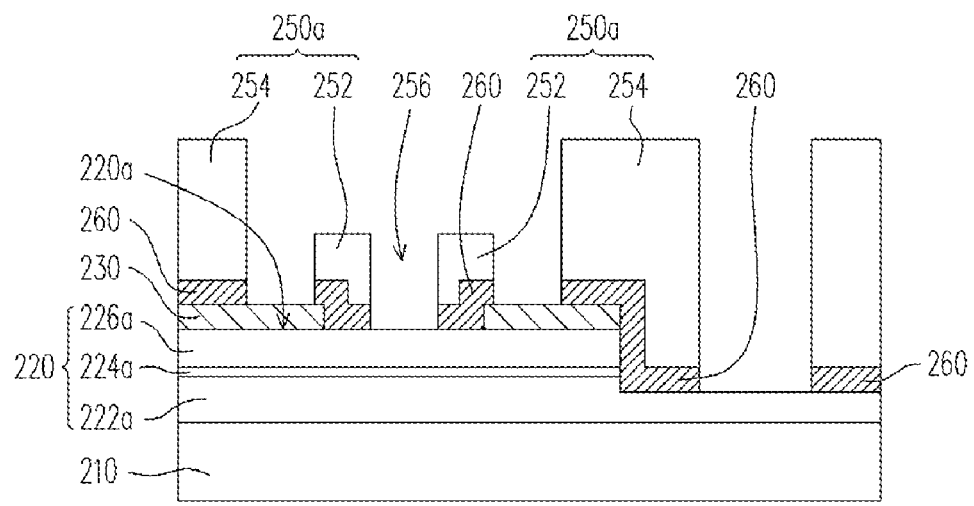
Figure 3C:
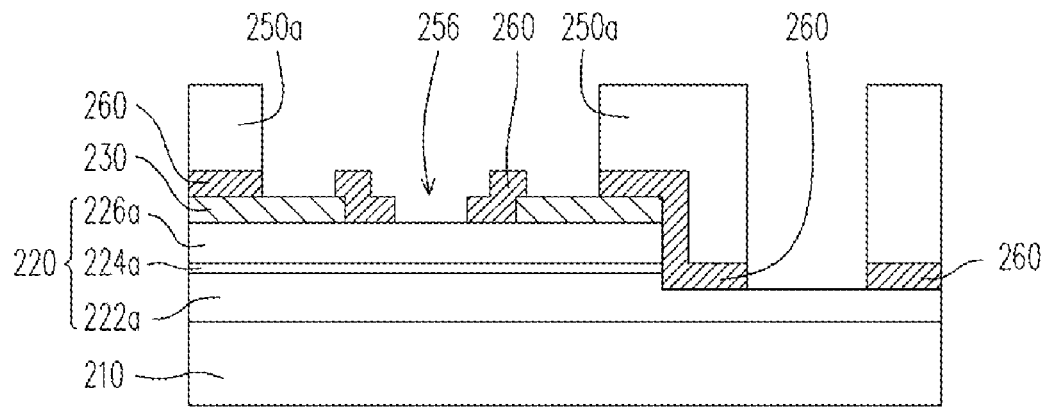
Figure 3D:
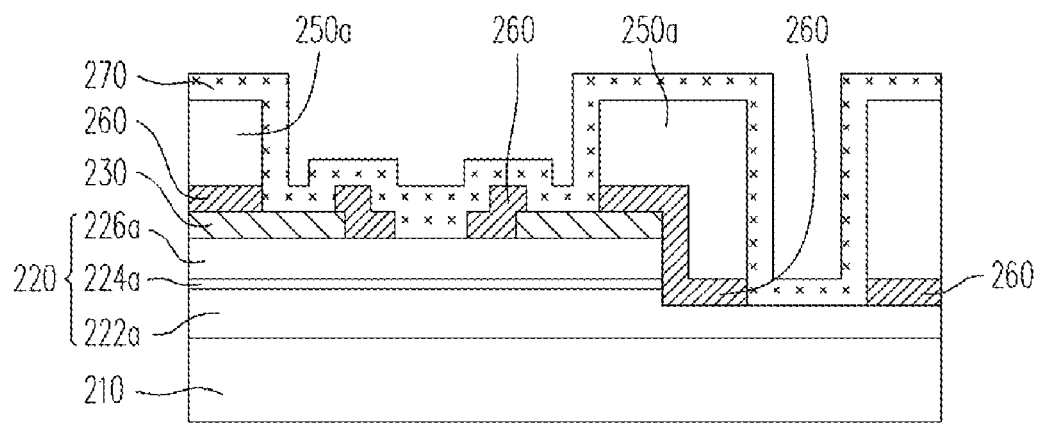
Figure 3E:
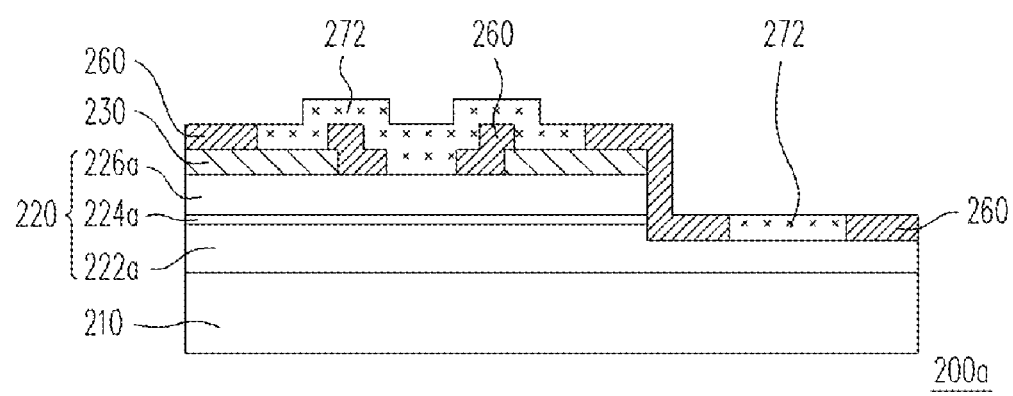

Thereafter, referring to FIGS. 3B through 3E in sequence, since the process steps shown by FIGS. 3B through 3E are similar to those shown by FIGS. 2F through 2I, a relevant description of the process is not repeated herein. According to the present embodiment, the structure of the patterned photoresist layer 250a is different from that of the patterned photoresist layer 250. Hence, the structure of the light emitting diode chip 200a formed by completing the process steps shown by FIGS. 3B through 3E is also different from that of the light emitting diode chip 200, as shown by FIGS. 2I and 3E.

In detail, since the opening 256 exists between the first photoresist blocks 252, the patterned dielectric layer 260 is suitable for exposing an upper surface 220a of a second type semiconductor layer 226a in the semiconductor device layer 220, as shown by FIG. 3B. Consequently, when the plurality of electrodes 272 is formed on the substrate 210, some electrodes 272 are suitable for being electrically connected with the second type semiconductor layer 226a of the semiconductor device layer 220 directly through the patterned dielectric layer 260 (such as the above-defined current blocking layer), as shown by FIG. 3E.

According to the present embodiment, the process steps of the light emitting diode chip 200a are the same as those of the light emitting diode chip 200, and the only slight difference exists in the mask patterns used for forming the patterned photoresist layers. Therefore, the process steps of the light emitting diode chip 200a can also reduce the process steps, cost and time of the light emitting diode chip.

Moreover, FIGS. 4A through 4G show a flowchart of fabricating a light emitting diode chip according to yet another mode of embodiment of the present invention. First, a light emitting diode chip 200b may be formed by performing the process steps as shown by FIGS. 2A and 2B. A relevant description of the fabrication is the same as that mentioned above.

Afterwards, a current spreading layer 230a is formed on the semiconductor device layer 220, as shown by FIG. 4A. According to the present embodiment, the current spreading layer 230a is formed, for example, by a conventional PEP. A relevant description is the same as that mentioned in the foregoing embodiment and thus not repeated herein. According to the present embodiment, the current spreading layer 230a has a plurality of openings 232a to expose an upper surface 220a of the semiconductor device layer 220, as shown by FIG. 4A. Referring to FIGS. 4A and 2C to compare structures of the current spreading layers 230a and 230, in other words, only the mask pattern of the current spreading layer 230 is required to be adjusted to complete the fabrication of the current spreading layer 230a, and no additional exposing and developing processes are needed.

Thereafter, a dielectric layer 240 is formed on the substrate 210 to cover the semiconductor device layer 220 and the current spreading layer 230a. The dielectric layer 240 contacts with the upper surface 220a of the semiconductor device layer 220 through the opening 232a, as shown by FIG. 4B. According to the present embodiment, the dielectric layer 240 is formed in the same way as described in the foregoing embodiment and a description is thus not repeated.

Figure 4C:
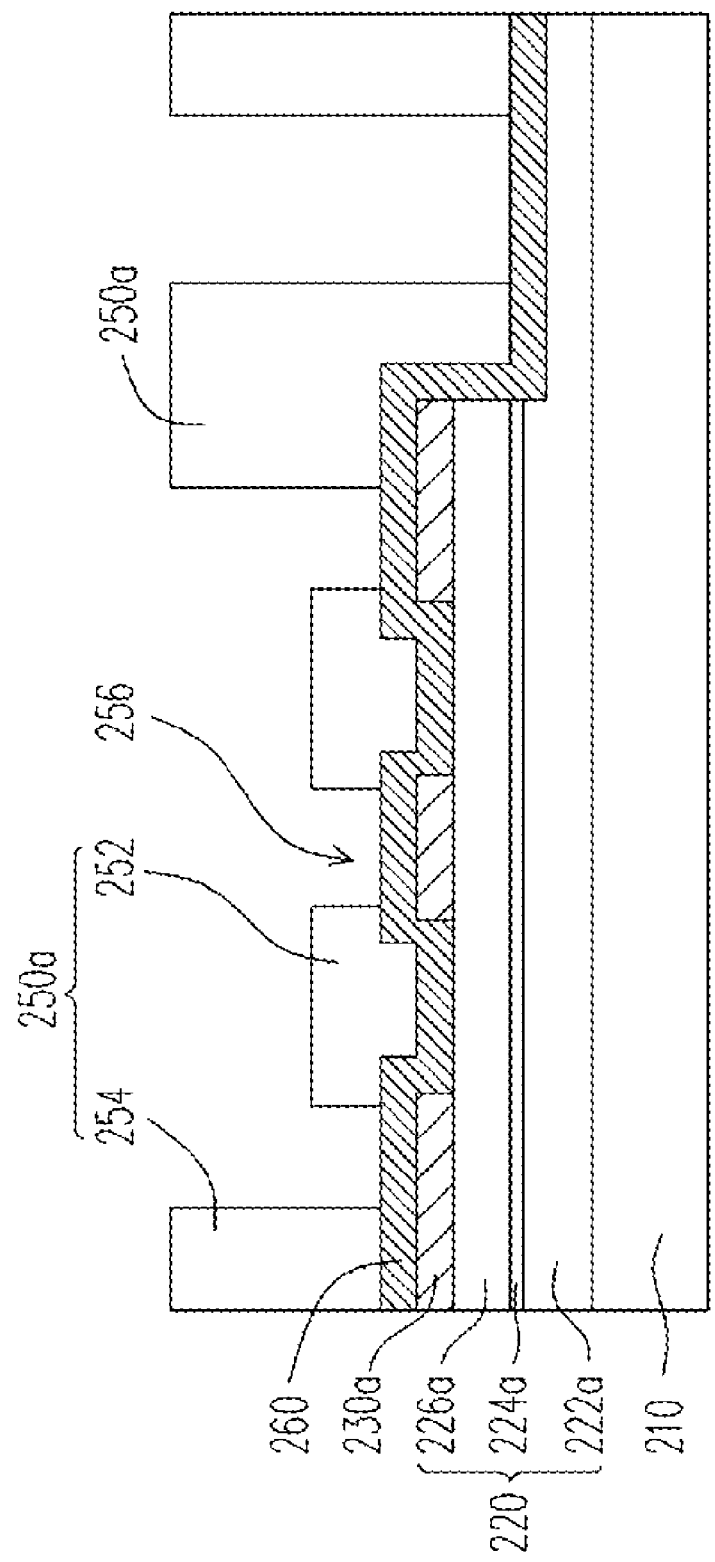
Figure 4D:
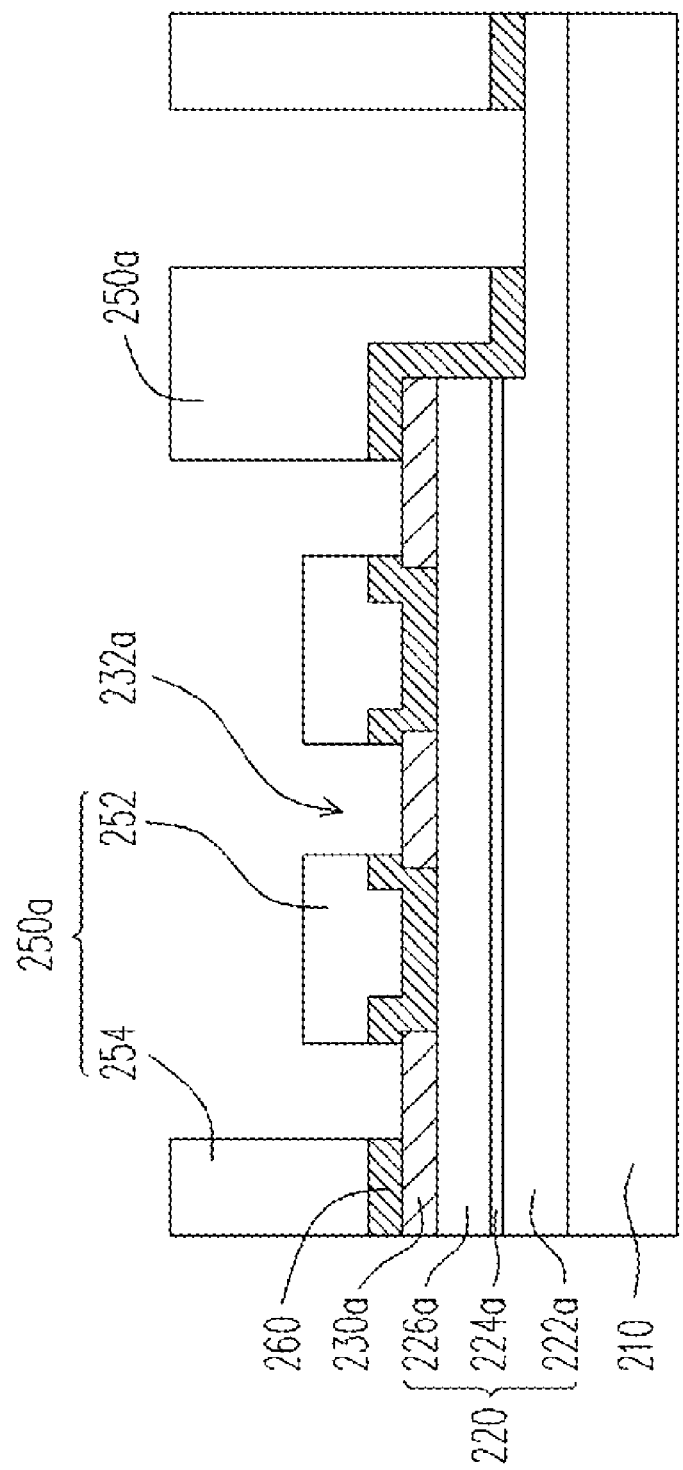
Figure 4E:
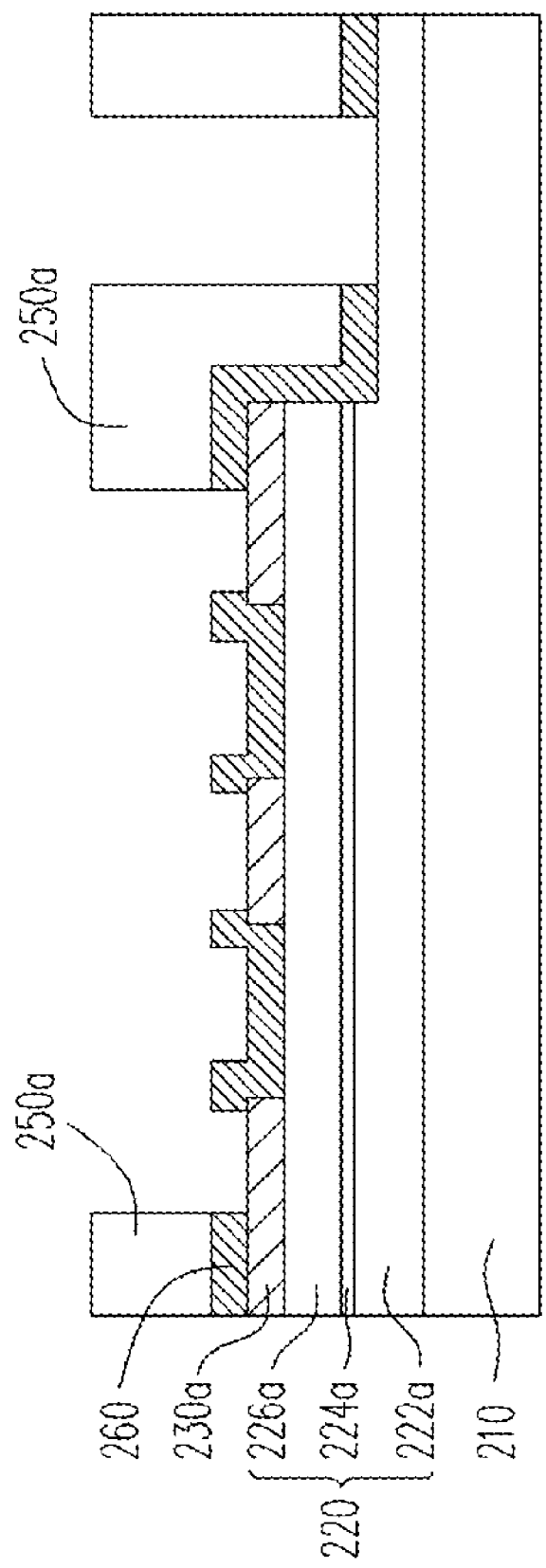
Figure 4F:
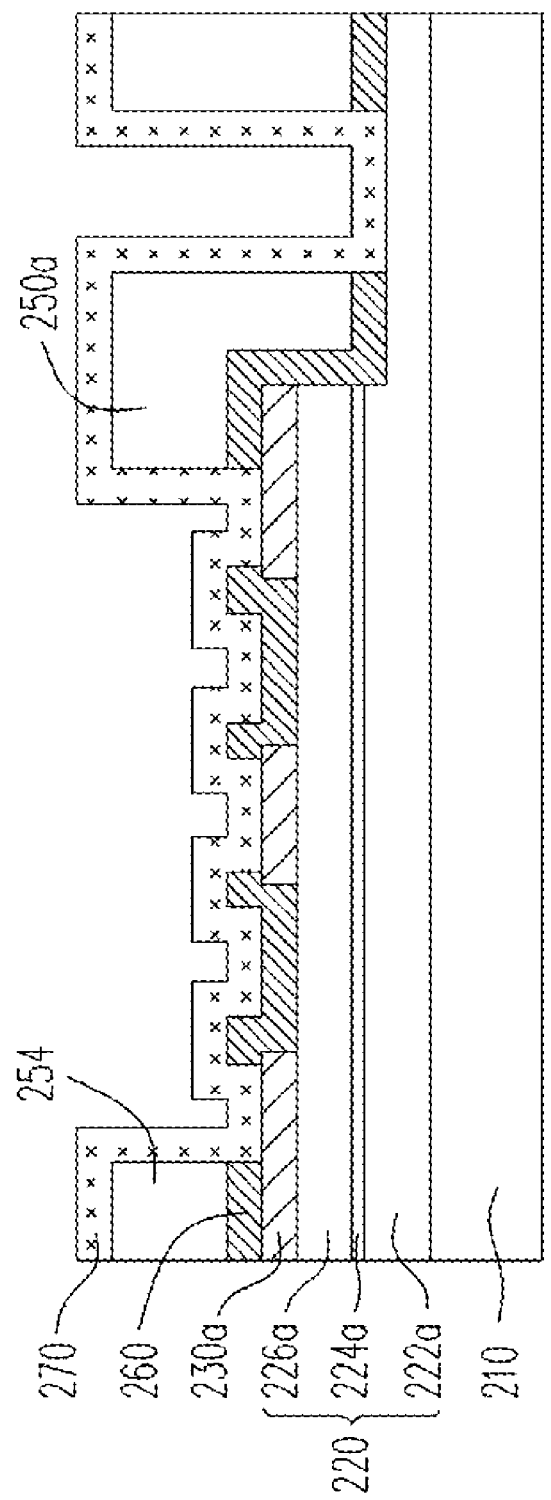
Figure 4G:
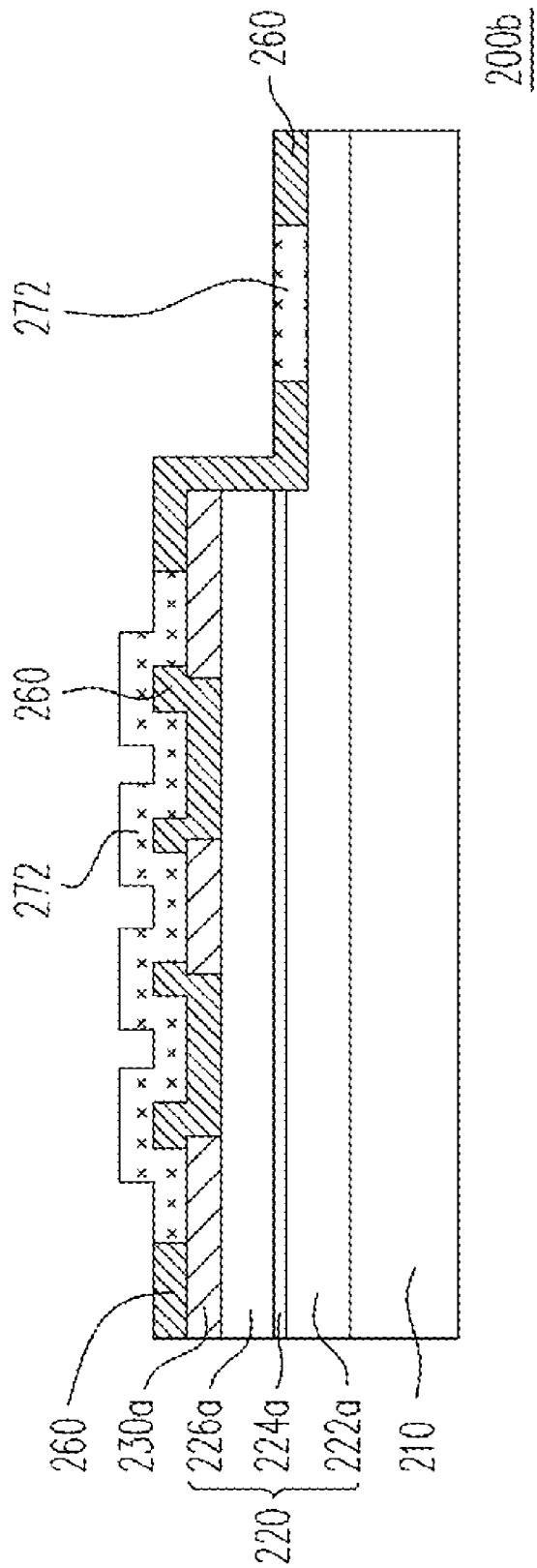

Afterwards, referring to FIGS. 4C through 4G in sequence, the process steps shown by FIGS. 4C through 4G are similar to those shown by FIGS. 3A through 3E, and a description of the relevant process is thus not repeated. According to the present embodiment, the structure of the current spreading layer 230a is different from that of the current spreading layer 230. Hence, the structure of the light emitting diode chip 200b formed by completing the process steps shown by FIGS. 4A through 4G is also different from the structures of the light emitting diode chips 200 and 200a, as shown by FIGS. 2I, 3E, and 4G.

Specifically, the current spreading layer 230a has the plurality of openings 232a and the patterned dielectric layer 260 is suitable for partially exposing the current spreading layer 230a, as shown by FIG. 4D. Thus, when the plurality of electrodes 272 is formed on the substrate 210, some electrodes 272 are suitable for being electrically connected with the current spreading layer 230a directly, as shown by FIG. 4G.

According to the present embodiment, the process steps of the light emitting diode chip 200b are the same as those of the light emitting diode chip 200 or 200a, and just only slight difference exists in the mask patterns used for forming the current spreading layers. In other words, the fabricating method of the light emitting diode chip 200b also reduces the process steps, cost and time of the light emitting diode chip.

Moreover, FIGS. 5A through 5G show a flowchart of fabricating a light emitting diode chip according to still another mode of embodiment of the present invention. First, a light emitting diode chip 200c may be formed by performing the process steps as shown by FIGS. 2A and 2B. The relevant process is the same as that mentioned above.

Figure 5A:
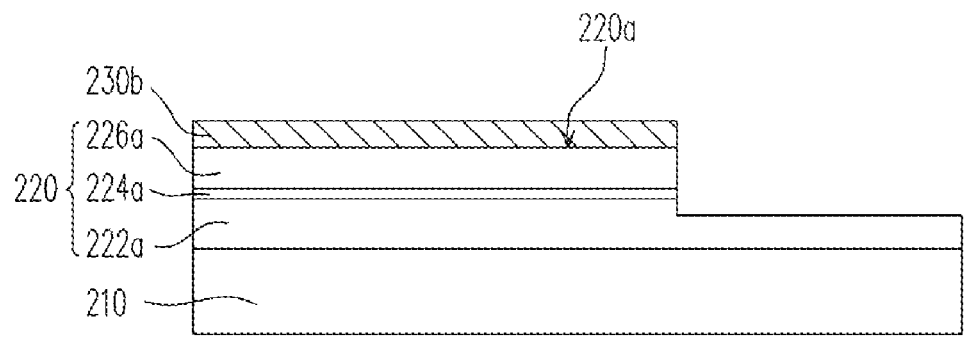
FIGS. 5A through 5G show a flowchart of fabricating a light emitting diode chip according to still another mode of embodiment of the present invention.

Afterwards, a current spreading layer 230b is formed on the semiconductor device layer 220, as shown by FIG. 5A. According to the present embodiment, the current spreading layer 230b is formed, for example, by a conventional PEP. The relevant process is the same as that mentioned above and is not repeated herein. According to the present embodiment, the current spreading layer 230b covers an upper surface 220a of the semiconductor device layer 220, as shown by FIG. 5A. In other words, only the mask pattern is required to be adjusted to form the current spreading layer 230b, and no additional exposing and developing processes are needed.

Figure 5B:
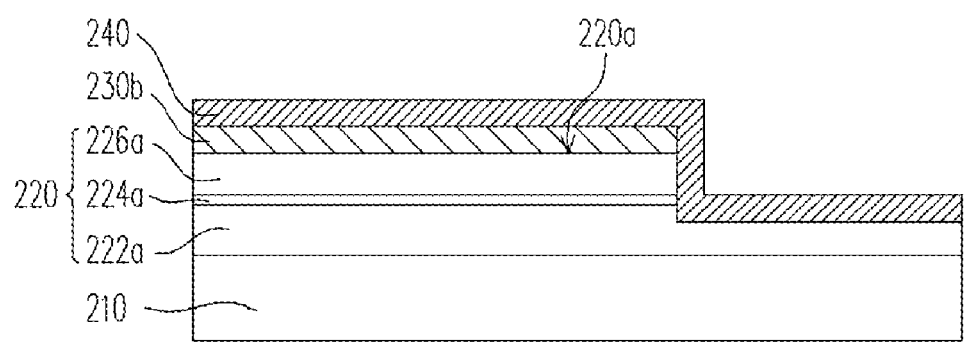
Figure 5C:
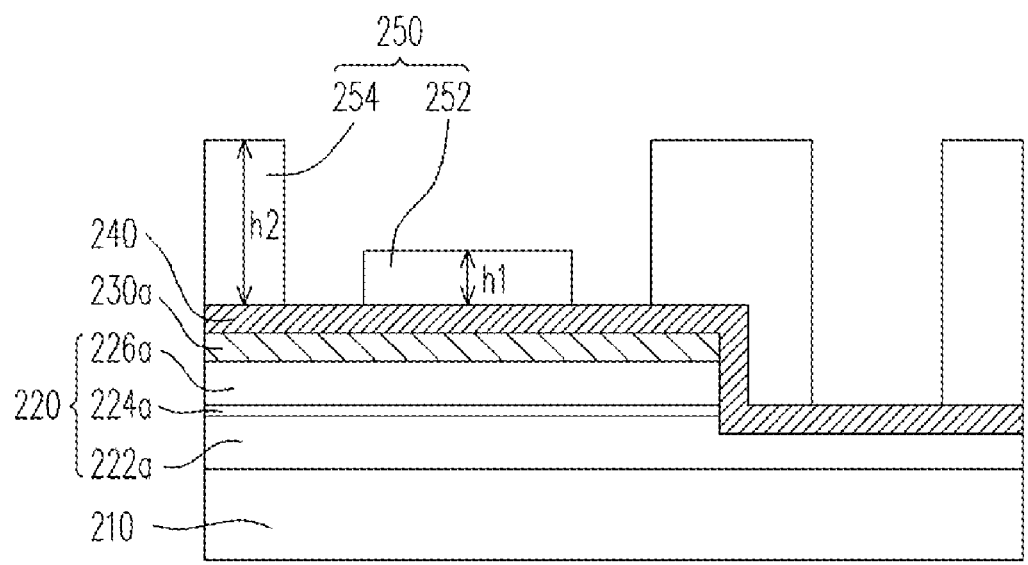
Figure 5D:
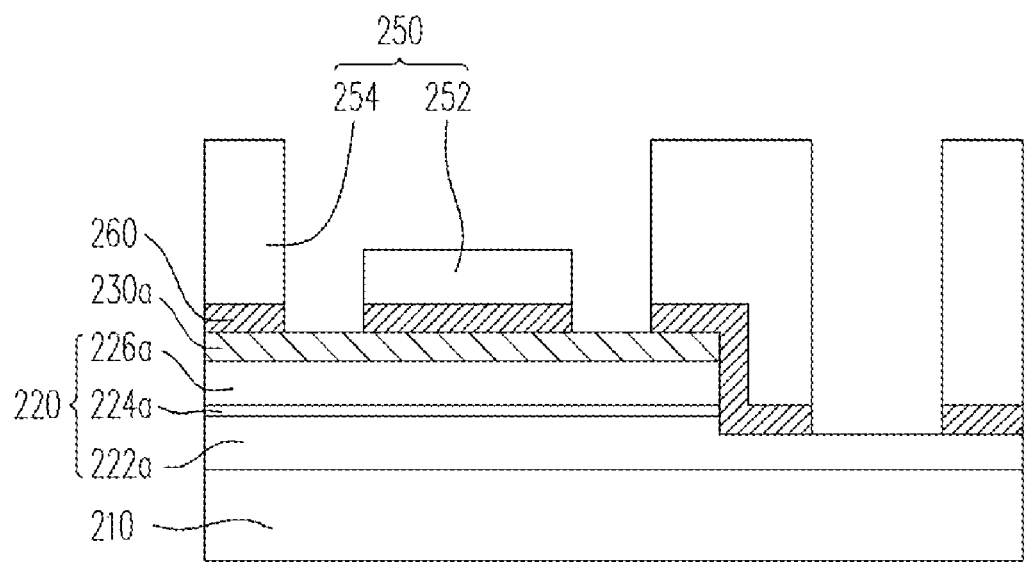

Next, a dielectric layer 240 is formed on the substrate 210 to cover the semiconductor device layer 220 and the current spreading layer 230b, as shown by FIG. 5B. According to the present embodiment, the dielectric layer 240 is formed in the same way as described in the foregoing embodiment and thus a description thereof is not repeated.

Afterwards, referring to FIGS. 5C through 5G in sequence, since the process steps shown by FIGS. 5C through 5G are similar to those shown by FIGS. 2E through 2I, a description of the relevant process is thus not repeated. According to the present embodiment, the appearance of the current spreading layer 230b is different from those of the current spreading layers 230 and 230a. Therefore, the structure of the light emitting diode chip 200c formed by completing the process steps shown by FIGS. 5B through 5G is also different from the structures of the light emitting diode chips 200, 200a and 200b, as shown by FIGS. 2I, 3E, 4G and 5G.

Figure 5E:
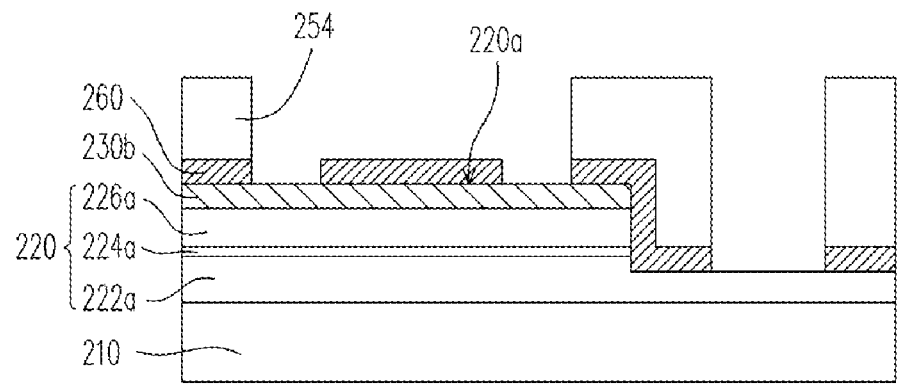
Figure 5F:
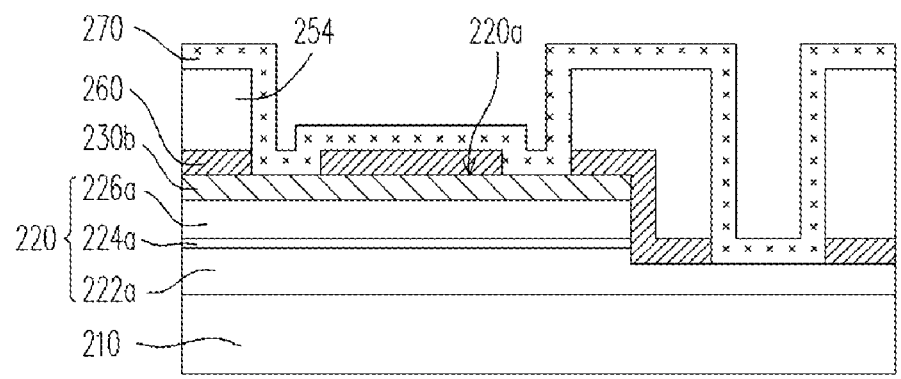
Figure 5G:
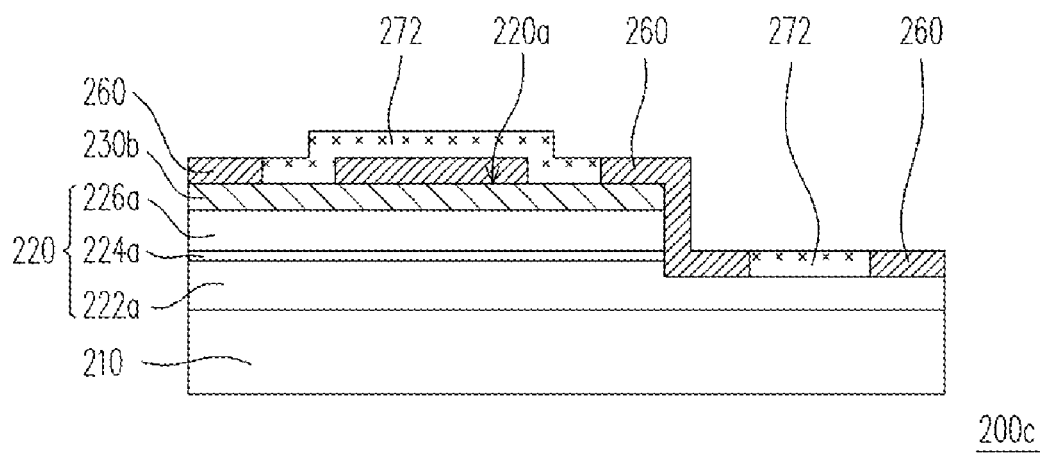

In the light emitting diode chip 200c, the current spreading layer 230b covers the upper surface 220a of the second type semiconductor layer 226a in the semiconductor device layer 220, and the patterned dielectric layer 260 is suitable for partially exposing the current spreading layer 230a, as shown by FIG. 5E. Thus, when the plurality of electrodes 272 is formed on the substrate 210, a part of the electrodes 272 are suitable for being electrically connected with the current spreading layer 230b directly, as shown by FIG. 5G.

Likewise, the patterned dielectric layer 260 covered by the electrodes 272 is defined as the current blocking layer, and the patterned dielectric layer 260 not covered by the electrodes 272 is defined as the passivation layer. According to the present embodiment, since only the mask pattern used for forming the current spreading layer is slightly adjusted, the original process steps would not be changed. In other words, the fabricating method of the light emitting diode chip 200c has the same advantages as the light emitting diode chips 200, 200a and 200b.

In summary, in the fabricating steps of the light emitting diode chips 200, 200a, 200b and 200c, a half-tone mask process, a gray-tone mask process or a multi-tone mask process is applied and combined with a lift-off process to reduce the process steps for forming the current blocking layer, the passivation layer or the electrodes to further reduce the fabrication time and the fabrication cost of the light emitting diode chip.

The Second Embodiment

Figure 6A:
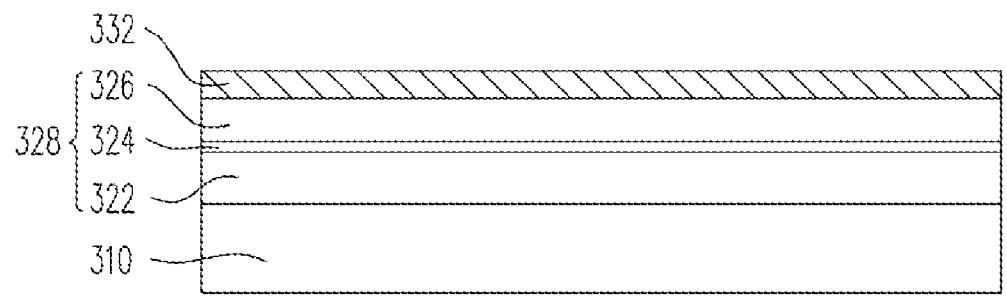
FIGS. 6A through 6H show a schematic flowchart of fabricating a light emitting diode chip according to the second embodiment of the present invention.

FIGS. 6A through 6H show a schematic flowchart of fabricating a light emitting diode chip according to the second embodiment of the present invention. First, a first type semiconductor material layer 322, a light emitting material layer 324, a second type semiconductor material layer 326 and a conductive layer 332 are sequentially formed on a substrate 310 to further form a semiconductor layer 328 and the conductive layer 332 on the semiconductor layer 328 respectively, as shown by FIG. 6A. The semiconductor layer 328 and the conductive layer 332 formed on the semiconductor layer 328 are used the following methods, for example, MOCVD, MBE, evaporation, sputtering or other suitable epitaxial growth processes to sequentially form the material layers 322, 324, 326 and the conductive layer 332 on the substrate 310. In the present embodiment, an MOCVD process is used as an example for the mode of embodiment, but the present embodiment is not limited thereto. According to the present embodiment, the substrates 310 and 210 have the same material, and the material layers 322, 324 and 326 are the same as the material layers 222, 224 and 226 in the foregoing embodiment. A relevant description of the material layers is thus not repeated.

Figure 6B:
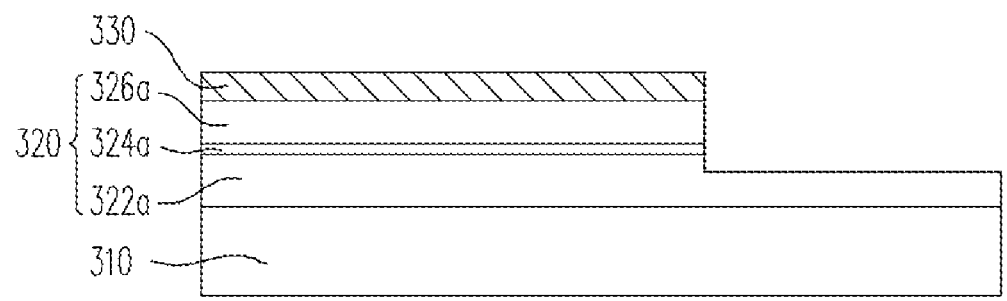

Afterwards, the semiconductor layer 328 and the conductive layer 332 are patterned to form a semiconductor device layer 320 and a current spreading layer 330 simultaneously, as shown by FIG. 6B. According to the present embodiment, the semiconductor device layer 320 and the current spreading layer 330 are formed, for example, by a conventional PEP. To give an example, after forming the semiconductor layer 328 and the conductive layer 332 on the substrate 310, the second type semiconductor material layer 322, the light emitting material layer 324, the first type semiconductor material layer 326 and the conductive layer 332 are patterned to form a first type semiconductor device layer 322a, a light emitting layer device 324a, a second type semiconductor device layer 326a and the current spreading layer 330 simultaneously. The light emitting layer 324a is disposed on the partial area of the first type semiconductor layer 322a; the second type semiconductor layer 326a is disposed on the light emitting layer 324a, and the current spreading layer 330 is disposed on the second type semiconductor layer 326a, as shown by FIG. 6B. According to the present embodiment, the first type semiconductor layer 322a, the light emitting layer 324a and the second type semiconductor layer 326a constitute the semiconductor device layer 320.

Figure 6C:
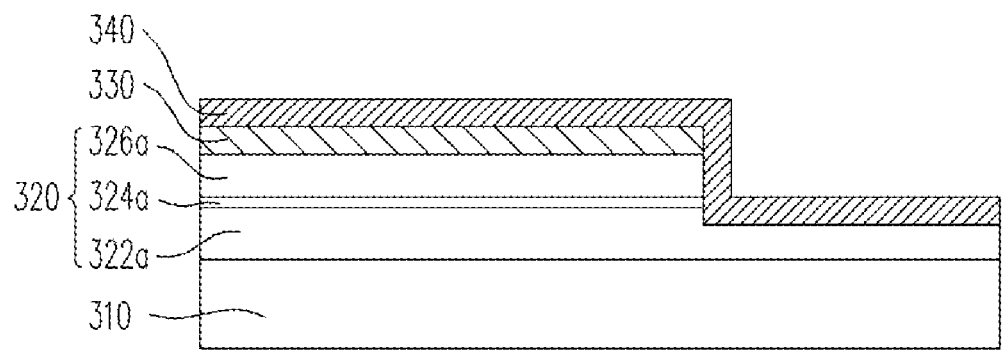

Next, a dielectric layer 340 is formed on the substrate 310 to cover the semiconductor device layer 320 and the current spreading layer 330, as shown by FIG. 6C. According to the present embodiment, the dielectric layer 340 is formed, for example, by a CVD process, but the present embodiment is not limited thereto. Other suitable processes may also be used, such as a screen printing process, a coating process, an inkjet printing process or an energy source treatment process. The dielectric layer 340 may be a single-layered or a multilayered structure, and a material of the dielectric layer 340 can be classified as an organic or an inorganic material. An organic material is, for example, silicon oxide, silicon nitride, silicon oxynitride, silicon carbide, hafnium oxide, aluminum oxide or other suitable materials. An inorganic material is, for example, photoresist, benzocyclobutene, cycloalkene, polyimide, polyamide, polyester, polyester polyol, polyethylene oxide, polyphenylene, resin, polyether, polyketide or other suitable materials. The present embodiment is exemplified by silicon dioxide or silicon nitride but not limited to these examples.

Figure 6D:
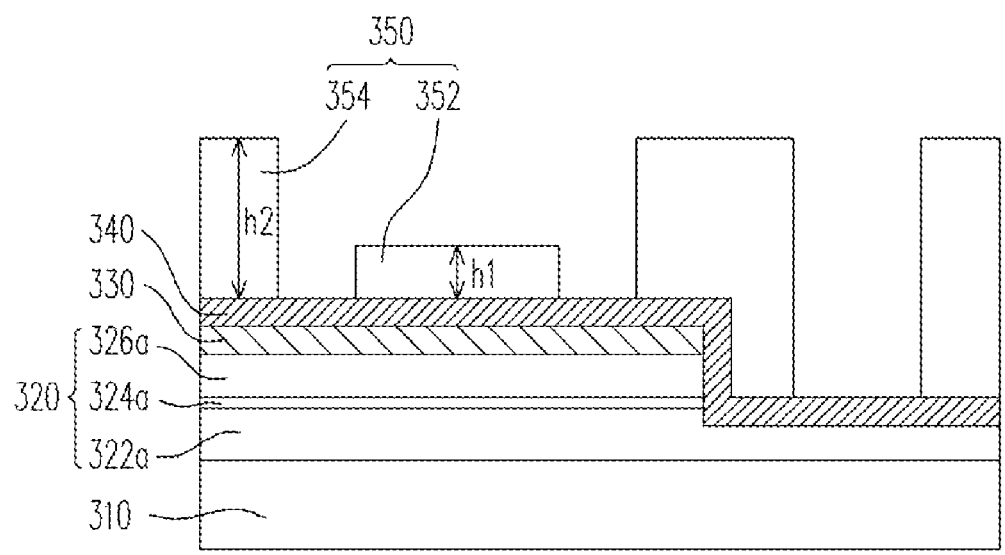

Then, a patterned photoresist layer 350 is formed on the dielectric layer 340, as shown by FIG. 6D. The patterned photoresist layer 350 is formed, for example, by a half-tone mask process, a gray-tone mask process or a multi-tone mask process. The present embodiment is exemplified by a half-tone mask process as an example for embodiment but not limited thereto. To give an example, a photoresist material layer (not shown) is formed entirely on the dielectric layer 340 first. Afterwards, the photoresist material layer is patterned by a half-tone mask process to form the patterned photoresist layer 350. The patterned photoresist layer 350 includes a first photoresist block 352 and a second photoresist block 354. A thickness h1 of the first photoresist block 352 is thinner than a thickness h2 of the second photoresist block 354, as shown by FIG. 6D.

Figure 6E:
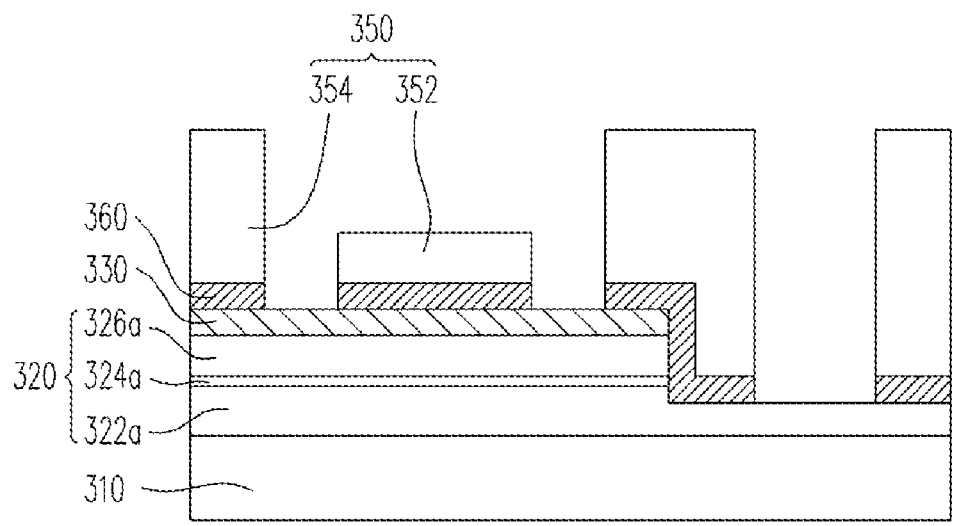

Then, the dielectric layer 340 is partially removed using the patterned photoresist layer 350 as a mask to form a patterned dielectric layer 360, as shown by FIG. 6E. The patterned dielectric layer 360 is formed, for example, by partially removing the dielectric layer 340 with a dry etching process or a wet etching process to expose a portion of the semiconductor device layer 320 and a portion of the current spreading layer 330, as shown by FIG. 6E. The step of partially removing the dielectric layer 340 is described above as an example only, and other suitable etching processes may also be adopted.

Figure 6F:
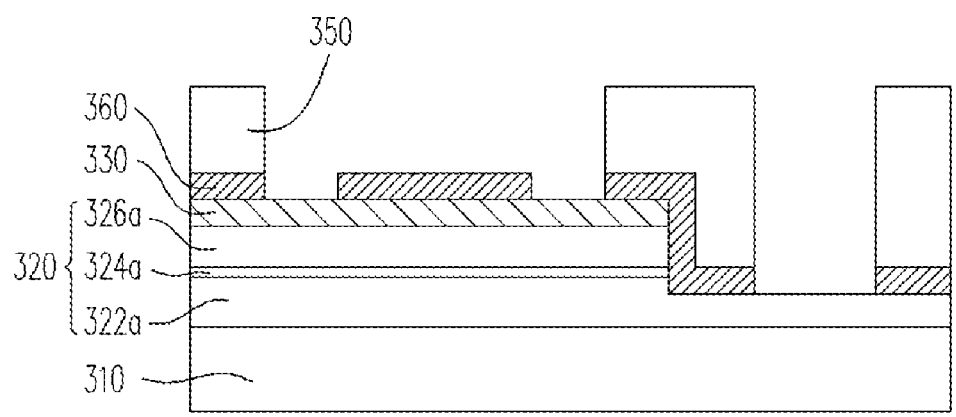

Thereafter, the thickness of the patterned photoresist layer 350 is reduced, for example, by a plasma ashing process until the first photoresist block 352 is removed entirely to form a structure as shown by FIG. 6F.

Figure 6G:
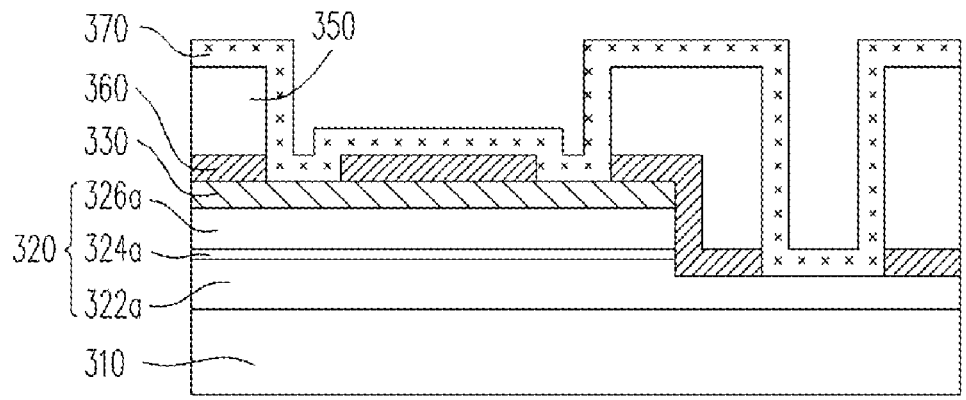

After completing the foregoing steps, an electrode material layer 370 is formed entirely on the substrate 310, as shown by FIG. 6G. The electrode material layer 370 is formed, for example, by CVD, as mentioned above, sputtering, evaporation or other suitable processes.

Figure 6H:
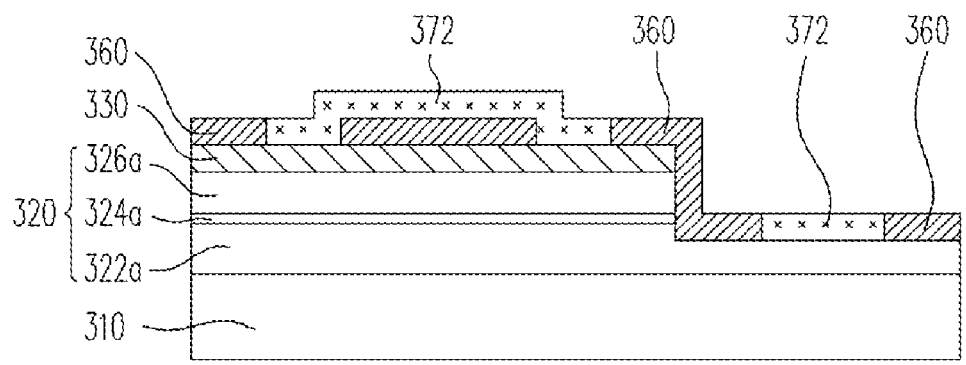

Next, the patterned photoresist layer 350 is removed to strip the electrode material layer 370 thereon and form a plurality of electrodes 372. The electrodes 372 are electrically connected with the semiconductor device layer 320 and the current spreading layer 330, as shown by FIG. 6H. For example, the patterned photoresist layer 350 may be removed to form the plurality of electrodes 372 by a lift-off process to complete a structure as shown by FIG. 6H. Specifically, when the patterned photoresist layer 350 is removed, the electrode material layer 370 covering the patterned photoresist layer 350 is also removed simultaneously. As a result, the electrode material layer 370 forms the plurality of electrodes 372 as shown by FIG. 6H. Up to this step, a process of a light emitting diode chip 300 is generally completed.

Likewise, in the light emitting diode chip 300, the patterned dielectric layer 360 covered by the electrodes 372 is defined as the current blocking layer, and the patterned dielectric layer 360 not covered by the electrodes 372 is defined as the passivation layer. In detail, when the light emitting diode chip 300 emits light, the current blocking layer is suitable for exciting a more even light from the light emitting layer so that the light emitting diode chip 300 has better light emitting efficiency. Furthermore, the passivation layer is suitable for preventing the semiconductor device layer from being damaged or oxidized by influences of the exterior environment and then affecting electrical characteristics of the light emitting diode chip 300 when emits light.

It should be noted that the light emitting diode chips 300 and 200c have the same structures. The difference between the two lies in that one mask patterning process is performed to fabricate the semiconductor device layer 320 and the current spreading layer 330 simultaneously on the substrate 310 of the light emitting diode chip 300, while two mask patterning processes are performed to fabricate the semiconductor device layer 320 and the current spreading layer 330 respectively on the substrate 310 of the light emitting diode chip 200c.

Similarly, if a mask pattern of the patterned photoresist layer is a different pattern, the light emitting diode chip 300 may further be formed as another light emitting diode chip. A detailed description is provided below.

FIGS. 7A through 7E show a flowchart of fabricating a light emitting diode chip according to another mode of embodiment for the second embodiment of the present invention. First, a light emitting diode chip 300a is formed by the process steps as shown by FIGS. 6A through 6C; a relevant description is not repeated herein.

Figure 7A:
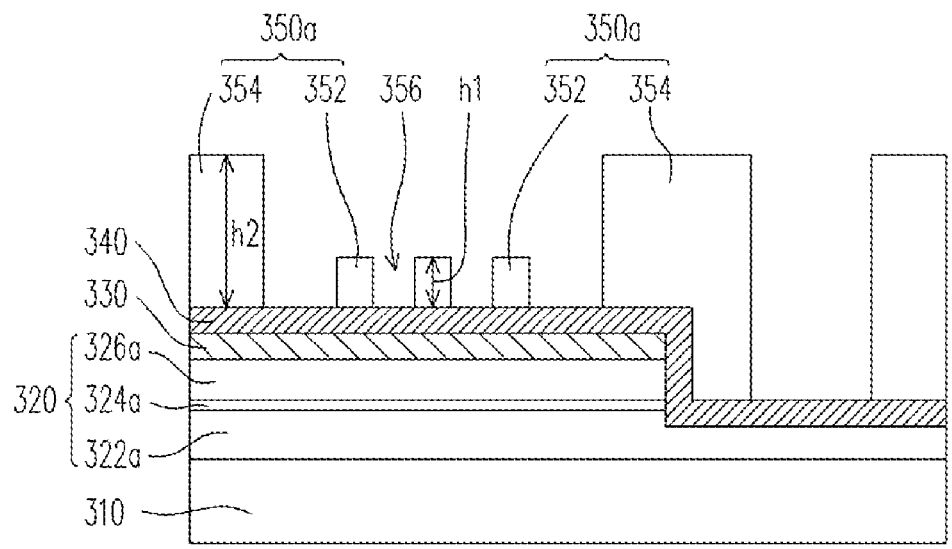
FIGS. 7A through 7E show a flowchart of fabricating a light emitting diode chip according to another mode of embodiment for the second embodiment of the present invention.

After completing the aforesaid steps, a patterned photoresist layer 350a is formed on the dielectric layer 340, as shown by FIG. 7A. The patterned photoresist layer 350a is formed, for example, by a half-tone mask process, a gray-tone mask process or a multi-tone mask process. The present embodiment is exemplified by a half-tone mask process as an example for embodiment but not limited thereto. For example, a photoresist material layer (not shown) is formed entirely on the dielectric layer 340. Afterwards, the photoresist material layer is patterned by a half-tone mask process to form the patterned photoresist layer 350a. The patterned photoresist layer 350a includes a first photoresist block 352 and a second photoresist block 354. A thickness h1 of the first photoresist block 352 is thinner than a thickness h2 of the second photoresist block 354, as shown by FIG. 7A. It should be noted that the fabricating method of the patterned photoresist layer 350a is similar to that of the patterned photoresist layer 350. The difference between the two fabricating methods lies in that a plurality of openings 356 exists between the first photoresist blocks 352 of the patterned photoresist layer 350a to partially expose the dielectric layer 340, as shown by FIG. 7A. In order to form the patterned photoresist layer 350a, only the mask pattern needs to be adjusted and no additional exposing and developing processes are required.

Figure 7B:
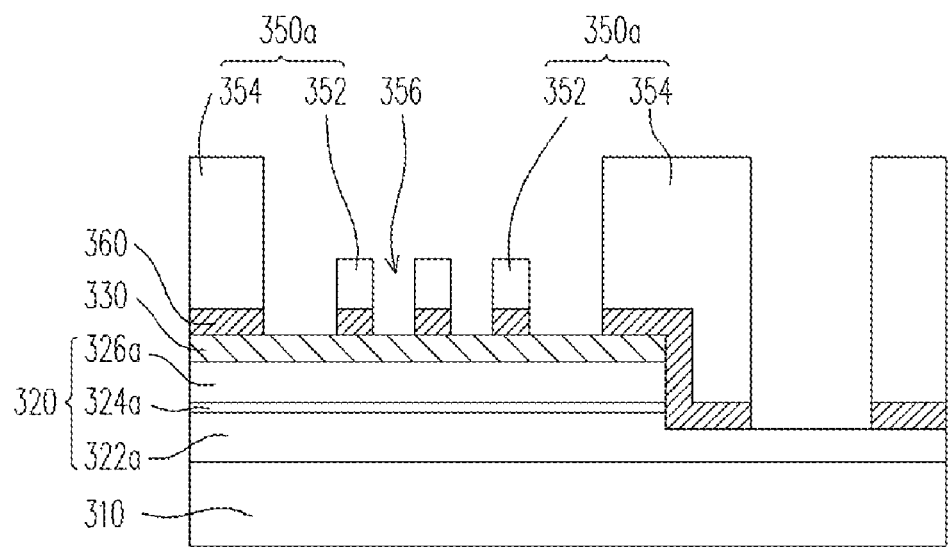
Figure 7C:
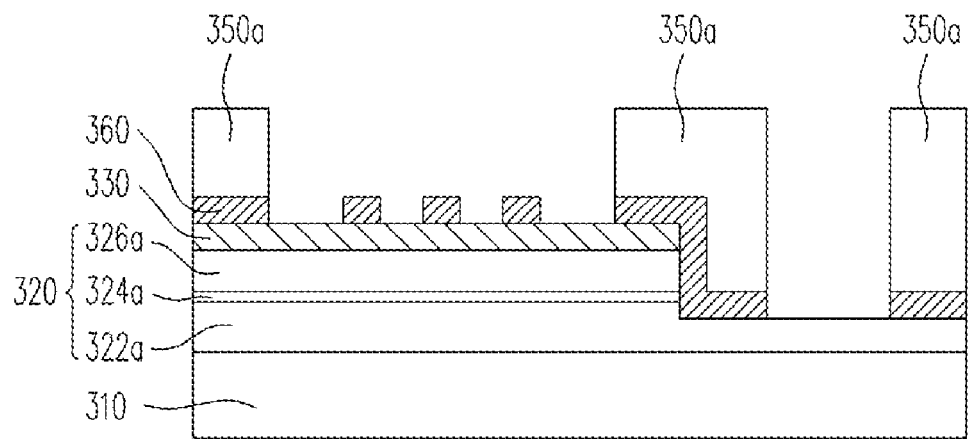
Figure 7D:
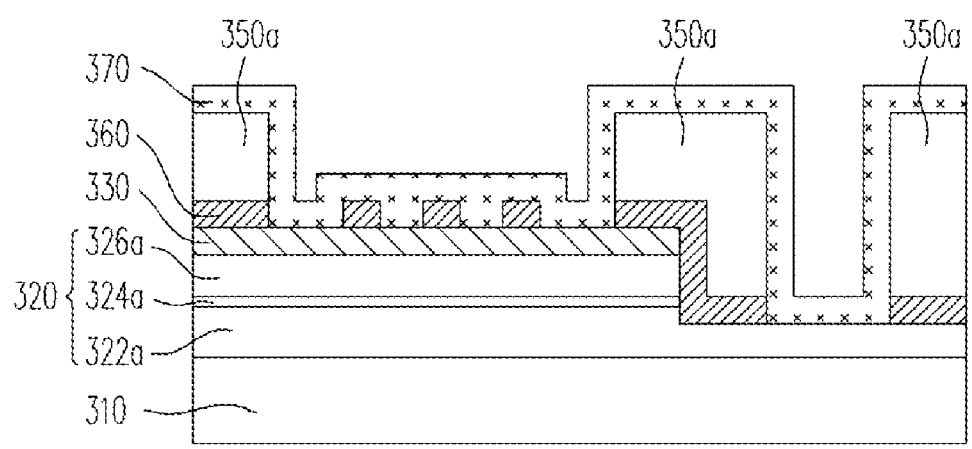
Figure 7E:
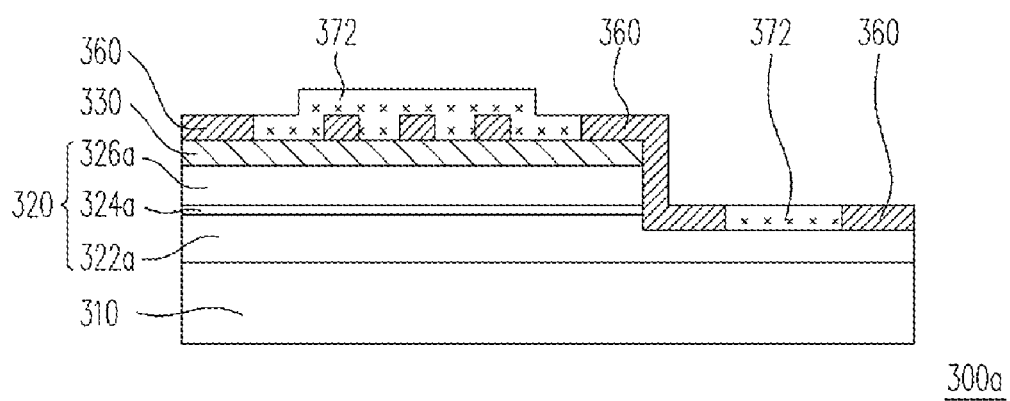

Thereafter, referring to FIGS. 7B through 7E in sequence, since the process steps shown by FIGS. 7B through 7E are the same as those shown by FIGS. 6E through 6H, the description of the relevant process is not repeated. According to the present embodiment, the patterned photoresist layer 350a is different from the patterned photoresist layer 350. Hence, the structure of the light emitting diode chip 300a formed by completing the process steps shown by FIGS. 7B through 7E is also different from the structure of the above light emitting diode chip 300 mentioned, as shown by FIGS. 6H and 7E.

Similarly, in the light emitting diode chip 200a, a plurality of openings 356 exists between the patterned photoresist layers 350a. The patterned dielectric layer 360 is suitable for partially exposing the current spreading layer 330, as shown by FIG. 7B. Thus, when the plurality of electrodes 372 is formed on the substrate 310, some electrodes 372 are suitable for being electrically connected with a current spreading layer 330a directly, as shown by FIG. 7E.

In addition, the patterned dielectric layer 360 covered by the electrodes 372 is defined as the current blocking layer, and the patterned dielectric layer 360 not covered by the electrodes 372 is defined as the passivation layer. Therefore, when the light emitting diode chip 300a is driven, the current blocking layer is suitable for exciting a more even light from the light emitting layer so that the light emitting diode chip 300a has better light emitting uniformity. Moreover, similarly, only one mask patterning process is performed to fabricate the semiconductor device layer 320 and the current spreading layer 330 simultaneously on the substrate 310 of the light emitting diode chip 300a.

In view of the aforementioned, in the process steps of the light emitting diode chips 300 and 300a, a half-tone mask process, a gray-tone mask process or a multi-tone mask process is performed and a lift-off process is selectively applied to incorporate the process steps of the current blocking layer, the passivation layer or the electrodes. Further, the process steps of the light emitting diode chips 300 and 300a further incorporate the steps of forming the semiconductor device layer 320 and the current spreading layer 330 into one mask patterning process to further simplify the steps of fabricating the light emitting diode chip. Hence, the light emitting diode chips 300 and 300a only require two mask patterning processes to complete their fabrication and thereby significantly reducing the fabrication time and the fabrication cost of the light emitting diode chip.

The Third Embodiment

Figure 8A:
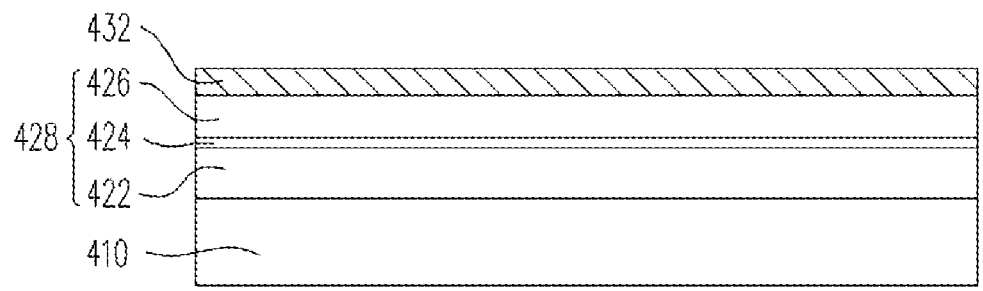
FIGS. 8A through 8F show a schematic flowchart of fabricating a light emitting diode chip according to the third embodiment of the present invention.

FIGS. 8A through 8F show a schematic flowchart of fabricating a light emitting diode chip according to the third embodiment of the present invention. First, a first type semiconductor material layer 422, a light emitting material layer 424, a second type semiconductor material layer 426 and a conductive layer 432 are sequentially formed on a substrate 410 to further form a semiconductor layer 428 and a conductive layer 432 on the semiconductor layer 428 respectively, as shown by FIG. 8A. According to the present embodiment, the semiconductor layer 428 and the conductive layer 432 thereon are formed, for example, by MOCVD, MBE, evaporation, sputtering or other suitable epitaxial growth processes to sequentially form the material layers 422, 424, 426 and the conductive layer 432 on the substrate 410. The present embodiment is exemplified by an MOCVD process as an example for embodiment but not limited thereto. According to the present embodiment, the substrates 410 and 210 have the same material, and the material layers 422, 424 and 426 are the same as the material layers 222, 224 and 226 in the foregoing embodiment. A relevant description thereof is thus not repeated herein.

Figure 8B:
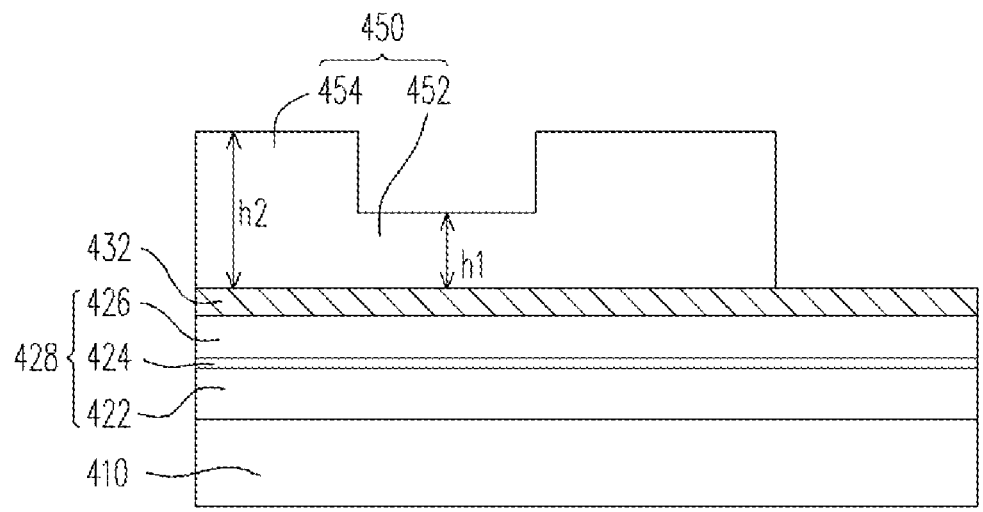

Afterwards, a first patterned photoresist layer 450 is formed on the conductive layer 432, as shown by FIG. 8B. The first patterned photoresist layer 450 is formed, for example, by a half-tone mask process, a gray-tone mask process or a multi-tone mask process. The present embodiment is exemplified by a half-tone mask process as an example for embodiment but not limited thereto. For example, a photoresist material layer (not shown) is formed entirely on the conductive layer 432. Afterwards, the photoresist material layer is patterned by a half-tone mask process to form the first patterned photoresist layer 450. The first patterned photoresist layer 450 includes a first photoresist block 452 and a second photoresist block 454. A thickness h1 of the first photoresist block 452 is thinner than a thickness h2 of the second photoresist block 454, as shown by FIG. 8B.

Figure 8C:
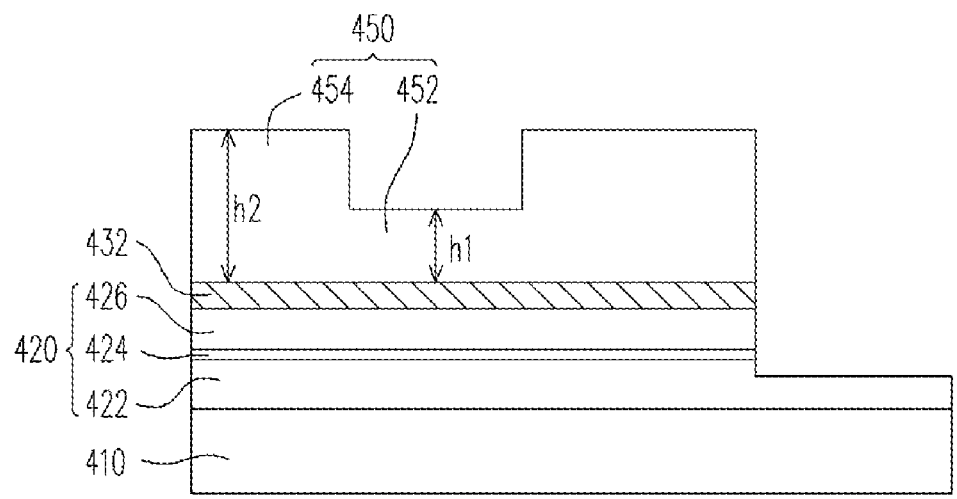

Then, a portion of the conductive layer 432 and a portion of the semiconductor layer 428 are removed using the first patterned photoresist layer 450 as a mask to form a semiconductor device layer 420, as shown by FIG. 8C. According to the present embodiment, the conductive layer 432 and the semiconductor layer 428 are partially removed, for example, by a dry etching process, a wet etching process or other suitable etching processes. A description of the relevant process is the same as that mentioned in the foregoing embodiment.

Figure 8D:
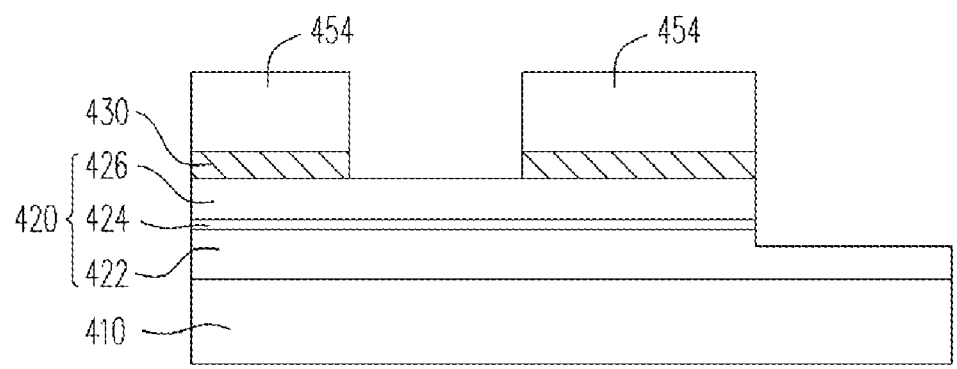

Thereafter, a thickness of the first patterned photoresist layer 450 is reduced by a plasma ashing process until the first photoresist block 452 is removed completely. The conductive layer 432 is partially removed using the remaining second photoresist block 454 as a mask to form a current spreading layer 430. The current spreading layer 430 partially exposes the semiconductor device layer 420 to form a structure as shown by FIG. 8D. The conductive layer 432 is partially removed to form the current spreading layer 430 by a dry etching process, a wet etching process or other suitable etching processes, for example. A description of the relevant process is the same as that mentioned in the foregoing embodiment.

Figure 8E:
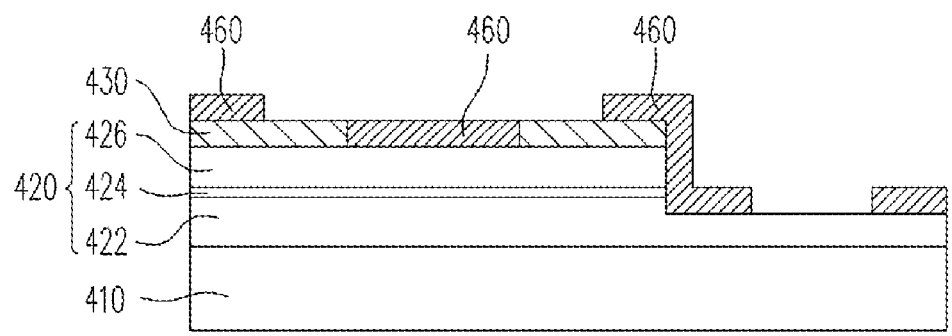
Figure 8F:
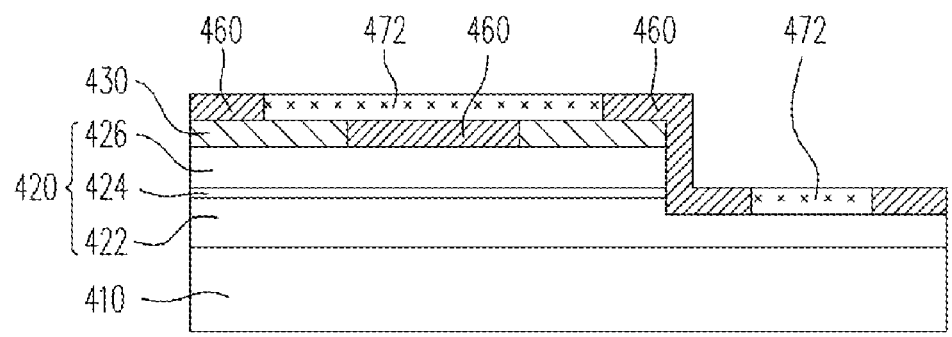

Afterwards, the remaining second photoresist block 454 is removed to form a patterned dielectric layer 460 and a plurality of electrodes 472 on the current spreading layer 430 and the semiconductor device layer 420, as shown by FIGS. 8E and 8F. According to the present embodiment, the patterned dielectric layer 460 and the plurality of electrodes 472 may be fabricated by a conventional PEP. For example, in the present embodiment, the patterned dielectric layer 460 is first formed by a PEP, as shown by FIG. 8E. Next, another PEP is applied to form the plurality of electrodes 472, as shown by FIG. 8F. Up to this step, the process of a light emitting diode chip 400 is generally completed.

In the light emitting diode chip 400, the patterned dielectric layer 460 covered by the electrodes 472 is defined as a current blocking layer, and the patterned dielectric layer 460 not covered by the electrodes 472 is defined as a passivation layer. When the light emitting diode chip 400 is driven, the current blocking layer is suitable for exciting a more even light from the light emitting layer so that the light emitting diode chip 400 has better light emitting uniformity. Furthermore, the passivation layer is suitable for preventing the semiconductor device layer from being damaged or oxidized by influences of the exterior environment and then affecting electrical characteristics of the light emitting diode chip 400 when driven.

According to the present embodiment, the process steps of the light emitting diode chip 400 include forming the semiconductor layer and the conductive layer sequentially on the substrate and performing a half-tone mask process with one mask pattern to form the semiconductor device layer and the current spreading layer. Then, a PEP process is used to form the passivation layer and the current blocking layer respectively. Thereafter, another PEP is further applied to form the electrodes. In other words, the said fabricating method of the light emitting diode chip 400 only applies three mask patterning processes and thereby effectively reduces the fabrication cost and the fabrication time.

According to an embodiment, if the mask pattern used to form the first patterned photoresist layer 450 has a different mode of embodiment, another light emitting diode chip 400a can be formed. A detailed description is provided below.

FIGS. 9A through 9E show a flowchart of fabricating another light emitting diode chip according to the third embodiment of the present invention. First, the process steps as shown by FIG. 8A are performed to fabricate the light emitting diode chip 400a; a relevant description is not repeated herein.

Figure 9A:
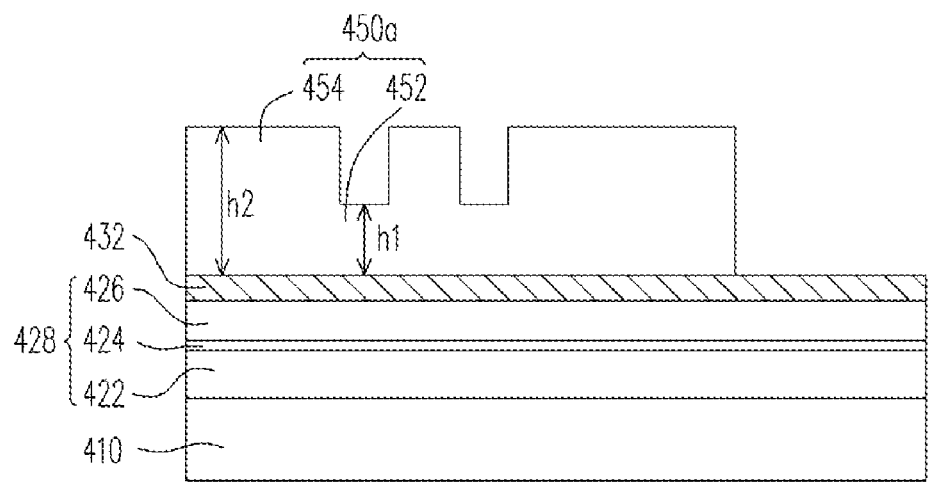
FIGS. 9A through 9E show a flowchart of fabricating a light emitting diode chip according to another mode of embodiment for the third embodiment of the present invention.
Figure 9B:
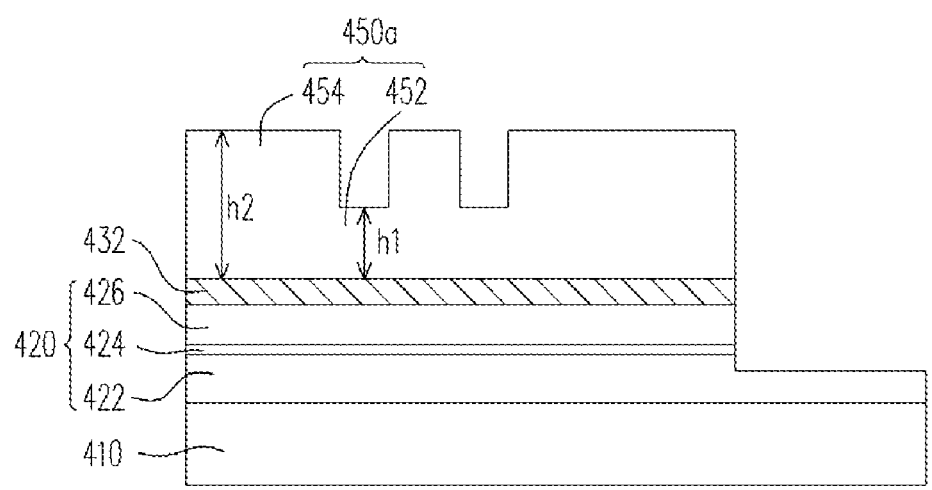

Afterwards, a first patterned photoresist layer 450a is formed on the conductive layer 432, as shown by FIG. 9A. According to the present embodiment, the first patterned photoresist layer 450a is formed, for example, by a half-tone mask process, a gray-tone mask process or a multi-tone mask process. The present embodiment is exemplified by a half-tone mask process as an example for embodiment but not limited thereto. For example, a photoresist material layer (not shown) is formed entirely on the conductive layer 432. Afterwards, the photoresist material layer is patterned by a half-tone mask process to form the first patterned photoresist layer 450a. The first patterned photoresist layer 450a includes a first photoresist block 452 and a second photoresist block 454. A thickness h1 of the first photoresist block 452 is thinner than a thickness h2 of the second photoresist block 454, as shown by FIG. 9A. It should be noted that the first patterned photoresist layer 450a and the first patterned photoresist layer 450 have similar structures, and the difference between the two layers lies in that the first patterned photoresist layer 450a has a plurality of first photoresist blocks 452, as shown by FIG. 9A. According to the present embodiment, in order to form the first patterned photoresist layer 450a, only the mask pattern is required to be adjusted, and no additional exposing and developing processes are needed.

Figure 9C:
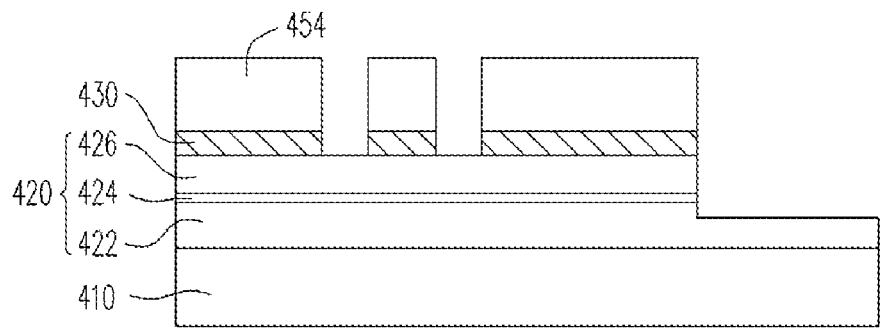
Figure 9D:
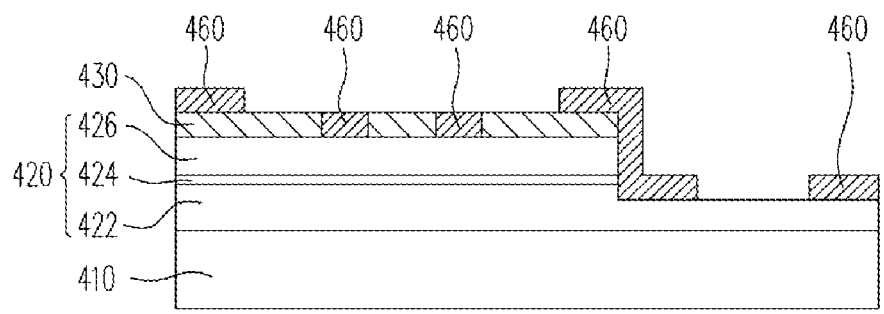
Figure 9E:
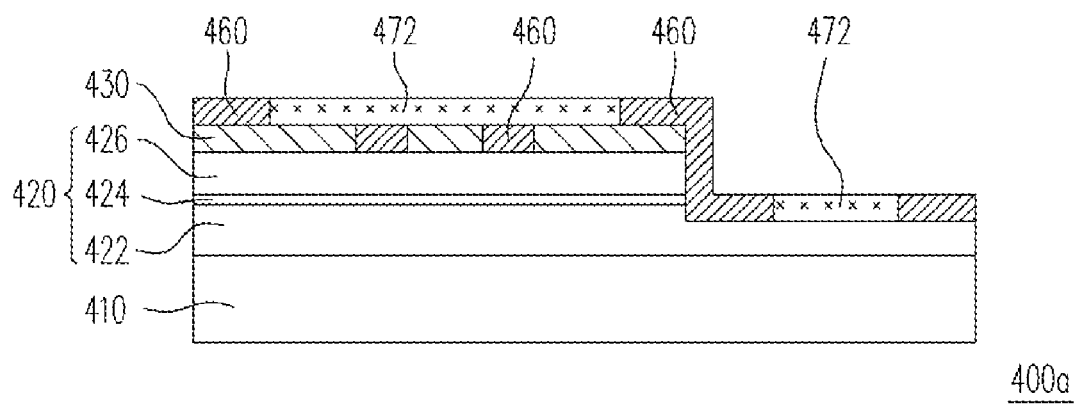

Thereafter, referring to FIGS. 9B through 9E in sequence, since the process steps shown by FIGS. 9B through 9E are similar to those shown by FIGS. 8C through 8F, a relevant description of the process is not repeated herein. According to the present embodiment, the structure of the first patterned photoresist layer 450a is different from the structure of the patterned photoresist layer 450. Hence, the structure of the light emitting diode chip 400a formed by completing the process steps shown by FIGS. 9A through 9E is also different from the structure of the light emitting diode chip 400, as shown by FIGS. 8F and 9E.

The light emitting diode chips 400a and 400 only differ in shapes of some components. Therefore, the fabricating method of the light emitting diode chip 400a also has the same advantages as that of the light emitting diode chip 400. A relevant description is thus omitted.

In addition, a different patterned dielectric layer and different electrodes formed by different mask patterning processes also cause the light emitting diode chip 400a to be formed as another light emitting diode chip. A relevant description follows below.

Figure 10A:
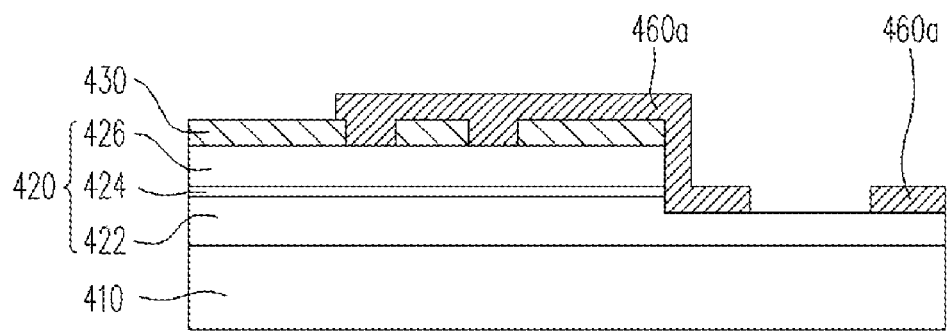
FIGS. 10A and 10B show a flowchart of fabricating a light emitting diode chip according to yet another mode of embodiment for the third embodiment of the present invention.
Figure 10B:
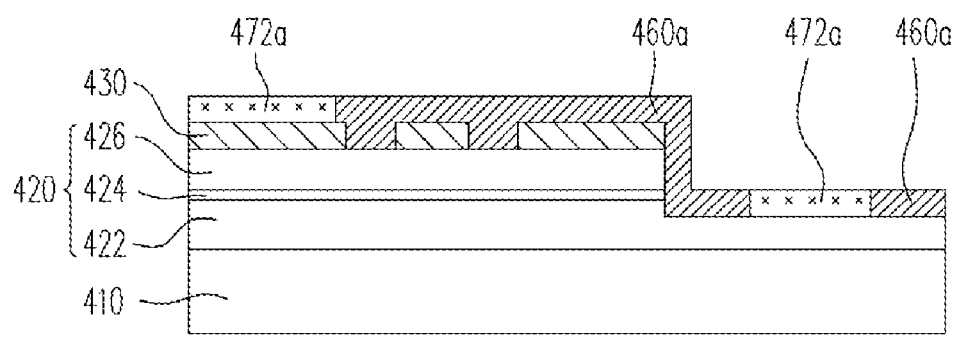

FIGS. 10A and 10B show a flowchart of fabricating a light emitting diode chip according to yet another mode of embodiment for the third embodiment of the present invention. First, the process steps as shown by FIGS. 8A, 9A and 9C are performed in sequence to form a light emitting diode chip 400b; a description of the relevant process is not repeated.

After completing the foregoing steps, the remaining second photoresist block 454 is removed to form a patterned dielectric layer 460a and a plurality of electrodes 472a on the current spreading layer 430 and the semiconductor device layer 420, as shown by FIGS. 10A and 10B. According to the present embodiment, the patterned dielectric layer 460a and the plurality of electrodes 472a are formed in the same way as described in the foregoing. A description of the relevant process is thus not repeated herein.

According to the present embodiment, referring to FIGS. 9D, 9E, 10A and 10B simultaneously, the structures of the patterned dielectric layer 460a and the electrodes 472a are similar to the structures of the patterned dielectric layer 460 and the electrodes 472. The difference between them lies in that the mask pattern used for forming the patterned dielectric layer 460a and the electrodes 472a is different from the mask pattern used for forming the patterned dielectric layer 460 and the electrodes 472.

Therefore, comparing the light emitting diode chip 400b with the light emitting diode chip 400, they only differ in that the patterned dielectric layer 460a and the electrodes 472a have a different shape and position. The fabricating method of the light emitting diode chip 400b likewise has the same advantages as that of the light emitting diode chip 400a does, and a relevant description thereof is thus omitted.

According to another embodiment, the process steps are further reduced by applying again a half-tone mask process combined with a process to form a plurality of components synchronically. The process steps of three different modes of embodiment are given as examples in the following.

FIGS. 11A through 11D show a flowchart of fabricating a light emitting diode chip according to a mode of embodiment for the third embodiment of the present invention. First, the process steps as shown by FIGS. 8A, 9A and 9C are performed in sequence to form a light emitting diode chip 400c; a description of the relevant process is omitted.

Figure 11A:
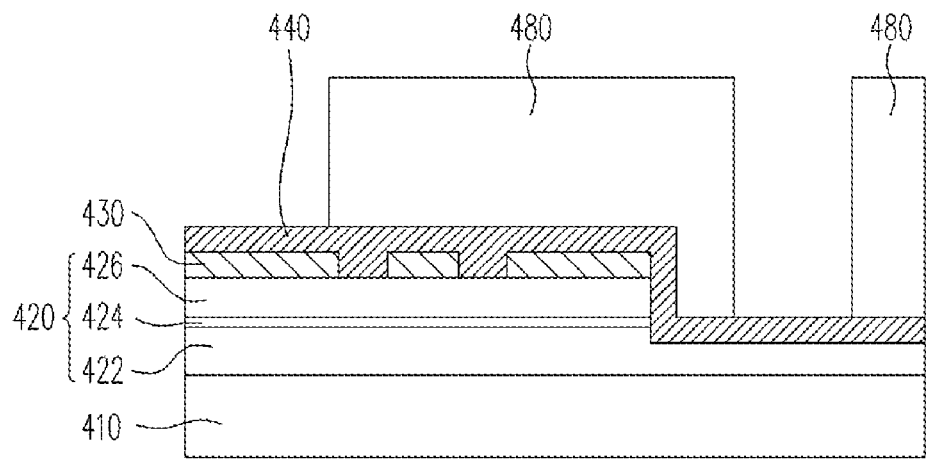
FIGS. 11A through 11D show a flowchart of fabricating a light emitting diode chip according to a mode of embodiment for the third embodiment of the present invention.

After completing the foregoing steps, the remaining second photoresist block 454 is removed to form a dielectric layer 440 to cover the semiconductor device layer 420 and the current dispersion 430 on the substrate 410. Next, a second patterned photoresist layer 480 is formed on the dielectric layer 440, as shown by FIG. 11A. The second photoresist block 454 is removed to form the dielectric layer 440 and further form the second patterned photoresist layer 480 by the same fabricating method as mentioned in the foregoing embodiment. A description of the relevant process is not repeated herein.

Figure 11B:
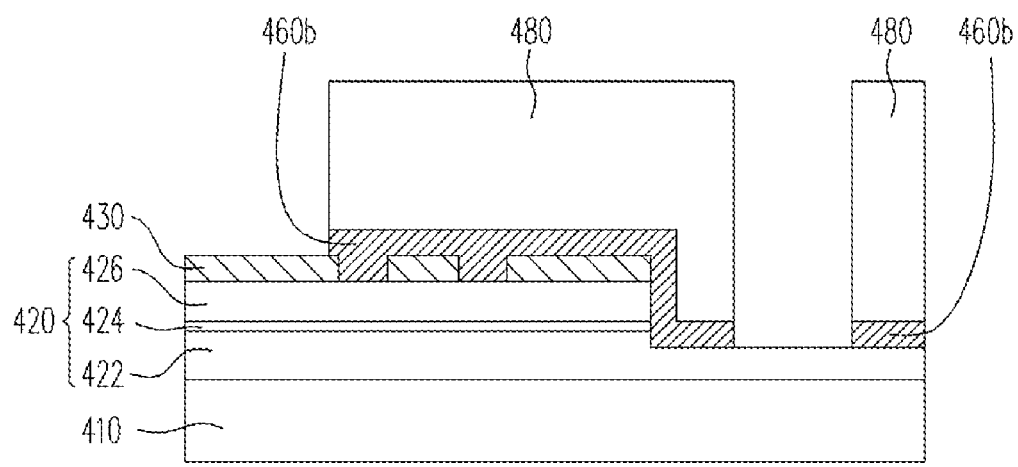

Then, the dielectric layer 440 is partially removed using the second patterned photoresist layer 480 as a mask to form a patterned dielectric layer 460b. The patterned dielectric layer 460b exposes a portion of the semiconductor device layer 420 and a portion of the current spreading layer 430, as shown by FIG. 11B.

Figure 11C:
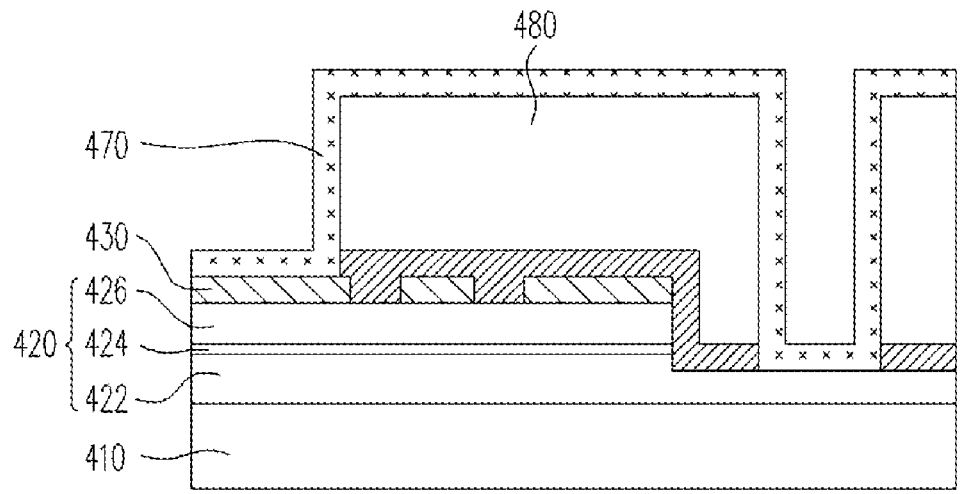

Thereafter, an electrode material layer 470 is formed entirely on the substrate 410, as shown by FIG. 11C. The electrode material layer 470 is formed by the same fabricating method as mentioned in the foregoing embodiment and a relevant description thereof is thus not repeated herein.

Figure 11D:
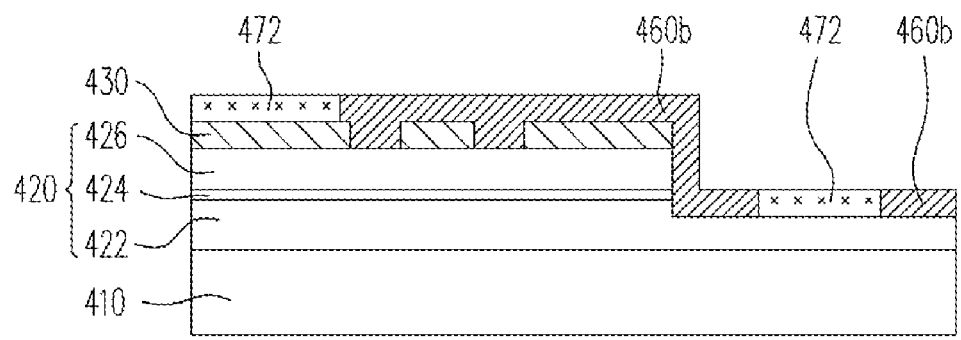

Next, the second patterned photoresist layer 480 is removed to strip the electrode material layer 470 thereon and form the plurality of electrodes 472. The electrodes 472 are electrically connected with the semiconductor device layer 420 and the current spreading layer 430, as shown by FIG. 11D. The second patterned photoresist layer 480 is removed to form the plurality of electrodes 472, for example, by a lift-off process to complete a structure as shown by FIG. 11D. For a description of the relevant process please refer to the relevant description in the foregoing embodiment. Up to this step, the process of the light emitting diode chip 400c is generally completed.

According to the present embodiment, the light emitting diode chips 400c and 400b have the same structures. The difference between the two lies in that the light emitting diode chip 400c is fabricated by a half-tone mask process and a lift-off process to be combined with the process steps of the patterned dielectric layer 460b and the electrodes 472. In other words, the process of the light emitting diode chip 400c only requires two mask patterning processes to complete its process steps. In the fabricating method of the light emitting diode chip 400b, a PEP is performed on the patterned dielectric layer 460b and the electrodes 472 respectively. Therefore, it takes three mask patterning processes to form the light emitting diode chip 400b. Please refer to the process steps of the light emitting diode chips 400b and 400c simultaneously for details.

FIGS. 12A through 12F show a flowchart of fabricating a light emitting diode chip according to another mode of embodiment for the third embodiment of the present invention. First, the process steps as shown by FIGS. 8A through 8D are performed to fabricate a light emitting diode chip 400d; a relevant description is thus not repeated.

Figure 12A:
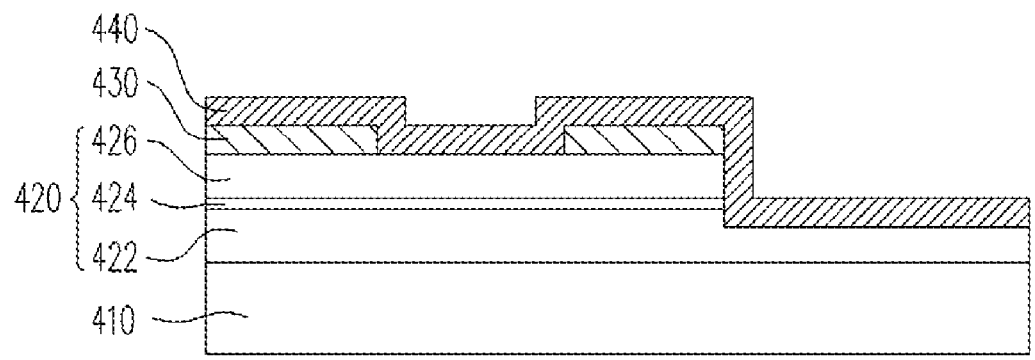
FIGS. 12A through 12F show a flowchart of fabricating a light emitting diode chip according to another mode of embodiment for the third embodiment of the present invention.

After completing the foregoing steps, the remaining second photoresist block 454 is removed to form a dielectric layer 440 to cover the semiconductor device layer 420 and the current spreading layer 430 on the substrate 410, as shown by FIG. 12A. According to the present embodiment, the second photoresist block 454 is removed to form the dielectric layer 440 in the same way as that described in the foregoing embodiment, and thus a relevant description is not repeated herein.

Figure 12B:
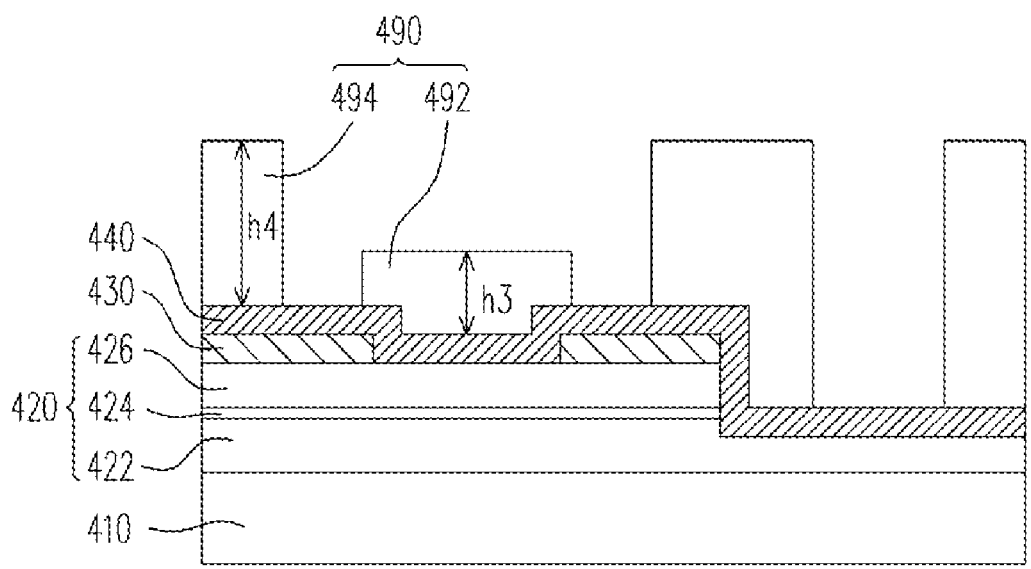

Thereafter, a third patterned photoresist layer 490 is formed on the dielectric layer 440. The third patterned photoresist layer 490 includes a third photoresist block 492 and a fourth photoresist block 494. A thickness h3 of the third photoresist block 492 is thinner than a thickness h4 of the fourth photoresist block 494, as shown by FIG. 12B. According to the present embodiment, the third patterned photoresist layer 490 is formed, for example, by a half-tone mask process, a gray-tone mask process or a multi-tone mask process. The present embodiment is exemplified by a half-tone mask process as an example for embodiment but not limited thereto. To give an example, a photoresist material layer (not shown) may be first formed entirely on the dielectric layer 440. Next, the photoresist material layer is patterned by a half-tone mask process to form the third patterned photoresist layer 490, as shown by FIG. 12B.

Figure 12C:
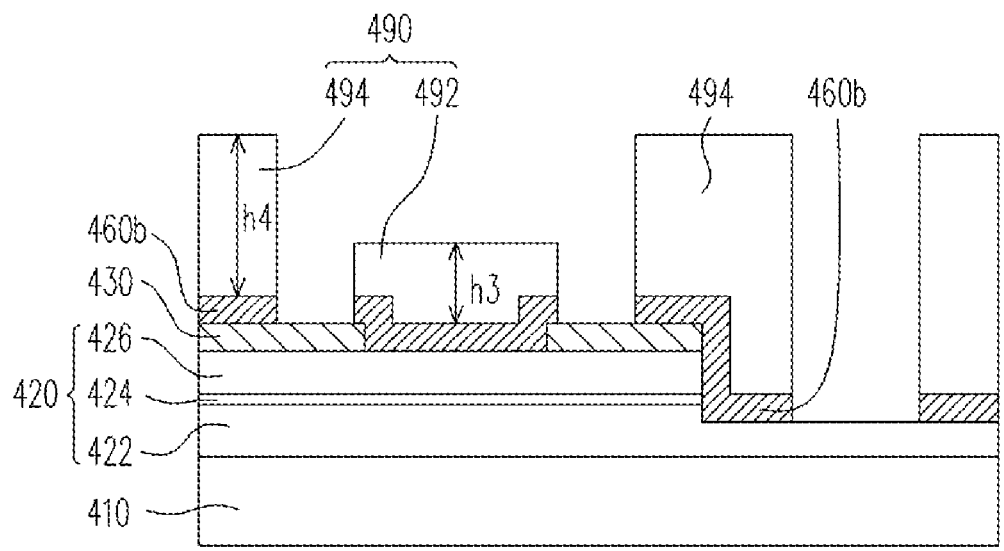

Then, the dielectric layer 440 is partially removed using the third patterned photoresist layer 490 as a mask to form a patterned dielectric layer 460b. The patterned dielectric layer 460b exposes a portion of the semiconductor device layer 420 and a portion of the current spreading layer 430, as shown by FIG. 12C. According to the present embodiment, the dielectric layer 440 is removed to form the patterned dielectric layer 460b by a dry etching process, as aforementioned, a wet etching process or other suitable etching processes, for example. Please refer to the foregoing embodiment for a relevant description.

Figure 12D:
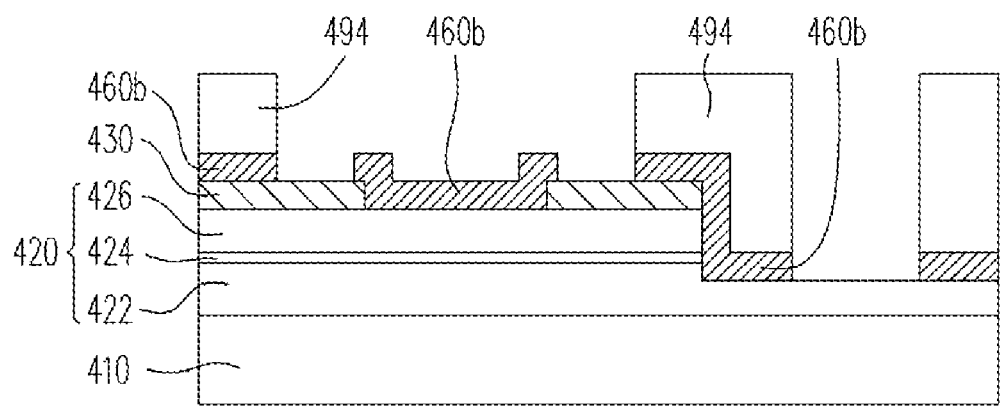

Thereafter, a thickness of the third patterned photoresist layer 490 is reduced by a plasma ashing process until the third photoresist block 492 is removed completely, as shown by FIG. 12D. According to the present embodiment, the plasma ashing process is the same as that described in the foregoing embodiment and thus not repeated herein.

Figure 12E:
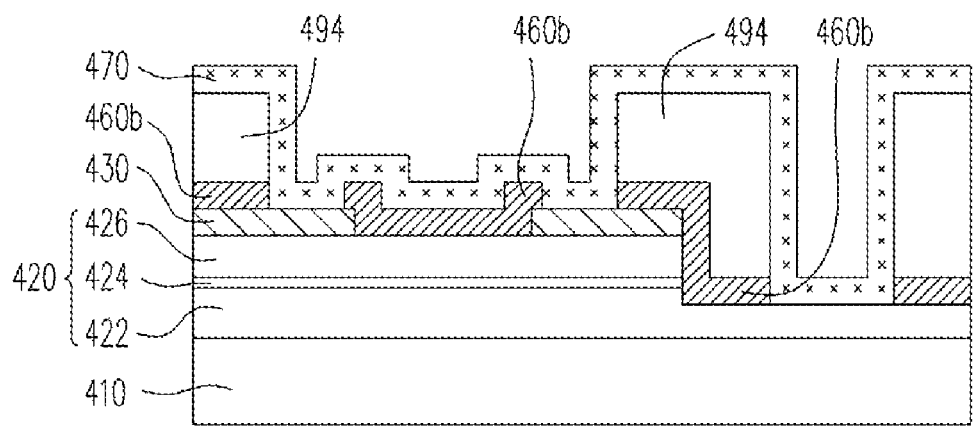
Figure 12F:
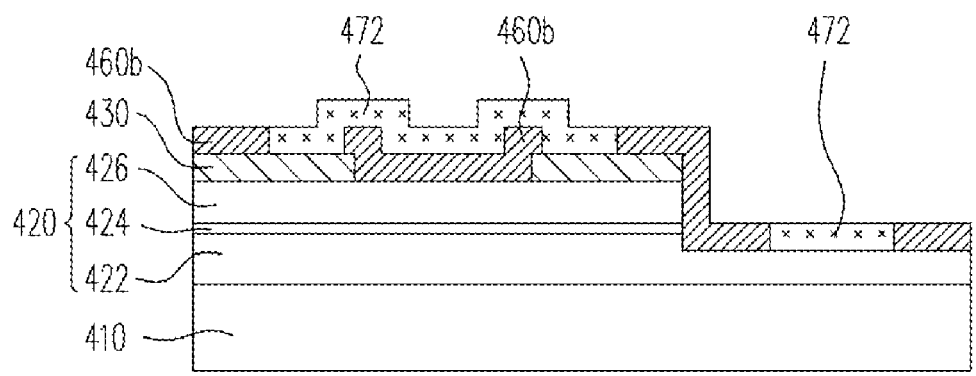

Afterwards, an electrode material layer 470 is formed entirely on the substrate 410, and the third patterned photoresist layer 490 (i.e., the remaining fourth photoresist block 494) is removed to strip the electrode material layer 470 on the third patterned photoresist layer 490 and form a plurality of electrodes 472. The electrodes 472 are electrically connected with the semiconductor device layer 420 and the current spreading layer 430, as shown by FIGS. 12E and 12F. According to the present embodiment, the electrode material layer 470 is formed by a CVD process, for example, and a detailed description thereof is the same as that in the foregoing embodiment. In addition, the third patterned photoresist layer 490 may be removed to form the electrodes 472 by the aforesaid lift-off process. Likewise, a detailed description of the process can be referred to the foregoing embodiment and is thus omitted herein. Up to this step, the process of the light emitting diode chip 400d is generally completed.

Specifically, the light emitting diode chips 400 and 400d are fabricated by similar fabricating methods. The difference between the two lies in that the light emitting diode chip 400d is fabricated by a half-tone mask process and a lift-off process to incorporate the process steps of the patterned dielectric layer 460b (or named as the current blocking layer and the passivation layer) and the electrodes 472. The patterned dielectric layer 460b covered by the electrodes 472 is defined as the current blocking layer, and the patterned dielectric layer 460b not covered by the electrodes 472 is defined as the passivation layer.

Thus, the process steps of the light emitting diode chip 400d only require two mask patterning processes. In the process steps of the light emitting diode chip 400, a PEP is performed respectively to form the patterned dielectric layer 460 (or named as the current blocking layer and the passivation layer) and the electrodes 472. Therefore, the process steps of the light emitting diode chip 400 needs to apply three PEPs. Please also refer to the process steps of both the light emitting diode chips 400 and 400d for relevant descriptions.

Moreover, in the process steps of the light emitting diode chip 400d, if the mask pattern of the third patterned photoresist layer 490 is another mode of embodiment, for example, correspondingly a light emitting diode chip of another mode of embodiment would be formed after completing the foregoing process steps. A relevant description is provided as follows.

FIGS. 13A through 13E show a flowchart of fabricating a light emitting diode chip according to yet another mode of embodiment for the third embodiment of the present invention. The process steps as shown by FIGS. 8A through 8D and 12A are performed in sequence to fabricate a light emitting diode chip 400e; a description of the relevant process is not repeated.

Figure 13A:
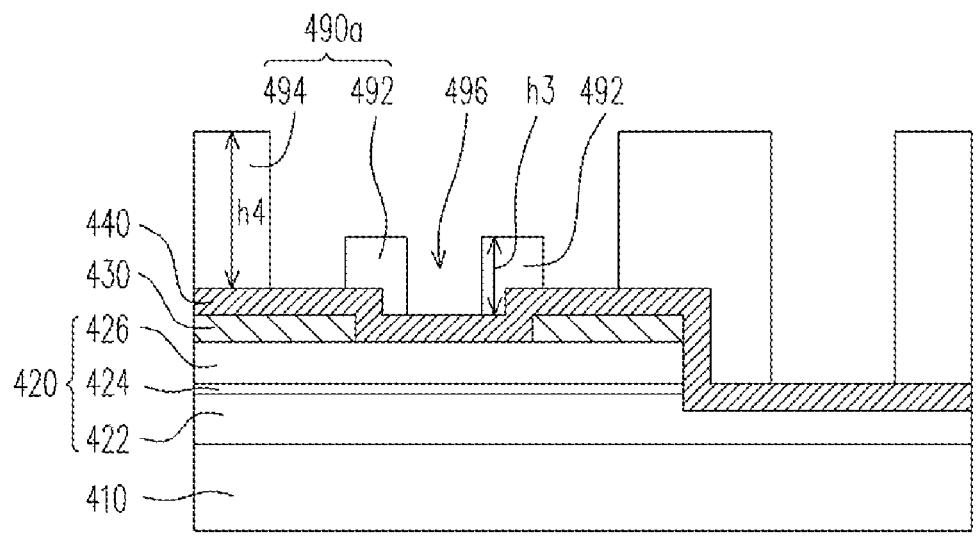
FIGS. 13A through 13E show a flowchart of fabricating a light emitting diode chip according to yet another mode of embodiment for the third embodiment of the present invention.
Figure 13B:
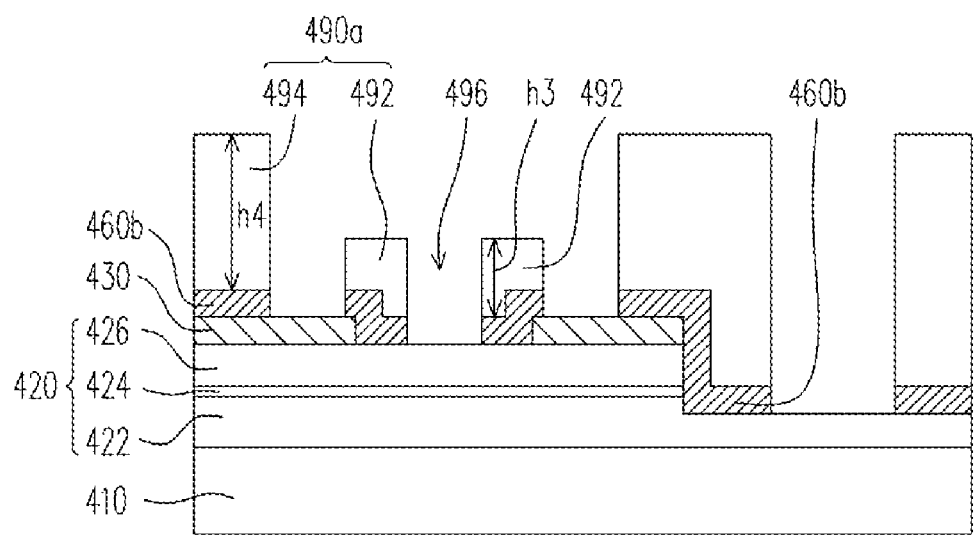
Figure 13C:
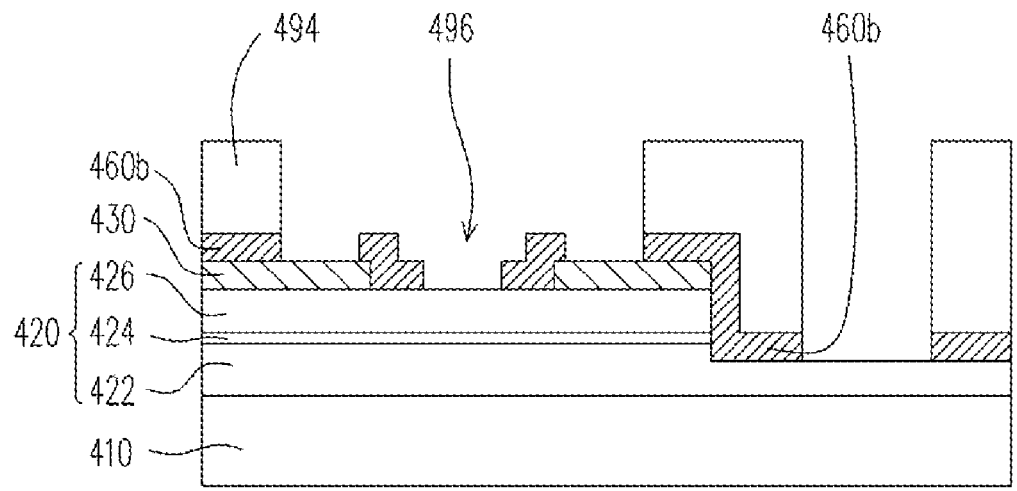
Figure 13D:
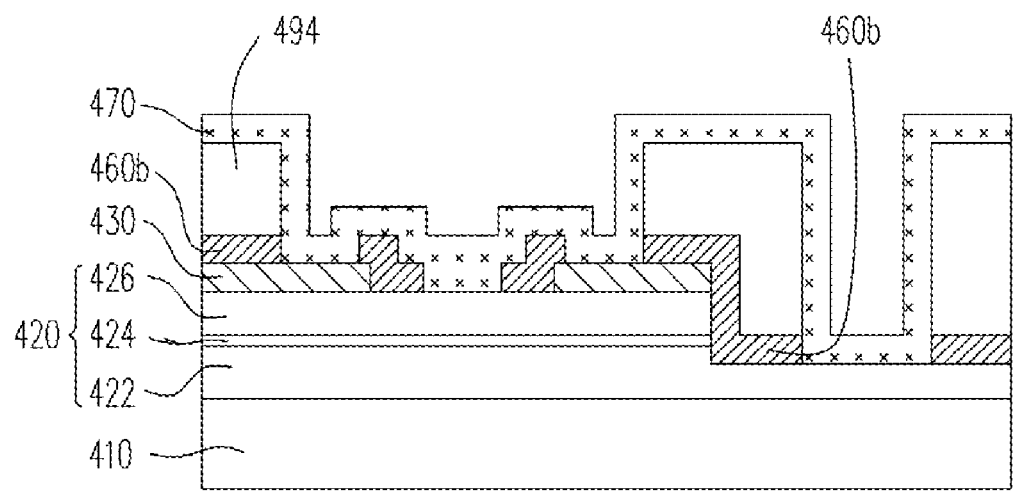

After completing the foregoing steps, a third patterned photoresist layer 490a is formed on the dielectric layer 440. The third patterned photoresist layer 490a includes a third photoresist block 492 and a fourth photoresist block 494. A thickness h3 of the third photoresist block 492 is thinner than a thickness h4 of the fourth photoresist block 494, as shown by FIG. 13A. According to the present embodiment, the third patterned photoresist layer 490a is formed in the same way as the third patterned photoresist layer 490. A description of the relevant technology is thus omitted. It should be noted that the third photoresist block 492a has an opening 496 which exposes the dielectric layer 440.

Figure 13E:
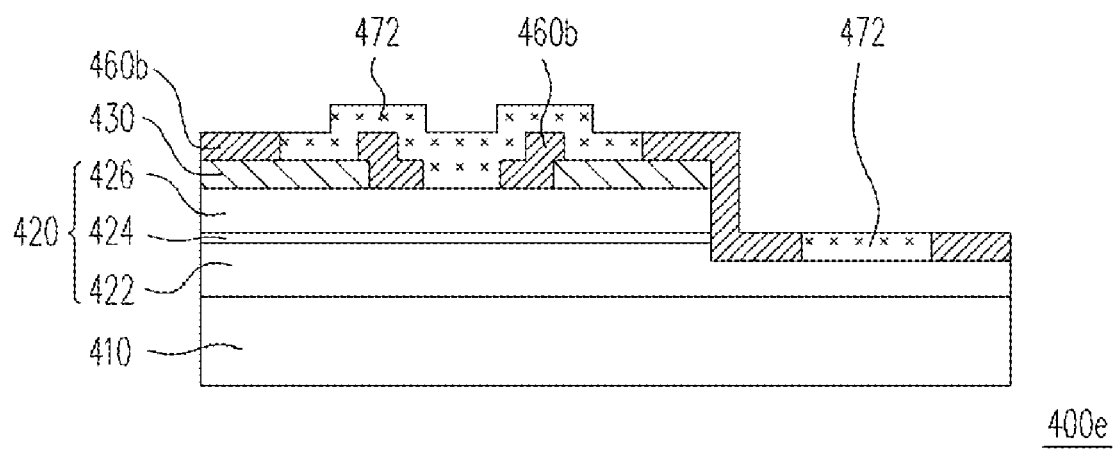

Referring to FIGS. 13B through 13E in sequence, since the fabricating method shown by FIGS. 13B through 13E is similar to that shown by FIGS. 12B through 12E, a relevant description thereof is thus not repeated herein. According to the present embodiment, the structure of the third patterned photoresist layers 490a is different from that of the third patterned photoresist layer 490. Hence, the structure of the light emitting diode chip 400e formed by completing the process steps shown by FIGS. 13B through 13E is also different from that of the light emitting diode chip 400d, as shown by FIGS. 12E and 13E.

Similarly, the fabricating methods of the light emitting diode chips 400e and 400d are similar. The difference between the two methods is that the mask design in the fabricating method of the light emitting diode chip 400e is altered, and the process steps are thus not affected as a whole. Hence, only two mask patterning processes are required to complete the process steps of the light emitting diode chip 400e.

In summary, in the fabricating method of the light emitting diode chip, a half-tone mask process, a gray-tone mask process or a multi-tone mask process is performed a number of times and combined selectively with a lift-off process to simplify the process steps of the light emitting diode chip and thereby effectively reduce the fabrication cost and the fabrication time.

The Fourth Embodiment

Figure 14A:
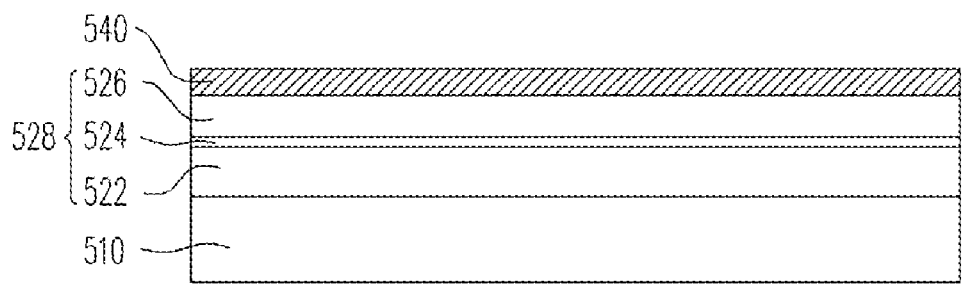
FIGS. 14A through 14I show a schematic flowchart of fabricating a light emitting diode chip according to the fourth embodiment of the present invention.

FIGS. 14A through 14I show a schematic flowchart of fabricating a light emitting diode chip according to the fourth embodiment of the present invention. First, a first type semiconductor material layer 522, a light emitting material layer 524, a second type semiconductor material layer 526 and a dielectric layer 540 are sequentially formed on a substrate 510 to further form a semiconductor layer 528 and a dielectric layer 540 on the semiconductor layer 528 respectively, as shown by FIG. 14A. The semiconductor layer 528 and the dielectric layer 540 thereon are formed, for example, by MOCVD, MBE, evaporation, sputtering, CVD or other suitable epitaxial growth processes to sequentially form the material layers 522, 524, 526 and the dielectric layer 540 on the substrate 510. The present embodiment is exemplified by an MOCVD process as an example for embodiment but not limited thereto. According to the present embodiment, the substrates 510 and 210 have the same material, and the material layers 522, 524 and 526 are the same as the material layers 222, 224 and 226 in the foregoing embodiment. A relevant description is thus omitted.

Figure 14B:
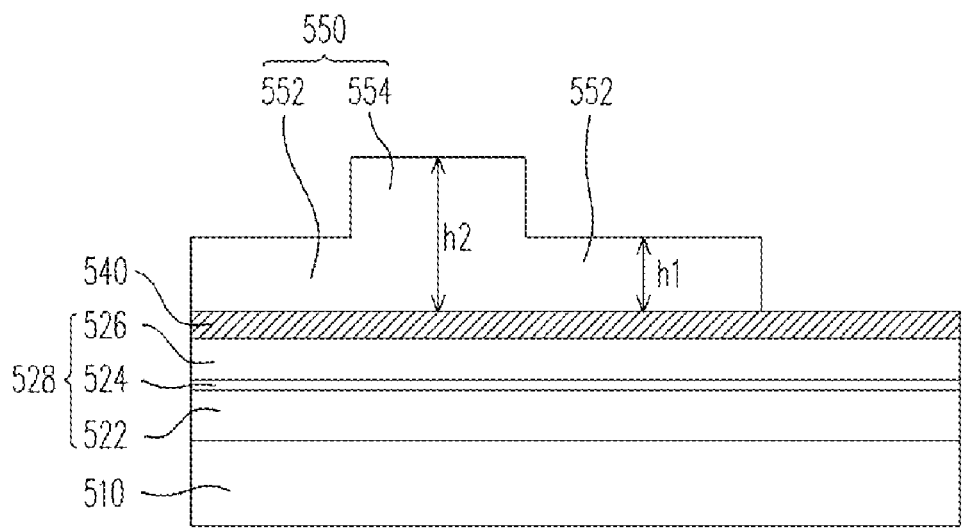

Thereafter, a first patterned photoresist layer 550 is formed on the dielectric layer 540. The first patterned photoresist layer 550 includes a first photoresist block 552 and a second photoresist block 554. A thickness h1 of the first photoresist block 552 is thinner than a thickness h2 of the second photoresist block 554, as shown by FIG. 14B. The first patterned photoresist layer 550 is formed, for example, by a half-tone mask process, a gray-tone mask process or a multi-tone mask process. The present embodiment is exemplified by a half-tone mask process as an example for embodiment but not limited thereto. To give an example, a photoresist material layer (not shown) may be first formed entirely on the dielectric layer 540. Next, the photoresist material layer is patterned by a half-tone mask process to form the first patterned photoresist layer 550, as shown by FIG. 14B.

Figure 14C:
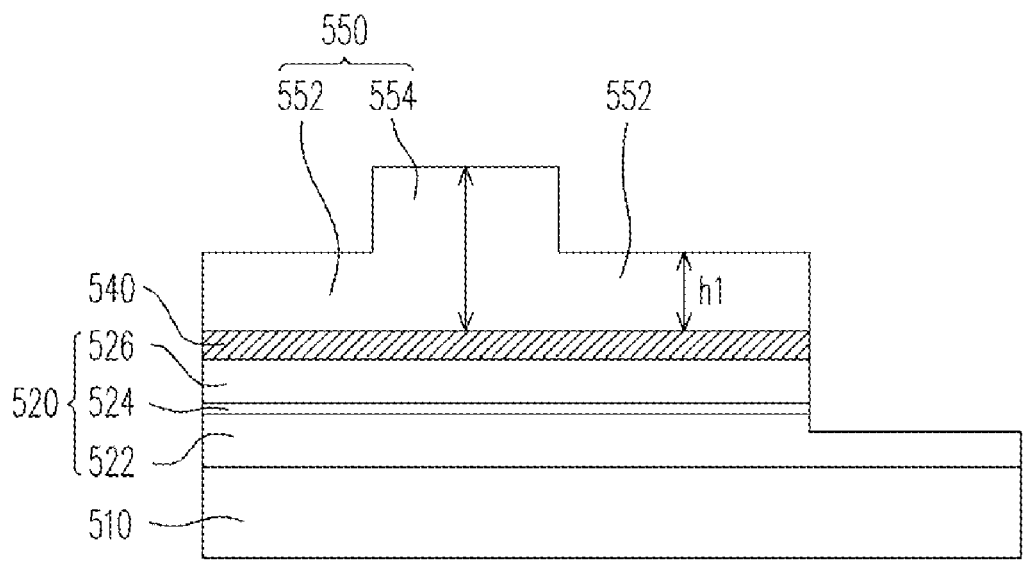

Then, a portion of the dielectric layer 540 and a portion of the semiconductor layer 528 are removed using the first patterned photoresist layer 550 as a mask to form a semiconductor device layer 520, as shown by FIG. 14C. According to the present embodiment, the dielectric layer 540 and the semiconductor layer 528 are partially removed, for example, by a dry etching process, a wet etching process or other suitable etching processes. A description of the relevant process is the same as that mentioned in the foregoing embodiment.

Figure 14D:
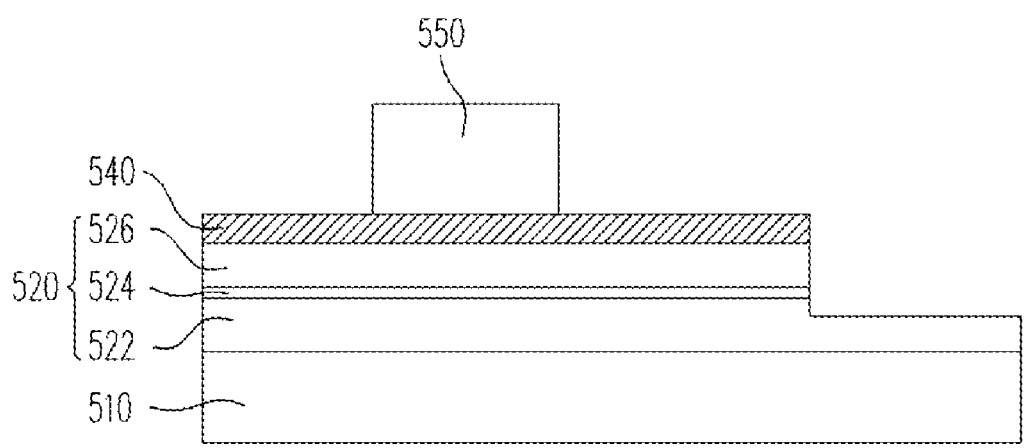
Figure 14E:
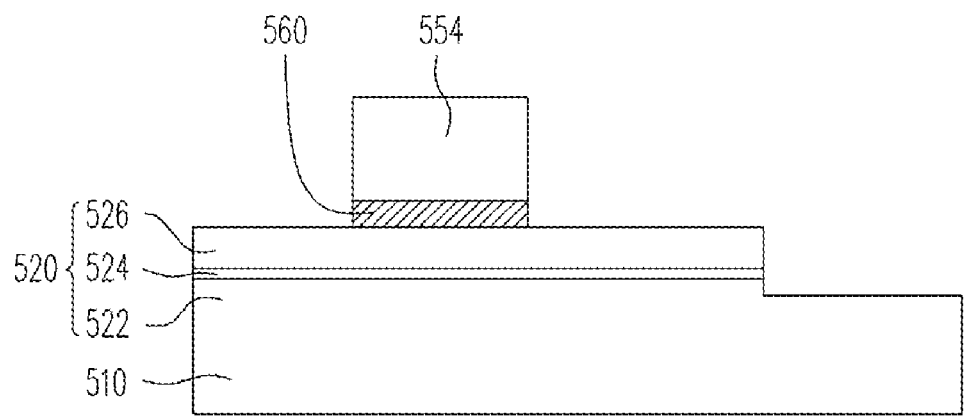

Next, a thickness of the first patterned photoresist layer 550 is reduced until the first photoresist block 552 is removed completely. The dielectric layer 540 is partially removed using the remaining second photoresist block 554 as a mask to form a patterned dielectric layer 560. The patterned dielectric layer 560 partially exposes the semiconductor device layer 520, as shown by FIGS. 14D and 14E. According to the present embodiment, the first photoresist block 552 is removed, for example, by a plasma ashing process as aforementioned. A relevant description thereof is the same as the description in the foregoing embodiment and is thus omitted herein. The dielectric layer 540 may be partially removed to form the patterned dielectric layer 560 by a dry etching process, a wet etching process or other suitable etching processes. A relevant description of the process can be referred to the description of the foregoing embodiment and is thus not repeated herein.

Figure 14F:
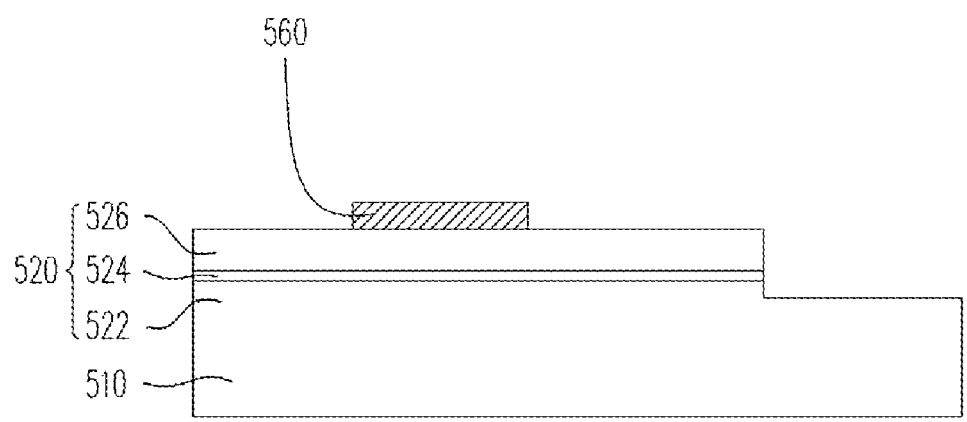
Figure 14G:
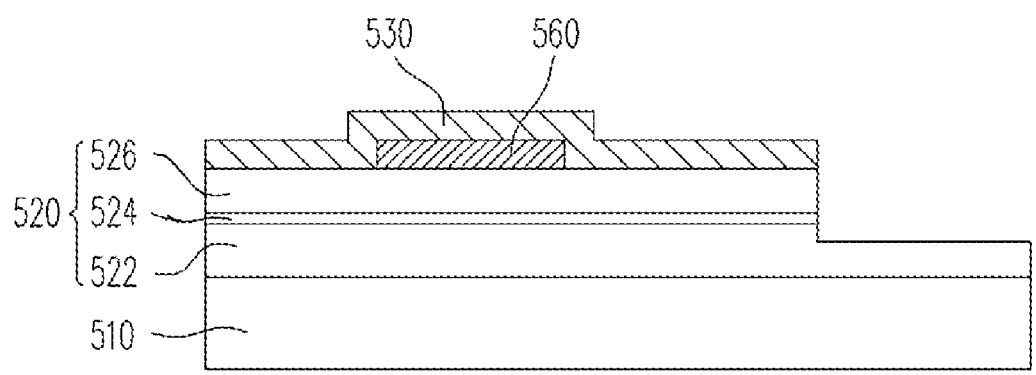
Figure 14H:
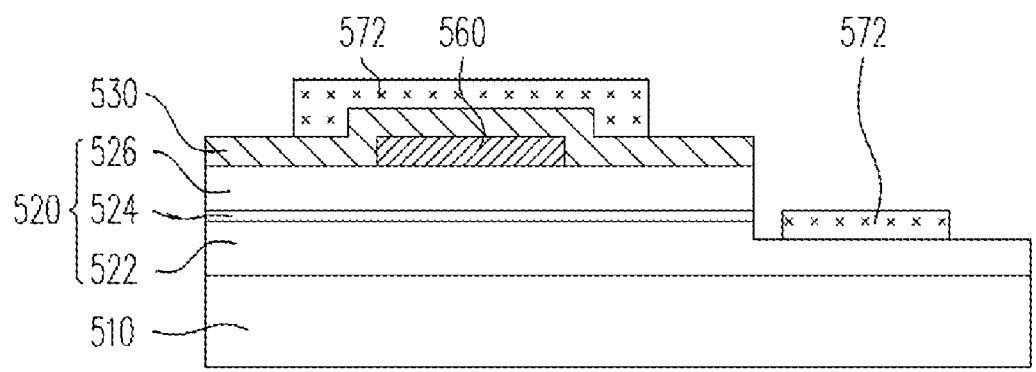

Afterwards, after the remaining second photoresist block 554 on the substrate 510 is removed, a current spreading layer 530 and a plurality of electrodes 572 are formed on the patterned dielectric layer 560 and the semiconductor device layer 520 respectively, as shown by FIGS. 14F through 14H. For example, after the second photoresist block 554 is removed, the current spreading layer 530 is formed first by a conventional PEP, as shown by FIG. 14G. Next, the plurality of electrodes 572 is formed by performing another PEP, as shown by FIG. 14H. The PEP technology is the same as that described in the foregoing embodiment and thus not repeated herein.

Figure 14I:
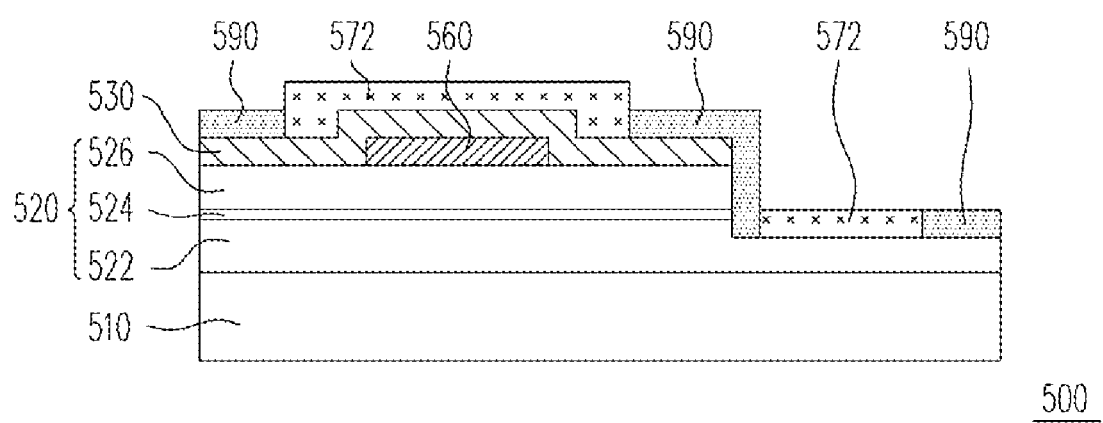

Afterwards, a passivation layer 590 is formed on the current spreading layer 530 and the semiconductor device layer 520 not covered by the electrodes 572, as shown by FIG. 14I. According to the present embodiment, the passivation layer 590 is formed, for example, by the said PEP. A description of the relevant process technology is the same as that mentioned in the foregoing embodiment and thus not repeated herein. Up to this step, the process of a light emitting diode chip 500 is generally completed.

According to the present embodiment, in the fabricating method of the light emitting diode chip 500, a half-tone mask process is performed to incorporate the process steps of the current blocking layer (i.e., the patterned dielectric layer 560) and the semiconductor device layer 520 as one mask patterning process. Next, three mask patterning processes are then performed to form the current spreading layer 530, the electrodes 572 and the passivation layer 590 respectively. Therefore, the said fabricating method of the light emitting diode chip 500 effectively reduces the fabrication cost and the fabrication time.

According to another embodiment, the process steps may be further reduced by applying again a half-tone mask process along with a process to synchronically form a plurality of components. The process steps of another mode of embodiment are described as an example in the following.

FIGS. 15A through 15F show a schematic flowchart of fabricating a light emitting diode chip according to another mode of embodiment for the fourth embodiment of the present invention. First, the process steps as shown by FIGS. 14A through 14F are performed to fabricate a light emitting diode chip 500a; a relevant description is not repeated herein.

Figure 15A:
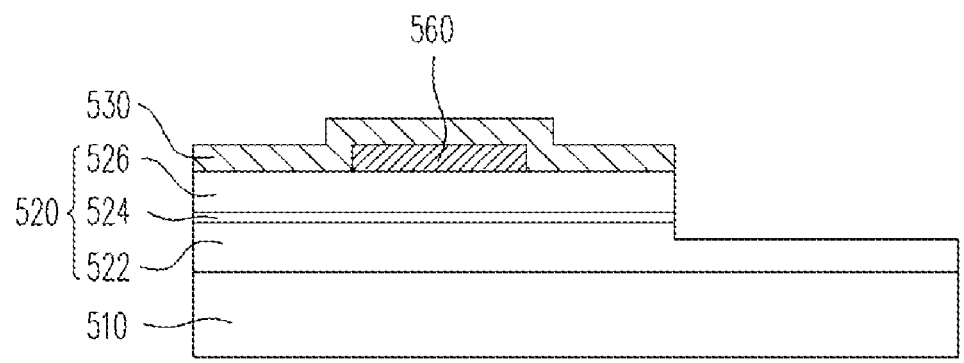
FIGS. 15A through 15F show a schematic flowchart of fabricating a light emitting diode chip according to another mode of embodiment for the fourth embodiment of the present invention.

After completing the foregoing steps, the current spreading layer 530 is formed on the patterned dielectric layer 560 and the semiconductor device layer 520, as shown by FIG. 15A. According to the present embodiment, the current spreading layer 530 is formed, for example, by a conventional PEP. A description of the relevant process is the same as that mentioned in the foregoing embodiment and thus not repeated herein.

Figure 15B:
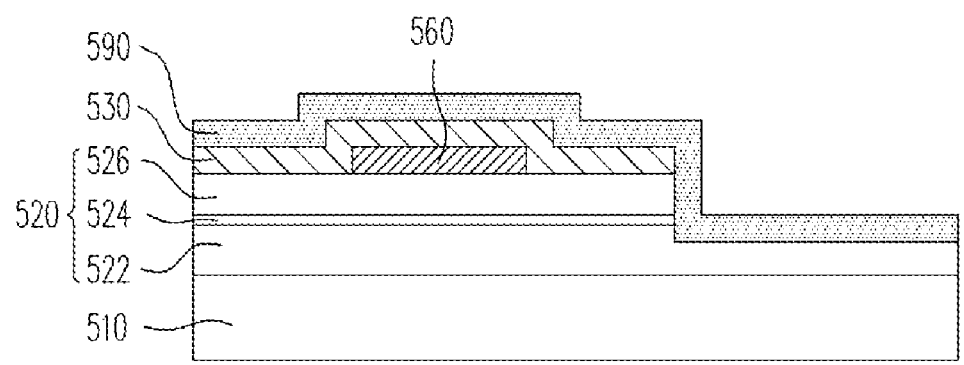
Figure 15C:
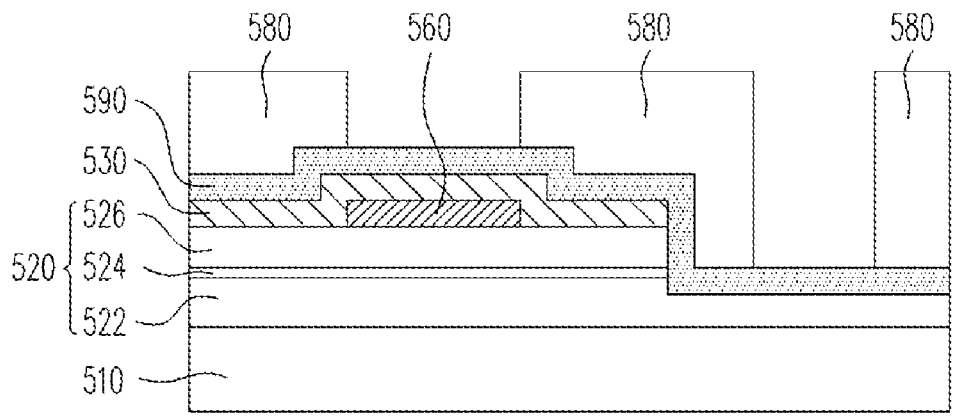

Thereafter, a passivation layer 590 is formed on the current spreading layer 530 and the semiconductor device layer 520, and a second patterned photoresist layer 580 is formed on the passivation layer 590, as shown by FIGS. 15B and 15C. According to the present embodiment, the passivation layer 590 is formed by CVD, evaporation, sputtering or other suitable processes, for example. Additionally, the second patterned photoresist layer 580 is formed a half-tone mask process, a gray-tone mask process or a multi-tone mask process, for example. A description of the relevant process is the same as the description in the aforementioned and thus not repeated herein. The present embodiment is exemplified by a half-tone mask process as an example for embodiment but not limited thereto.

Figure 15D:
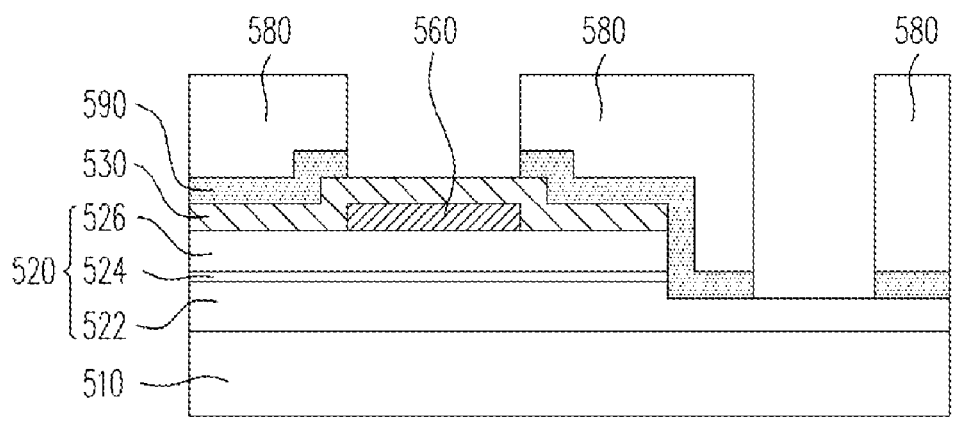

Next, the passivation layer 590 is partially removed using the second patterned photoresist layer 580 as a mask to form a patterned passivation layer 592. The patterned passivation layer 592 exposes a portion of the semiconductor device layer 520 and a portion of the current spreading layer 530, as shown by FIG. 15D. According to the present embodiment, the passivation layer 590 is removed to form the patterned passivation layer 592 by a dry etching process, a wet etching process or other suitable etching processes, for example.

Figure 15E:
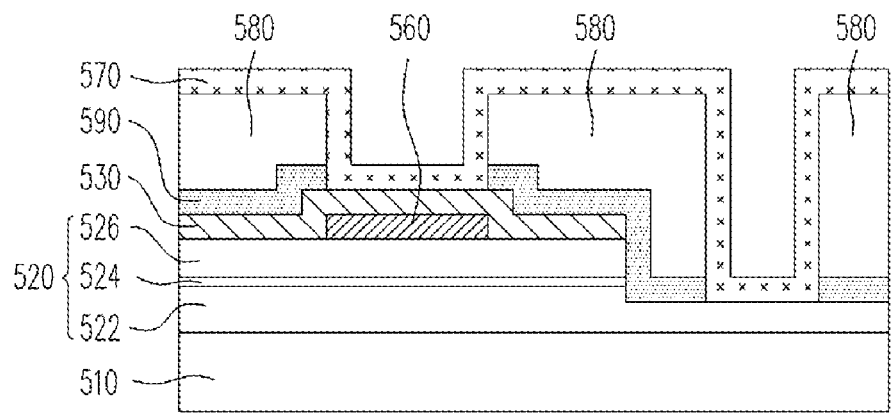
Figure 15F:
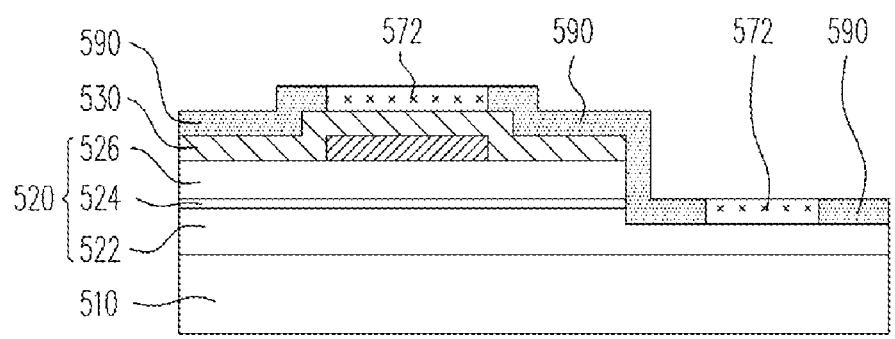

Then, after an electrode material layer 570 is formed entirely, the second patterned photoresist layer 580 is removed to strip the electrode material layer 570 thereon and form a plurality of electrodes 572. The electrodes 572 are electrically connected with the semiconductor device layer 520 and the current spreading layer 530, as shown by FIGS. 15E and 15F. According to the present embodiment, the electrode material layer 570 is formed by CVD, evaporation, sputtering or other suitable processes, for example. A description of the relevant process technology is the same as the description in the foregoing embodiment and thus not repeated herein. Furthermore, the second patterned photoresist layer 580 is removed to form the plurality of electrodes 572 by a lift-off process, for example. A description of the relevant process technology is the same as the description in the foregoing embodiment and thus not repeated herein. Up to this step, a process of a light emitting diode chip 500a in another mode of embodiment is generally completed.

According to the present embodiment, the fabricating method of the light emitting diode chip 500a is similar to that of the light emitting diode chip 500. The difference between the two lies in that the fabricating method of the light emitting diode chip 500a applies a half-tone mask photo process and a lift-off process and incorporates the process steps of the electrodes 572 and the passivation layer 590 as one PEP. Hence, to complete fabrication of the light emitting diode chip 500a only requires three mask patterning processes and in turn effectively reduces the fabrication cost and the fabrication time.

The Fifth Embodiment

Figure 16A:
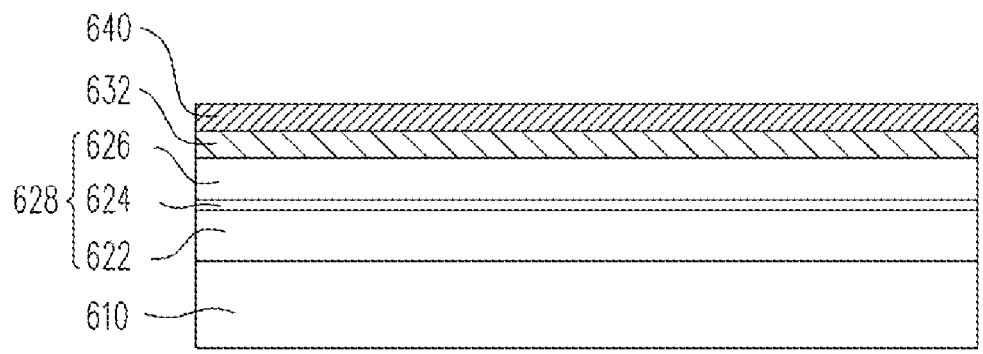
FIGS. 16A through 16F show a schematic flowchart of fabricating a light emitting diode chip according to the fifth embodiment of the present invention.

FIGS. 16A through 16F show a schematic flowchart of fabricating a light emitting diode chip according to the fifth embodiment of the present invention. First, a first type semiconductor material layer 622, a light emitting material layer 624, a second type semiconductor material layer 626, a conductive layer 632 and a dielectric layer 640 are sequentially formed on a substrate 610 to further form a semiconductor layer 628, a conductive layer 632 on the semiconductor layer 628 and a dielectric layer 640 on the conductive layer 632 respectively, as shown by FIG. 16A. The semiconductor layer 628, the conductive layer 632 and the dielectric layer 640 are formed, for example, by MOCVD, MBE, evaporation, sputtering, CVD or other suitable epitaxial growth processes to sequentially form the material layers 622, 624, 626, the conductive layer 632 and the dielectric layer 640 on the substrate 610. The present embodiment is exemplified by an MOCVD process as an example for embodiment but not limited thereto. According to the present embodiment, the substrates 610 and 210 have the same material, and the material layers 622, 624 and 626 are the same as the material layers 222, 224 and 226 in the foregoing embodiment. A relevant description thereof is thus omitted.

Figure 16B:
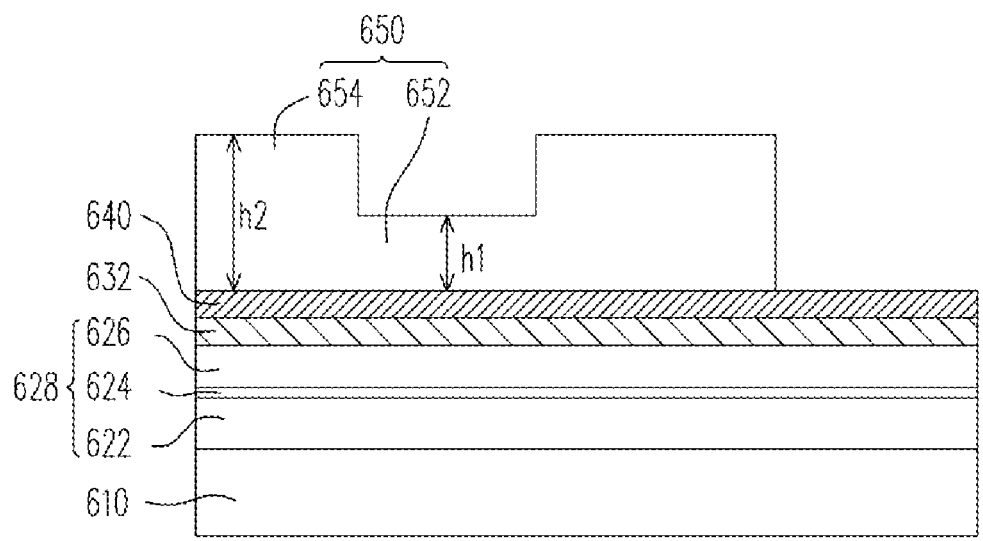

Thereafter, a first patterned photoresist layer 650 is formed on the dielectric layer 640. The first patterned photoresist layer 650 includes a first photoresist block 652 and a second photoresist block 654. A thickness h1 of the first photoresist block 652 is thinner than a thickness h2 of the second photoresist block 654, as shown by FIG. 16B. According to the present embodiment, the first patterned photoresist layer 650 is formed, for example, by a half-tone mask process, a gray-tone mask process or a multi-tone mask process. The present embodiment is exemplified by a half-tone mask process as an example for embodiment but not limited thereto. To give an example, a photoresist material layer (not shown) may be first formed entirely on the dielectric layer 640. Next, the photoresist material layer is patterned by a half-tone mask process to form the first patterned photoresist layer 650, as shown by FIG. 16B.

Figure 16C:
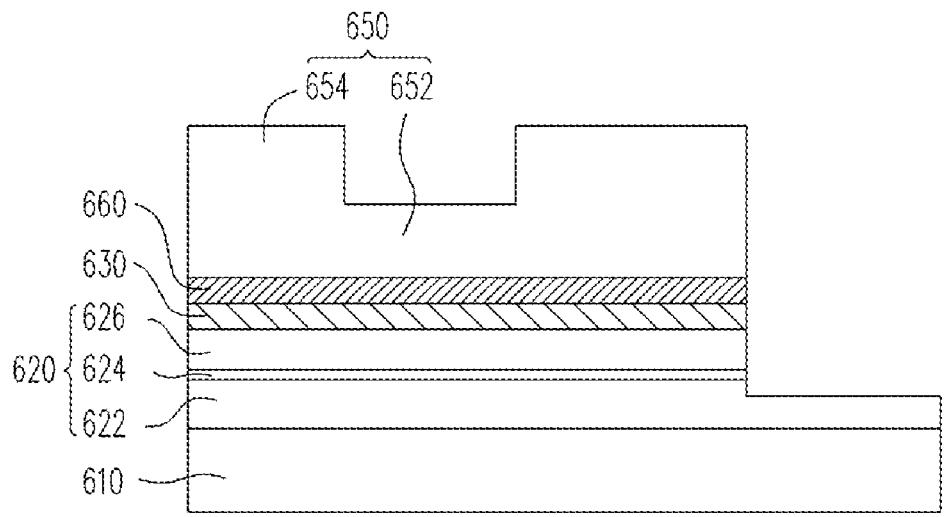

Next, a portion of the dielectric layer 640, a portion of the conductive layer 632 and a portion of the semiconductor layer 628 are removed using the first patterned photoresist layer 650 as a mask to form a patterned dielectric layer 660, a current spreading layer 630 and a semiconductor device layer 620 simultaneously, as shown by FIG. 16C. According to the present embodiment, the dielectric layer 640, the conductive layer 632 and the semiconductor layer 628 are partially removed by a dry etching process, a wet etching process or other suitable etching processes, for example. The above processes are only listed as examples, and the present embodiment is not limited thereto.

Figure 16D:
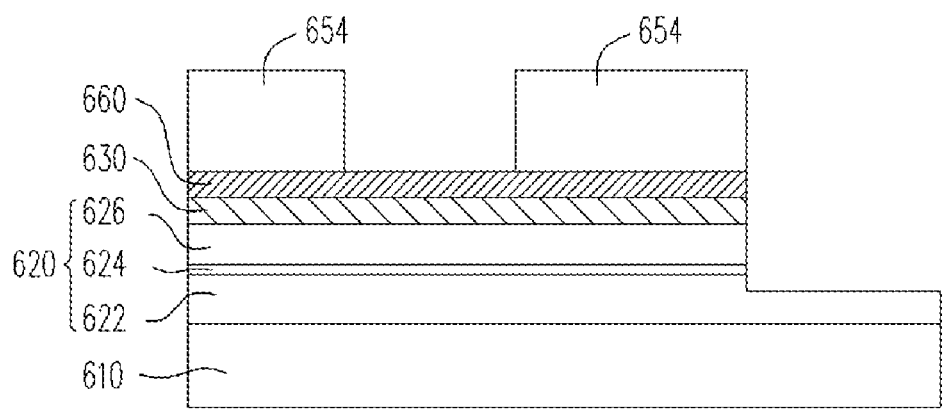

Then, a thickness of the first patterned photoresist layer 650 is reduced by a plasma ashing process until the first photoresist block 652 is removed completely, for example. The remaining second photoresist block 654 exposes a portion of the semiconductor device layer 620 and a portion of the patterned dielectric layer 660, as shown by FIG. 16D.

Figure 16E:
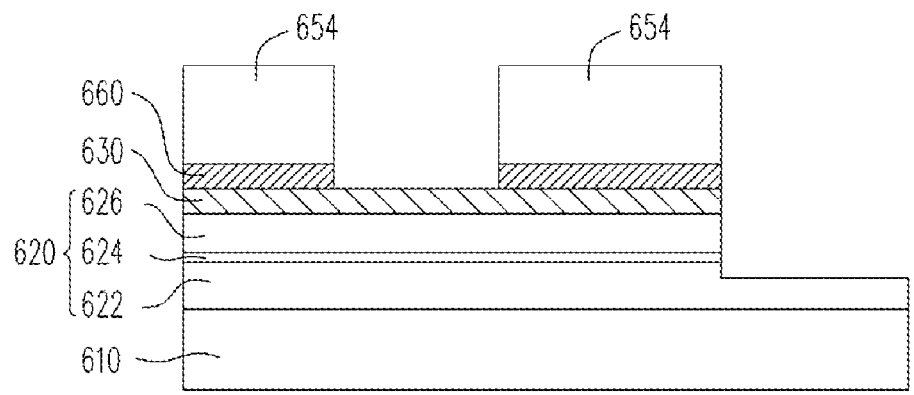

Afterwards, the patterned dielectric layer 660 is partially removed using the remaining second photoresist block 654 as a mask to partially expose the current spreading layer 630, as shown by FIG. 16E. According to the present embodiment, the patterned dielectric layer 660 is removed by a dry etching process, a wet etching process and other suitable etching processes, for example. A relevant description thereof is the same as the description in the foregoing embodiment and thus not repeated herein.

Figure 16F:
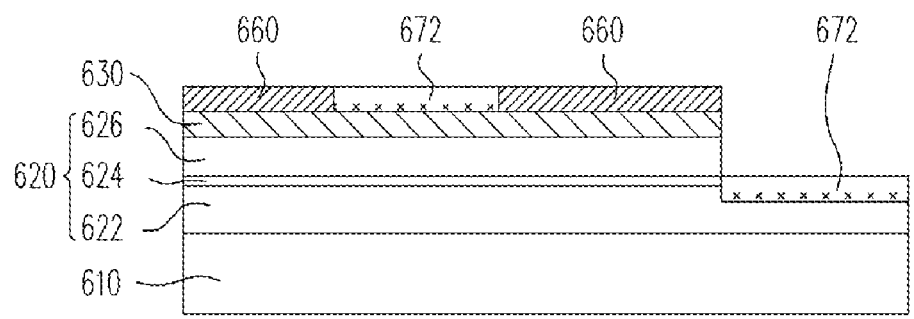

Then, an electrode material layer (not shown) is formed entirely, and the remaining second photoresist block 654 is removed to strip the electrode material layer 670 thereon and form a plurality of electrodes 672. The electrodes 672 are electrically connected with the semiconductor device layer 620 and the current spreading layer 630, as shown by FIG. 16F. According to the present embodiment, the electrode material layer 670 is formed by CVD, evaporation, sputtering or other suitable processes, for example. A description of the relevant process technology is the same as the description in the foregoing embodiment and thus not repeated herein. Furthermore, the second photoresist block 654 is removed to form the plurality of electrodes 672 by a lift-off process, for example. A description of the relevant process technology is the same as the description in the foregoing embodiment and thus not repeated herein. Up to this step, the process of a light emitting diode chip 600 is generally completed.

According to the present embodiment, the light emitting diode chip 600 is fabricated by a process coordinated with a half-tone mask process and a lift-off process to form a plurality of components synchronically, such as a semiconductor device layer, a current spreading layer, a passivation layer, a current blocking layer and electrodes. Hence, the process steps of the light emitting diode chip 600 require only one mask patterning process to complete the fabrication and thereby greatly reduce the fabrication time and the fabrication cost.

The Sixth Embodiment

Figure 17A:
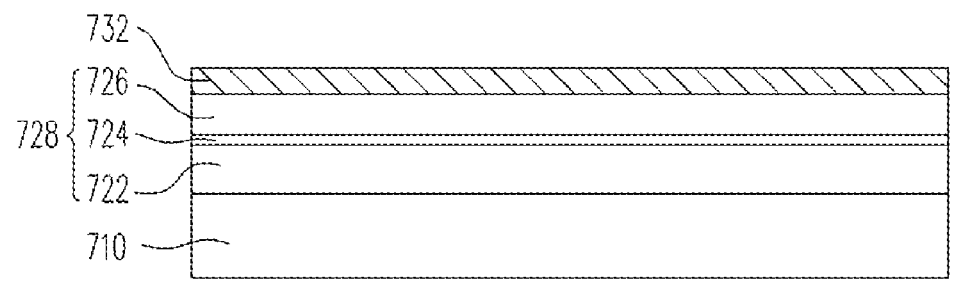
FIGS. 17A through 17F show a schematic flowchart of fabricating a light emitting diode chip according to the sixth embodiment of the present invention.

FIGS. 17A through 17F show a schematic flowchart of fabricating a light emitting diode chip according to the sixth embodiment of the present invention. First, a first type semiconductor material layer 722, a light emitting material layer 724, a second type semiconductor material layer 726 and a conductive layer 732 are sequentially formed on a substrate 710 to further form a semiconductor layer 728 and a conductive layer 732 on the semiconductor layer 728 respectively, as shown by FIG. 17A. The semiconductor layer 728 and the conductive layer 732 are formed, for example, by MOCVD, MBE, evaporation, sputtering or other suitable epitaxial growth processes to sequentially form the material layers 722, 724, 726 and the conductive layer 732 on the substrate 710. The present embodiment is exemplified by an MOCVD process as an example for embodiment but not limited thereto. According to the present embodiment, the substrates 710 and 210 have the same material, and the material layers 722, 724 and 726 are the same as the material layers 222, 224 and 226 in the foregoing embodiment. A relevant description is thus omitted.

Figure 17B:
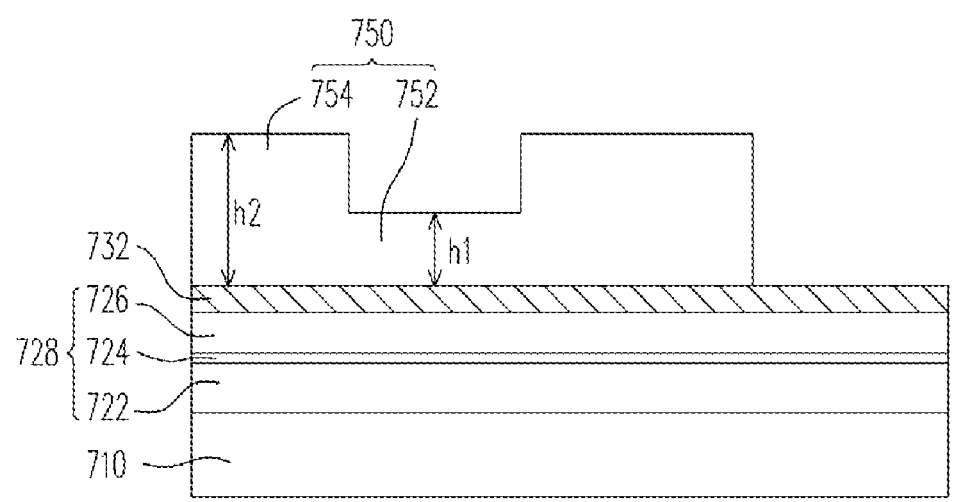

Thereafter, a first patterned photoresist layer 750 is formed on the conductive layer 732. The first patterned photoresist layer 750 includes a first photoresist block 752 and a second photoresist block 754. A thickness h1 of the first photoresist block 752 is thinner than a thickness h2 of the second photoresist block 754, as shown by FIG. 17B. According to the present embodiment, the first patterned photoresist layer 750 is formed, for example, by a half-tone mask process, a gray-tone mask process or a multi-tone mask process. The present embodiment is exemplified by a half-tone mask process as an example for embodiment but not limited thereto. For example, a photoresist material layer (not shown) may be first formed entirely on the conductive layer 732. Next, the photoresist material layer is patterned by a half-tone mask process to form the first patterned photoresist layer 750, as shown by FIG. 17B.

Figure 17C:
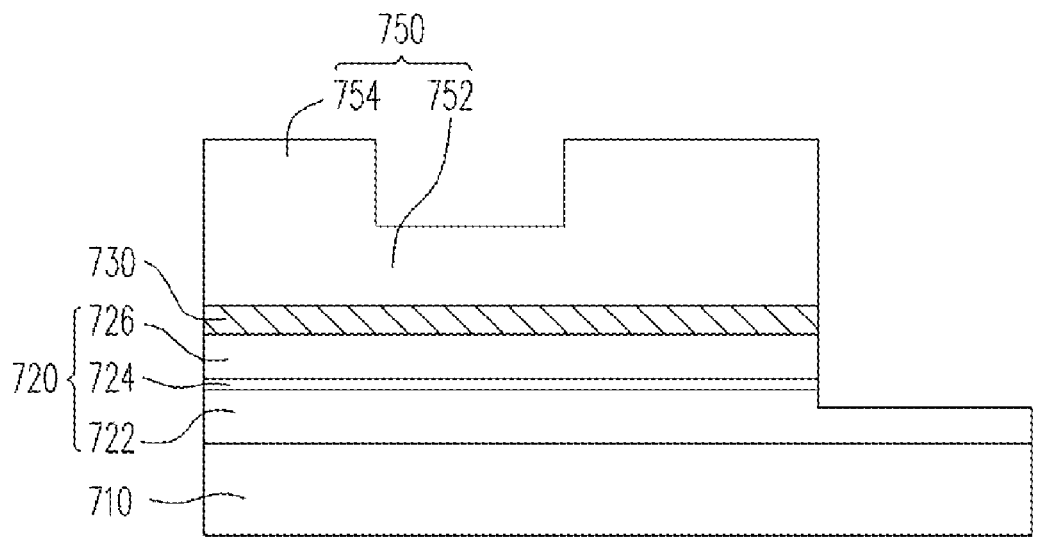

Then, a portion of the conductive layer 732 and a portion of the semiconductor layer 728 are removed using the first patterned photoresist layer 750 as a mask to form a current spreading layer 730 and a semiconductor device layer 720 simultaneously, as shown by FIG. 17C. According to the present embodiment, the conductive layer 732 and the semiconductor layer 728 are removed by a dry etching process, a wet etching process or other suitable etching processes, for example. The above processes are only listed as examples, and the present embodiment is not limited thereto.

Figure 17D:
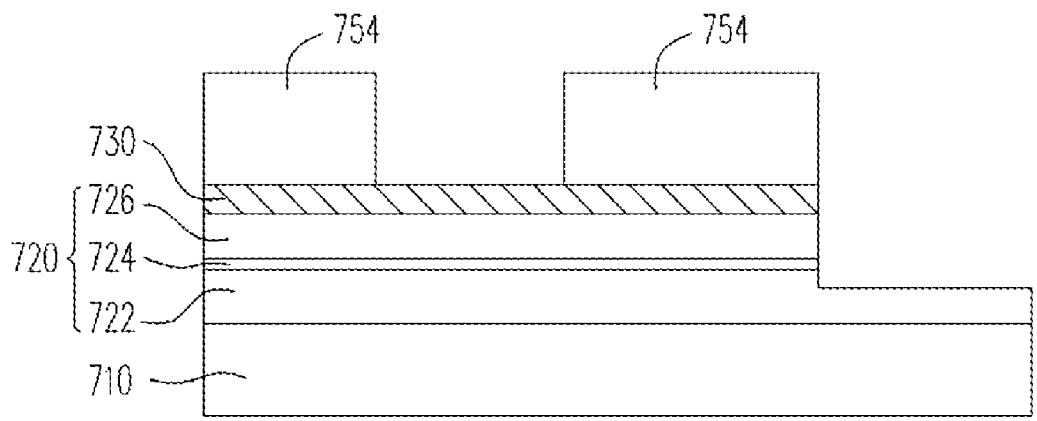

Then, a thickness of the first patterned photoresist layer 750 is reduced by a plasma ashing process until the first photoresist block 752 is removed completely. The remaining second photoresist block 754 exposes a portion of the semiconductor device layer 720 and a portion of the current spreading layer 730, as shown by FIG. 17D.

Figure 17E:
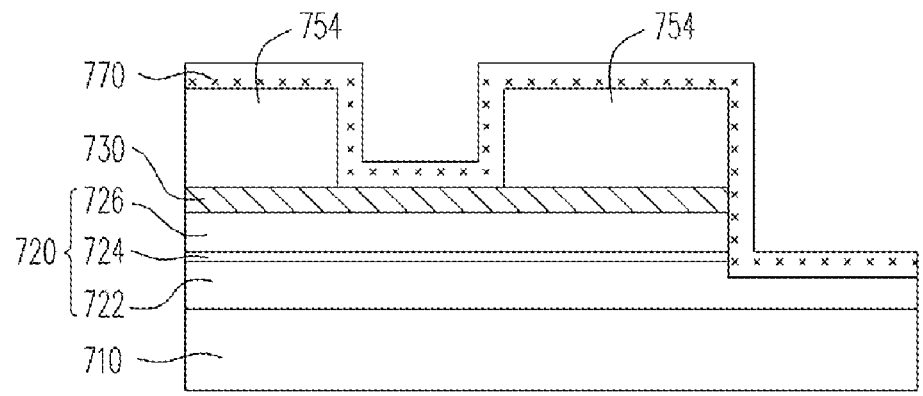
Figure 17F:
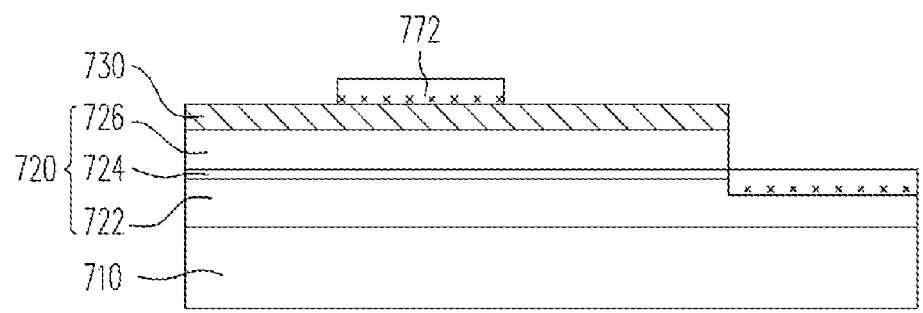

Then, an electrode material layer 770 is formed entirely, and the remaining second photoresist block 754 is removed to strip the electrode material layer 770 thereon and form a plurality of electrodes 772. The electrodes 772 are electrically connected with the semiconductor device layer 720 and the current spreading layer 730, as shown by FIGS. 17E and 17F. According to the present embodiment, the electrode material layer 770 is formed by CVD, evaporation, sputtering or other suitable processes, for example. A description of the relevant process technology is the same as the description in the foregoing embodiment and thus not repeated herein. Furthermore, the second photoresist block 754 is removed to form the plurality of electrodes 772 by a lift-off process, for example. A description of the relevant process technology is the same as the description in the foregoing embodiment and thus not repeated herein. Up to this step, the process of a light emitting diode chip 700 is generally completed.

According to the present embodiment, the light emitting diode chip 700 is fabricated by a process coordinated with a half-tone mask process and a lift-off process to form a plurality of components synchronically, such as a semiconductor device layer, a current spreading layer, a passivation layer, a current blocking layer and electrodes. Hence, the process steps of the light emitting diode chip 700 require only one mask patterning process to complete the fabrication and thus greatly reduce the fabrication time and the fabrication cost.

The Seventh Embodiment

Figure 18A:
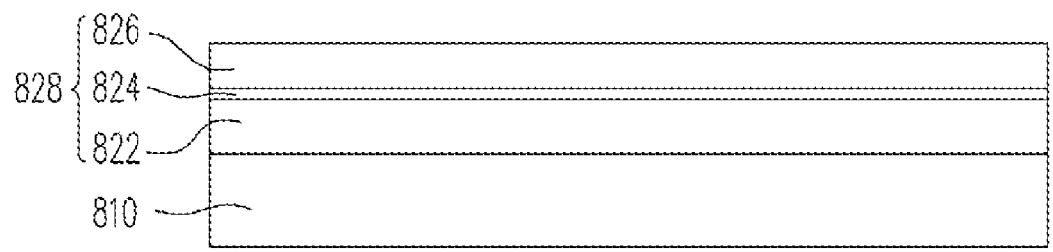
FIGS. 18A through 18H show a flowchart of fabricating a light emitting diode chip according to the seventh embodiment of the present invention.

FIGS. 18A through 18H show a flowchart of fabricating a light emitting diode chip according to the seventh embodiment of the present invention. First, a first type semiconductor material layer 822, a light emitting material layer 824, a second type semiconductor material layer 826 and a dielectric layer 840 are sequentially formed on a substrate 810 to further form a semiconductor layer 828, as shown by FIG. 18A. The semiconductor layer 828 is formed, for example, by MOCVD, MBE, evaporation, sputtering or other suitable epitaxial growth processes to sequentially form the material layers 822, 824 and 826 on the substrate 810. The present embodiment is exemplified by an MOCVD process as an example for embodiment but not limited thereto. According to the present embodiment, the substrates 810 and 210 have the same material, and the material layers 822, 824 and 826 are the same as the material layers 222, 224 and 226 in the foregoing embodiment. A relevant description thereof is thus omitted.

Figure 18B:
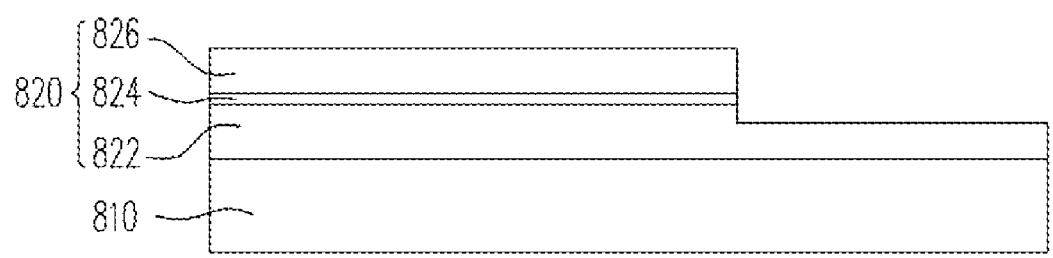

Afterwards, the semiconductor layer 828 is patterned to form a semiconductor device layer 820, as shown by FIG. 18B. According to the present embodiment, the semiconductor device layer 820 is formed, for example, by a conventional PEP. A description of the relevant process technology is the same as the description in the foregoing embodiment and thus not repeated herein.

Figure 18C:
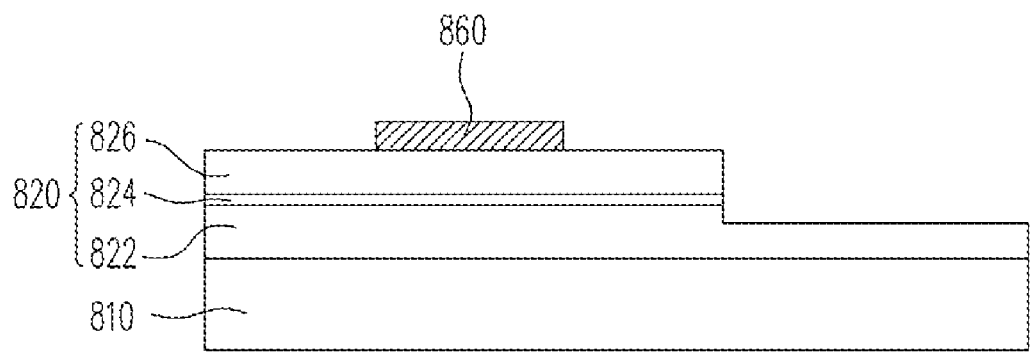

Afterwards, a patterned dielectric layer 860 is formed on the substrate 810. The patterned dielectric layer 860 is disposed on the semiconductor device layer 820, as shown by FIG. 18C. According to the present embodiment, the patterned dielectric layer 860 is formed, for example, by a conventional PEP. A description of the relevant process technology is the same as the description in the foregoing embodiment and thus not repeated herein.

Figure 18D:
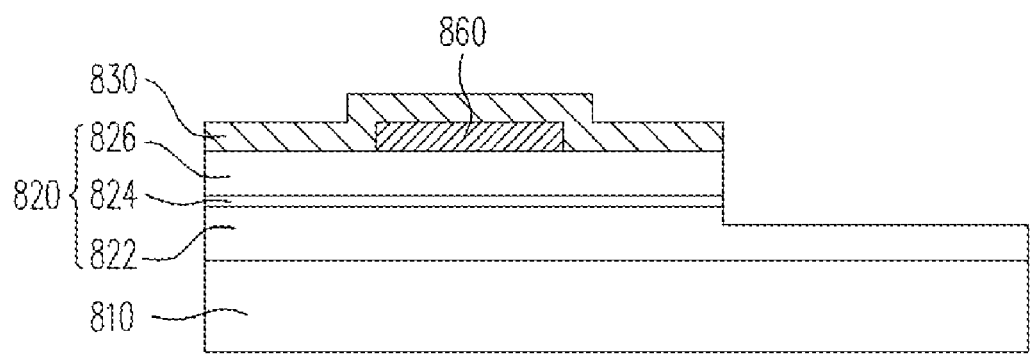

Next, a current spreading layer 830 is formed on the substrate 810. The current spreading layer 830 is disposed on the semiconductor device layer 820 to cover the patterned dielectric layer 860, as shown by FIG. 18D. The current spreading layer 830 is formed, for example, by a conventional PEP. A description of the relevant process technology is the same as the description in the foregoing embodiment and thus not repeated herein.

Figure 18E:
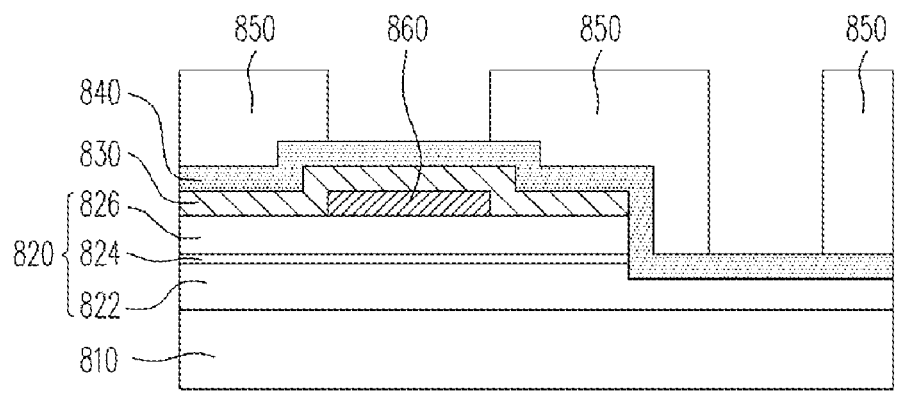

Then, a dielectric layer 840 is formed on the semiconductor device layer 820 and the current spreading layer 830, and a patterned photoresist layer 850 is formed on the dielectric layer 840, as shown by FIG. 18E. According to the present embodiment, the dielectric layer 840 is formed, for example, by a CVD process, but the present embodiment is not limited thereto. Other suitable processes may also be used, such as a screen printing process, a coating process, an inkjet printing process or an energy source treatment process. The patterned photoresist layer 850 is formed, for example, by a traditional photo mask process, a half-tone mask process, a gray-tone mask process or a multi-tone mask process. The present embodiment is exemplified by a traditional photo mask process as an example for embodiment but not limited thereto.

Figure 18F:
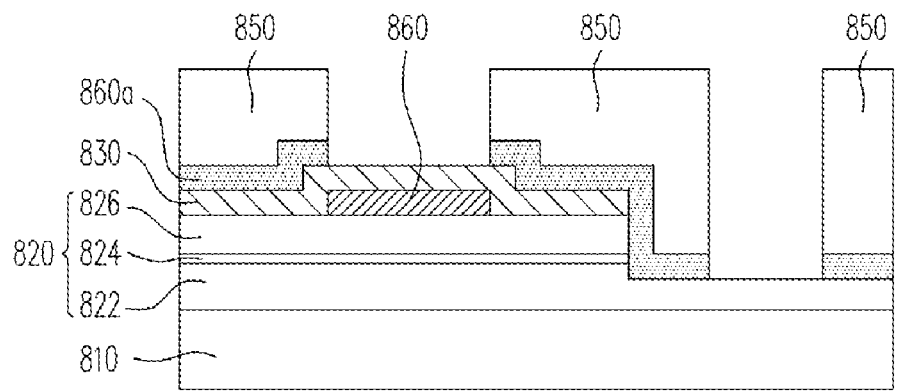

Then, the dielectric layer 840 is partially removed using the patterned photoresist layer 850 as a mask to form a patterned dielectric layer 860a. The patterned dielectric layer 860a exposes a portion of the semiconductor device layer 820 and a portion of the current spreading layer 830, as shown by FIG. 18F. According to the present embodiment, the dielectric layer 840 is removed in the same way as described in the foregoing embodiment and thus not repeated herein.

Figure 18G:
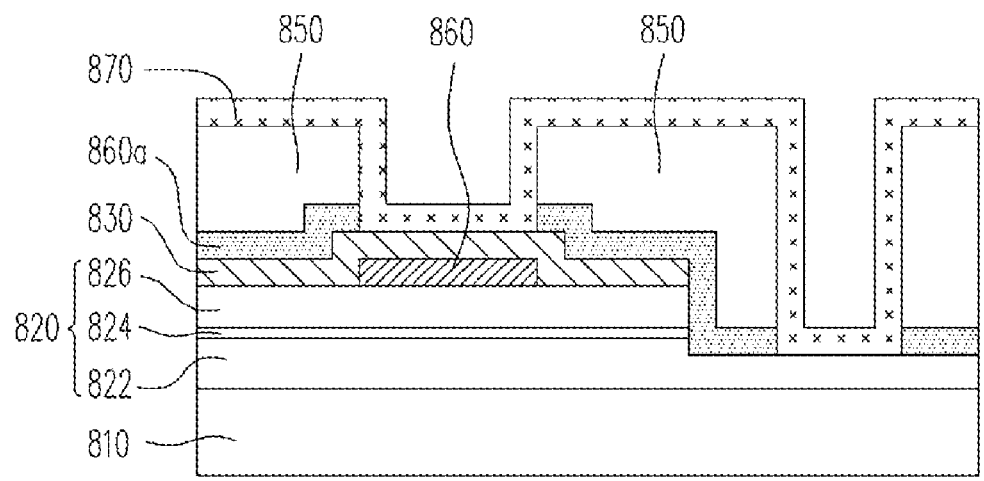
Figure 18H:
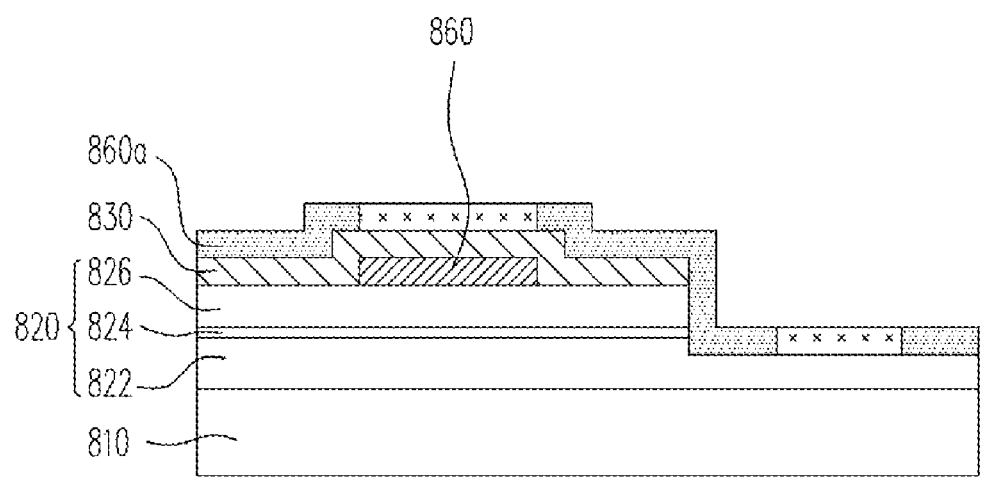

Then, an electrode material layer 870 is formed entirely, and the patterned photoresist layer 850 is removed to strip the electrode material layer 870 thereon and form a plurality of electrodes 872. The electrodes 872 are electrically connected with the semiconductor device layer 820 and the current spreading layer 830, as shown by FIGS. 18G and 18H. According to the present embodiment, the electrode material layer 870 is formed by CVD, evaporation, sputtering or other suitable processes, for example. A description of the relevant process technology is the same as the description in the foregoing embodiment and thus not repeated herein. Furthermore, the patterned photoresist layer 850 is removed to form the electrodes 872 by a lift-off process, for example. A description of the relevant process technology is the same as the description in the foregoing embodiment and thus not repeated herein. Up to this step, the process of a light emitting diode chip 800 is generally completed.

According to the present embodiment, the light emitting diode chip 800 first applies three PEPs to fabricate the semiconductor device layer 820, the patterned dielectric layer 860 (or termed as the current blocking layer) and the current spreading layer 830. Afterwards, a half-tone mask process and a lift-off process are performed to be combined with the process steps of the dielectric layer 840 (or termed as the passivation layer) and the electrodes 872 such that the process steps of the light emitting diode chip 800 only requires four PEPs.

In addition, if the fabrication of some layers is adjusted to combined, one more PEP is further reduced from the process steps of the light emitting diode chip 800. A description of the relevant mode of embodiment is provided below.

FIGS. 19A through 19F show a flowchart of fabricating a light emitting diode chip according to another mode of embodiment for the seventh embodiment of the present invention. First, a light emitting diode chip 800a is fabricated by the process steps as shown by FIG. 18A. A relevant description thereof is not repeated herein.

Figure 19A:
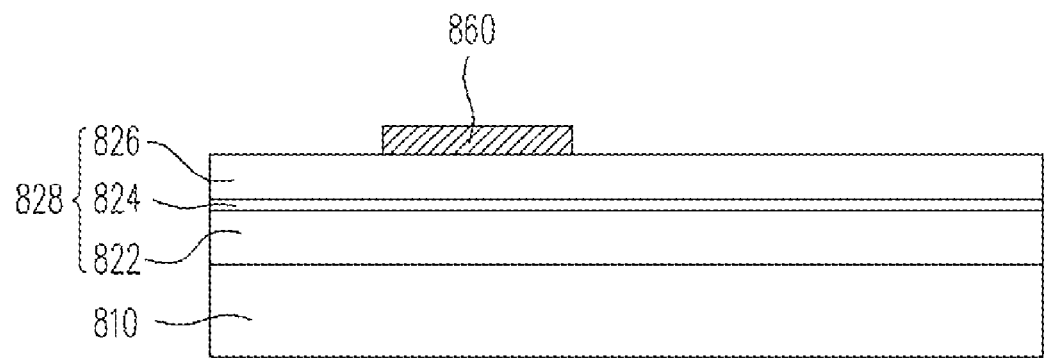
FIGS. 19A through 19F show a flowchart of fabricating a light emitting diode chip according to another mode of embodiment for the seventh embodiment of the present invention.

Next, a patterned dielectric layer 860 is formed on the semiconductor layer 828, as shown by FIG. 19A. According to the present embodiment, the patterned dielectric layer 860 is formed, for example, by a conventional PEP. A description of the relevant process technology is the same as the description in the foregoing embodiment and thus not repeated herein.

Figure 19B:
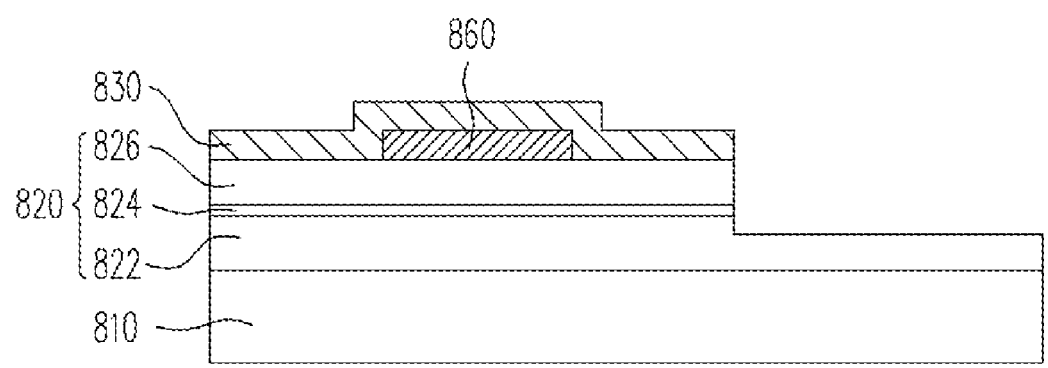
Figure 19C:
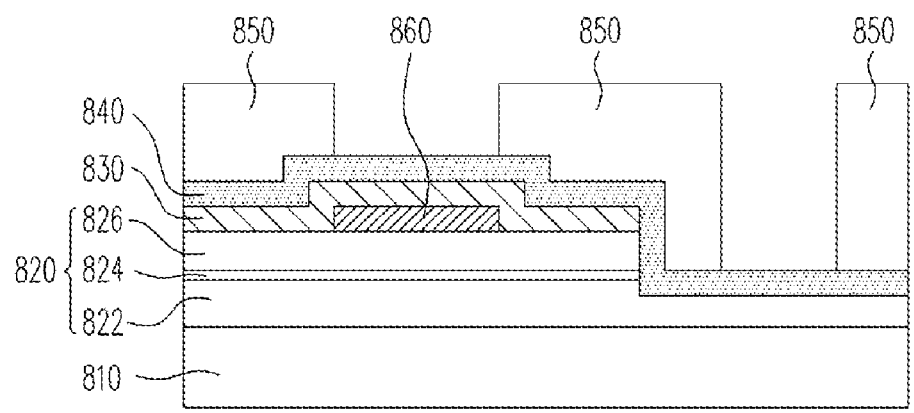
Figure 19D:
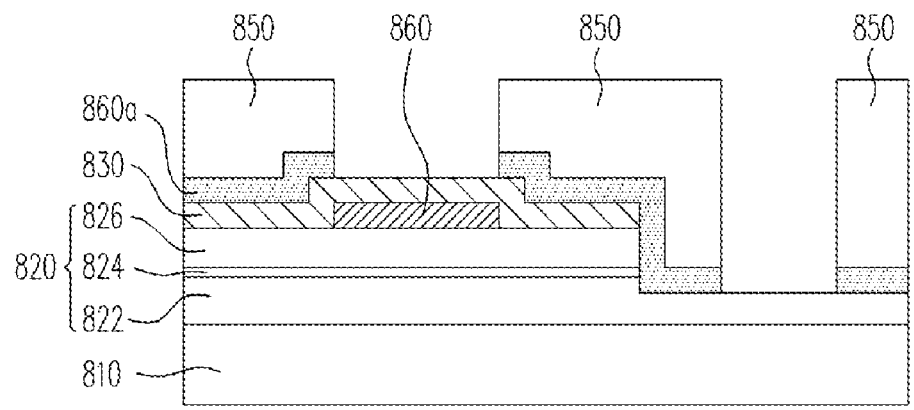
Figure 19E:
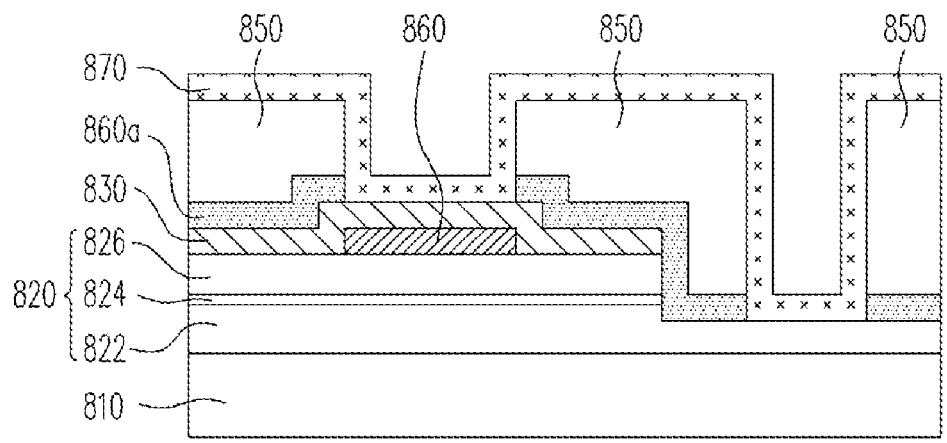
Figure 19F:
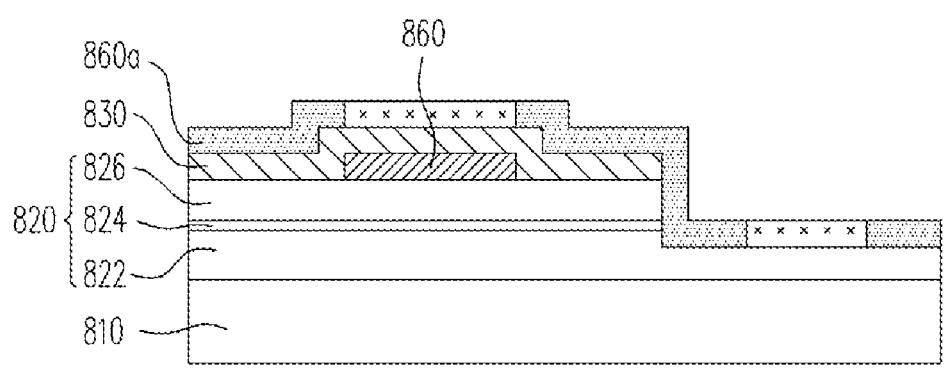

Thereafter, a conductive layer (not shown) is formed on the semiconductor layer 828 to cover the patterned dielectric layer 860. Then, the conductive layer and the semiconductor layer 832 are simultaneously patterned to form the current spreading layer 830 and the semiconductor device layer 820, as shown by FIG. 19B. According to the present embodiment, the conductive layer 860 is formed by CVD, evaporation, sputtering or other suitable processes, for example. Moreover, the conductive layer and the semiconductor layer 832 are patterned, for example, by a conventional PEP. A description of the relevant process technology is the same as the description in the foregoing embodiment and thus not repeated herein.

Next, referring to FIGS. 19B through 19F in sequence, since the fabricating method shown by FIGS. 19B through 19F is similar to that shown by FIGS. 18D through 18H, a relevant description of the process is not repeated.

According to the present embodiment, a traditional photo mask process and a lift-off process are adopted and coordinated with only one mask patterning process to form the current spreading layer 830 and the semiconductor device layer 820. Hence, the light emitting diode chip 800a may require only three PEPs to fabricate and thereby reduces the fabrication cost and the fabrication time.

The Eighth Embodiment

Figure 20A:
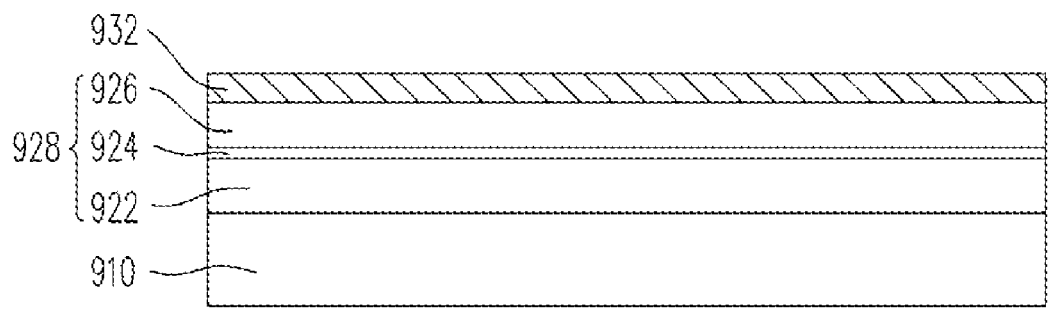
FIGS. 20A through 20D show a flowchart of fabricating a light emitting diode chip according to the eighth embodiment of the present invention.

FIGS. 20A through 20D show a flowchart of fabricating a light emitting diode chip according to the eighth embodiment of the present invention. First, a first type semiconductor material layer 922, a light emitting material layer 924, a second type semiconductor material layer 926 and a conductive layer 932 are sequentially formed on a substrate 910 to further form a semiconductor layer 928 and a conductive layer 932 on the semiconductor layer 928 respectively, as shown by FIG. 20A. The semiconductor layer 928 and the conductive layer 932 are formed, for example, by MOCVD, MBE, evaporation, sputtering or other suitable epitaxial growth processes to sequentially form the material layers 922, 924, 926 and the conductive layer 932 on the substrate 910. The present embodiment is exemplified by an MOCVD process as an example for embodiment but not limited thereto. According to the present embodiment, the substrates 910 and 210 have the same material, and the material layers 922, 924 and 926 are the same as the material layers 222, 224 and 226 in the foregoing embodiment. A relevant description thereof is thus not repeated herein.

Figure 20B:
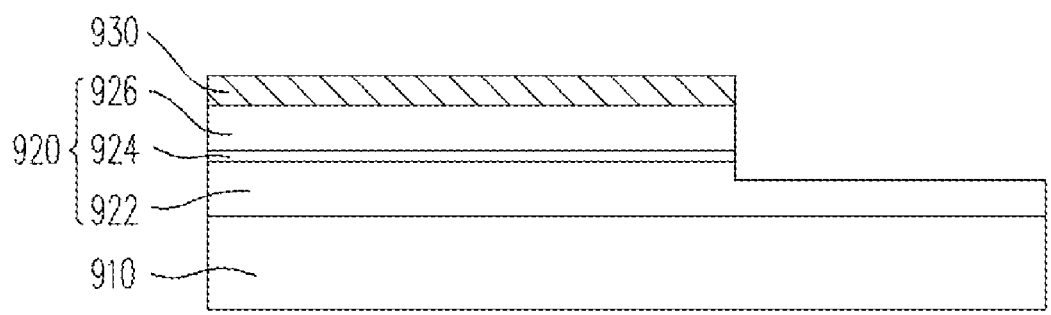

Afterwards, the semiconductor layer 928 and the conductive layer 932 are patterned to form a semiconductor device layer 920 and a current spreading layer 930 simultaneously, as shown by FIG. 20B. According to the present embodiment, the semiconductor layer 928 and the conductive layer 932 are patterned, for example, by a conventional PEP. A description of the relevant process technology is the same as the description in the foregoing embodiment and thus not repeated herein.

Figure 20C:
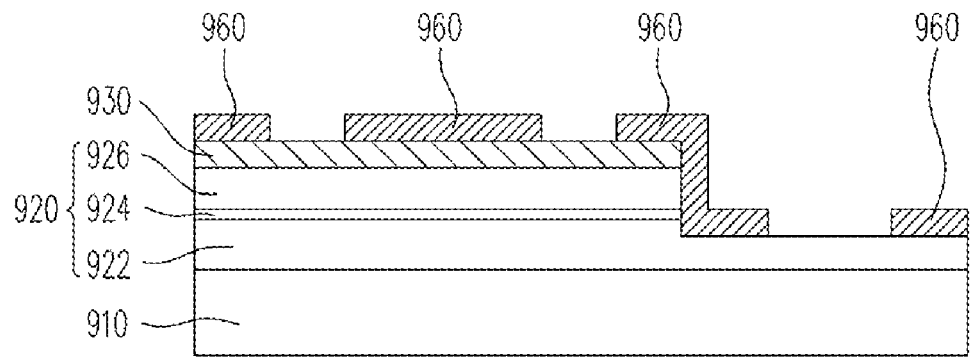

Then, a patterned dielectric layer 960 is formed on the current spreading layer 930 and the semiconductor device layer 920, as shown by FIG. 20C. According to the present embodiment, the patterned dielectric layer 960 is formed, for example, by a conventional PEP. A description of the relevant process technology is the same as the description in the foregoing embodiment and thus not repeated herein.

Figure 20D:
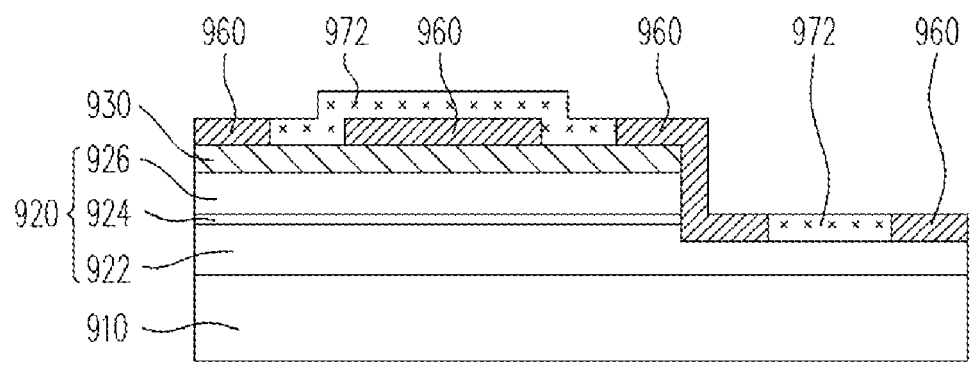

Thereafter, a plurality of electrodes 972 is formed on the current spreading layer 930 and the semiconductor device layer 920, as shown by FIG. 20D. According to the present embodiment, the electrodes 972 are formed, for example, by a conventional PEP. A description of the relevant process technology is the same as the description in the foregoing embodiment and thus not repeated herein. Up to this step, the process of a light emitting diode chip 900 is generally completed.

According to the present embodiment, in the process steps of the light emitting diode chip 900, a PEP is performed to form the semiconductor device layer 920 and the current spreading layer 930 simultaneously, and then two PEPs are performed to fabricate the patterned dielectric layer 960 and the electrodes 972 respectively. The patterned dielectric layer 960 covered by the electrodes 972 is defined as the current blocking layer, while the patterned dielectric layer 960 not covered by the electrodes 972 is defined as the passivation layer. Therefore, only three PEPs are required to complete the fabrication of the light emitting diode chip 900 and thereby reduces the fabrication time and the fabrication cost.

Figure 21A:
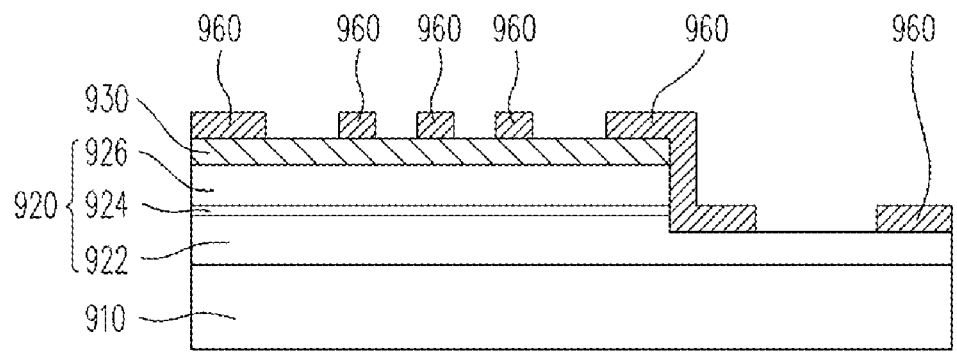
Figure 21B:
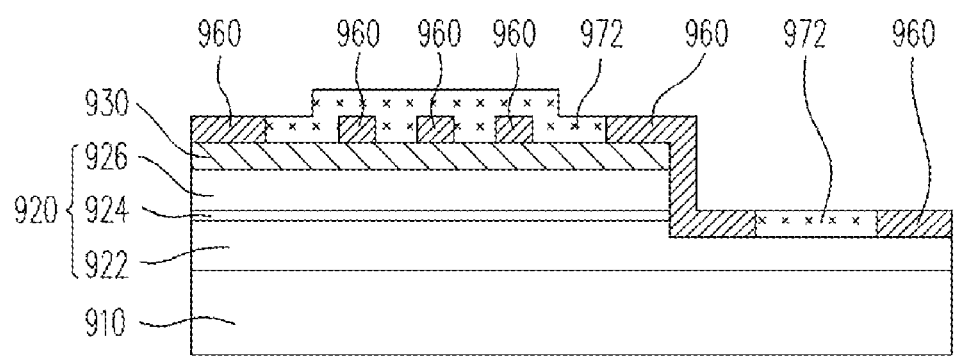

According to another embodiment, the patterned dielectric layer 960 has another mask pattern design, as shown by FIG. 21A. After completing the process steps as shown by FIGS. 20C and 20D, the light emitting diode chip 900 is formed as a light emitting diode chip 900a, as shown by FIG. 21B. A description of the relevant process technology is the same as the description in the foregoing embodiment and thus not repeated herein.

The Ninth Embodiment

Figure 22A:
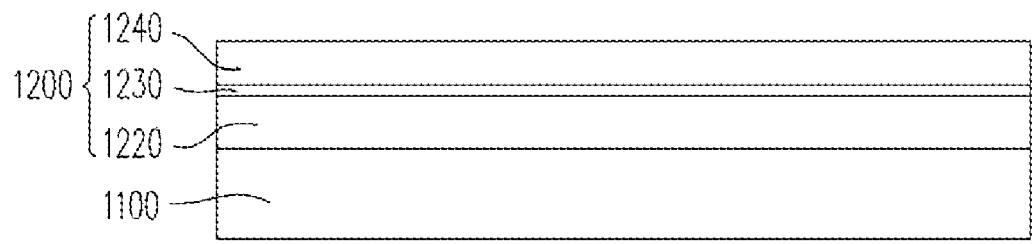
FIGS. 22A through 22G show a flowchart of fabricating a semiconductor device layer.

FIGS. 22A through 22E show a flowchart of fabricating a semiconductor device layer. First, a semiconductor layer 1200 is formed on a substrate 1100. The semiconductor layer 1200 includes a first type semiconductor material layer 1220, a light emitting material layer 1230 and a second type semiconductor material layer 1240, as shown by FIG. 22A. The semiconductor layer 1200 consists of the material layers as described in the first through eighth embodiments, for example. Relevant details on the materials and processes are the same as those mentioned in the foregoing embodiments.

Figure 22B:
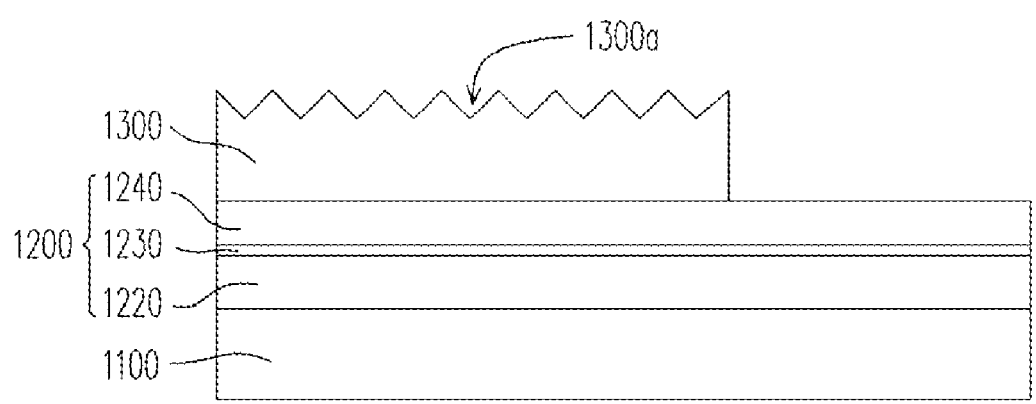

Afterwards, a patterned photoresist layer 1300 is formed on the semiconductor layer 1200, as shown by FIG. 22B. According to the present embodiment, a gray-tone mask process is performed to form the patterned photoresist layer 1300 such that a surface 1300a thereof has irregular shapes, as shown by FIG. 22B.

Figure 22C:
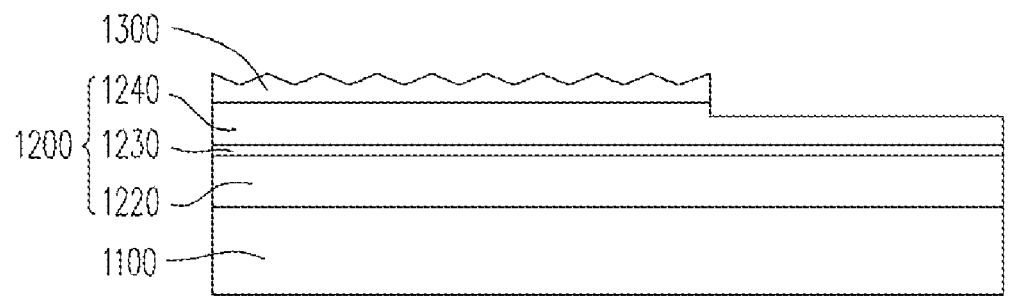
Figure 22D:
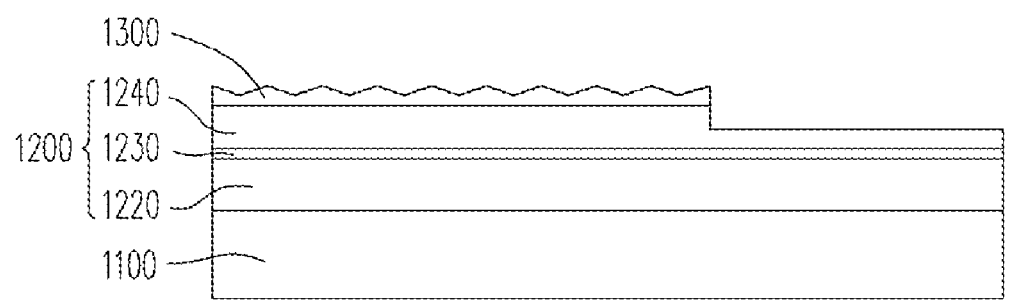
Figure 22E:

Afterwards, a plurality of etching processes is performed continuously until a thickness of the patterned photoresist layer 1300 is etched away completely so that a semiconductor device layer 1400 is formed, as shown by FIGS. 22C through 22E. According to the present embodiment, the etching process is, for example, a dry etching process, a wet etching process or other suitable etching processes. All of the foregoing processes are merely listed as examples and not meant to limit the present embodiment.

It should be noted that since the surface 1300a of the patterned photoresist layer 1300 has irregular shapes, after several etching processes, a surface shape of the second type semiconductor layer 1240 in the semiconductor device layer 1400 is rendered conformal with the surface shape of the patterned photoresist layer 1300, as shown by FIG. 22E.

Figure 22F:
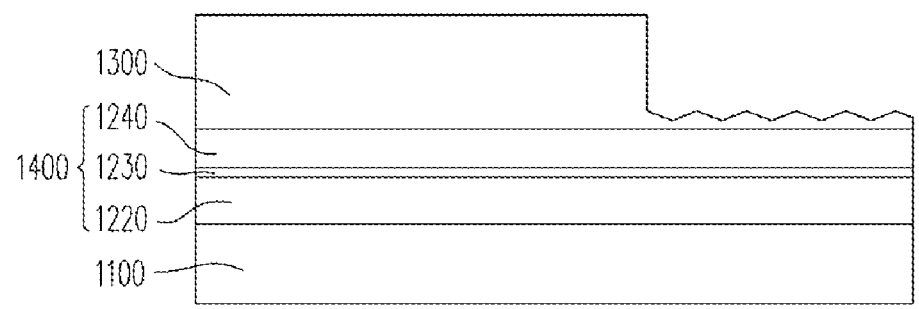
Figure 22G:
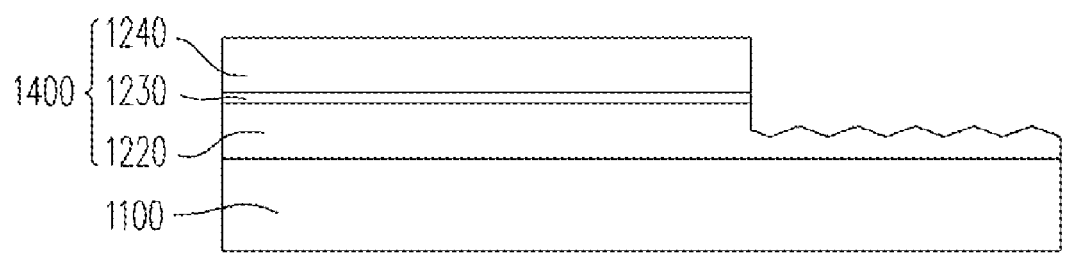

Certainly, as the structure of the patterned photoresist layer 1300 differs, as shown by the FIG. 22F, the surface of the first type semiconductor layer 1220 of the semiconductor device layer 1400 may also form irregular shapes, as shown by FIG. 22G. It should be noted that the process steps of the semiconductor device layer 1400 may also be applied to the first through the eighth embodiments.

The Tenth Embodiment

Figure 23A:
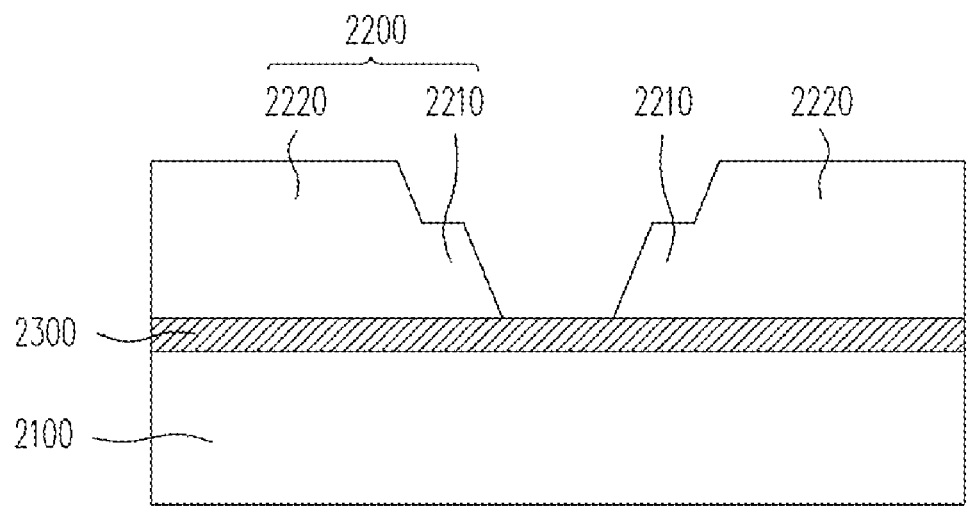
FIGS. 23A through 23D show a schematic flowchart of a mask process.
Figure 23B:
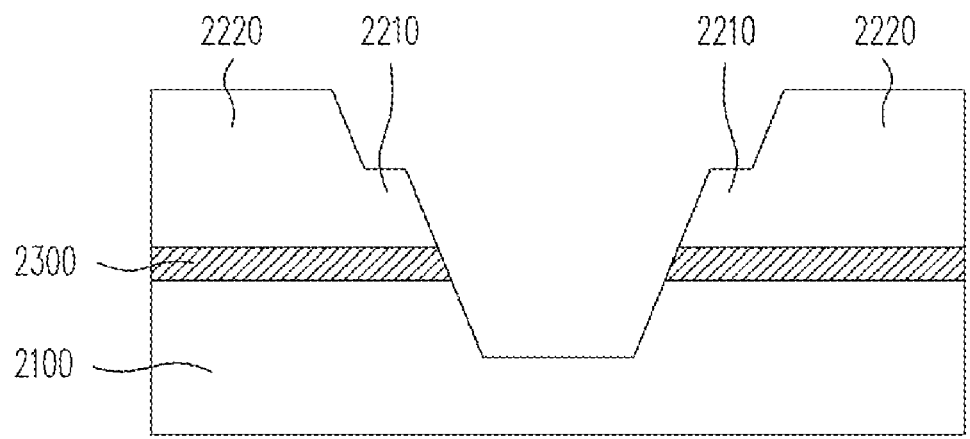
Figure 23C:
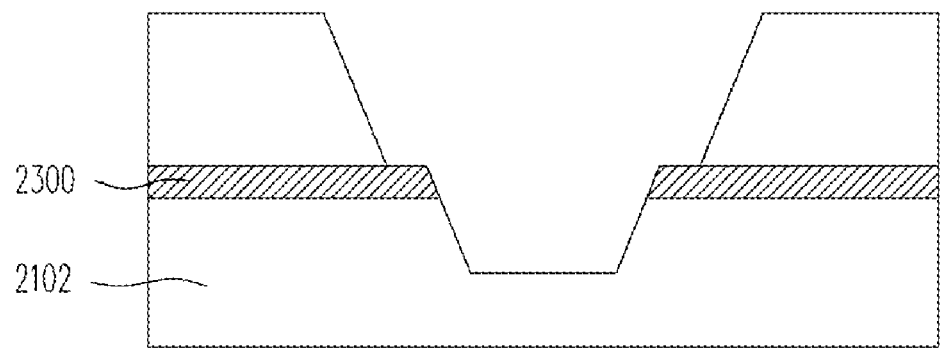

FIGS. 23A through 23C show a schematic flowchart of a mask process. First, a first patterned photoresist layer 2200 is formed on a substrate 2100. The first patterned photoresist layer 2200 includes a first photoresist block 2210 and a second photoresist block 2220. A thickness h1 of the first photoresist block 2210 is thinner than a thickness h2 of the second photoresist block 2220, as shown by FIG. 23A. According to the present embodiment, the first patterned photoresist layer 2200 is formed, for example, by a half-tone mask process, a gray-tone mask process or a multi-tone mask process. The present embodiment is exemplified by a half-tone mask process as an example for embodiment but is not limited thereto. In addition, a film 2300 is further disposed between the substrate 2100 and the first patterned photoresist layer 2200. The film 2300 may be a conductive layer or a dielectric layer.

Afterwards, a surface of the substrate 2100 is partially removed using the first patterned photoresist layer 2200 as a mask to form a first patterned substrate 2102, as shown by FIG. 23B. A first patterned substrate 2100a is formed, for example, by a dry etching process, a wet etching process, or other suitable etching processes. All of the foregoing processes are listed as examples and not meant to limit the present embodiment.

Then, a thickness of the first patterned photoresist layer 2200 is reduced by a plasma ashing process until the first photoresist block 2210 is removed completely. The remaining second photoresist block 2220 partially exposes the first patterned substrate 2102, as shown by FIG. 23C.

Figure 23D:
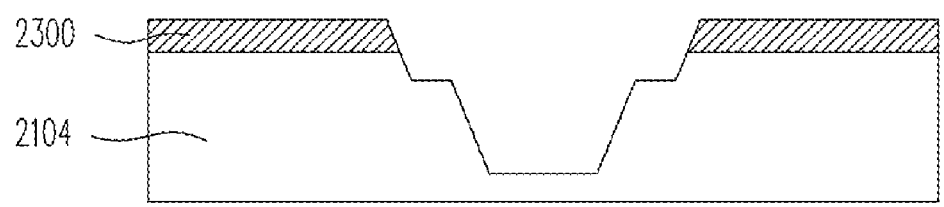
Figure 24A:
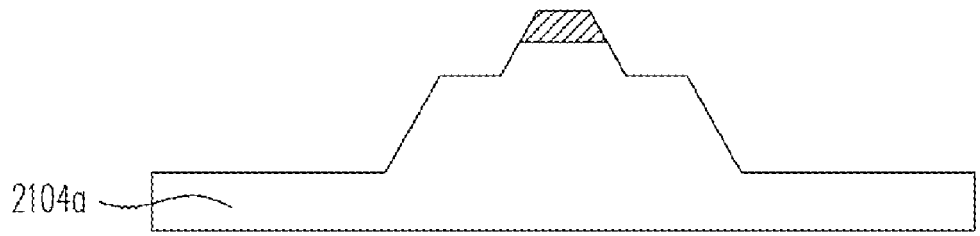
FIGS. 24A through 24D are schematic views of substrates fabricated by mask processes in other modes of embodiment.
Figure 24B:
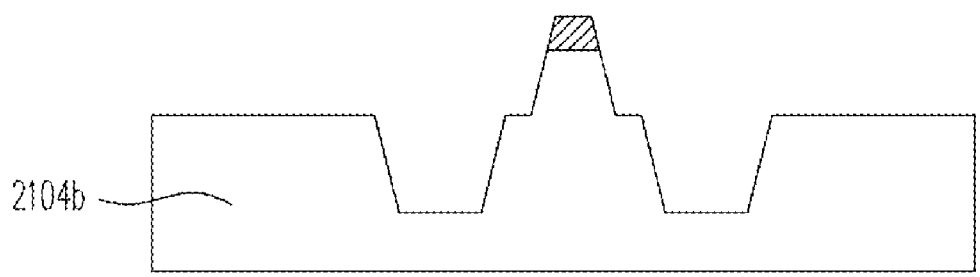
Figure 24C:
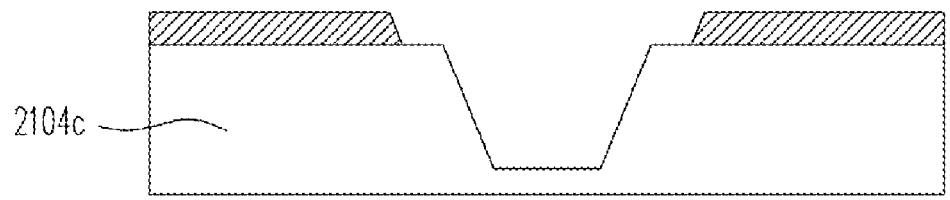
Figure 24D:
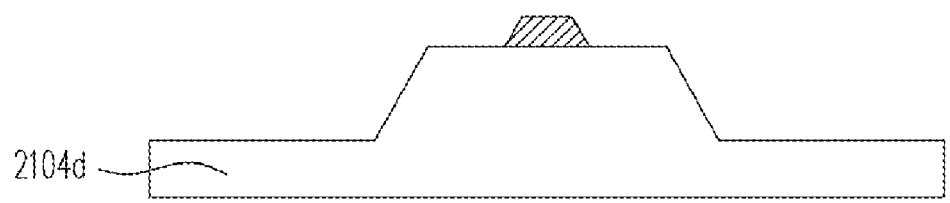

Next, the first patterned substrate 2102 is partially removed using the remaining second photoresist block 2220 as a mask to form a second patterned substrate 2104, as shown by FIG. 23D. According to the present embodiment, a second patterned substrate 2104 is formed by a dry etching process, a wet etching process, or other suitable etching processes, for example. Up to this step, the process steps of the second substrate 2104 are completed.

It should be noted that depending on different structures of the first patterned photoresist layer or different types of mask processes, the substrate may be formed as a substrate 2104a with a protrusion structure, a substrate 2104b with a concave-convex structure, a substrate 2104c with an irregular surface, or a substrate 2104d having a combination of the foregoing, as shown by FIGS. 24A through 24D. It is to be noted that that the fabricating methods of the said substrates may also be applied to the substrates mentioned in the first through the ninth embodiments.

In summary, the fabricating method of the light emitting diode chip as provided in the present invention has at least the following advantages: First, a half-tone mask process, a gray-tone mask process or a multi-tone mask process is performed to reduce some process steps and combined with a lift-off process to further reduce the process of the light emitting diode chip. For example, the passivation layer and the current blocking layer, the semiconductor device layer and the current spreading layer, or a combination of the foregoing layers, are formed simultaneously. Furthermore, in the present invention, a plurality of components is formed simultaneously by an identical process, which also reduces some steps in the process. In other words, the fabricating method of the light emitting diode chip in the present invention reduces the fabrication cost and the fabrication time.

It will be apparent to those skilled in the art that various modifications and variations can be made to the structure of the present invention without departing from the spirit and scope of the invention. In view of the foregoing, it is intended that the present invention cover modifications and variations of this invention provided they fall within the scope of the following claims and their equivalents.

What is claimed is:

1. A method for fabricating a light emitting diode chip, comprising:

forming sequentially a semiconductor device layer including a first type semiconductor material layer, a light emitting material layer and a second type semiconductor material layer on a substrate, a first patterned dielectric layer on the semiconductor device layer, and a current spreading layer covering the first patterned dielectric layer on the semiconductor device layer;

forming a dielectric layer on the semiconductor device layer and the current spreading layer;

forming a patterned photoresist layer on the dielectric layer;

removing partially the dielectric layer to form a second patterned dielectric layer with the patterned photoresist layer as a mask, wherein the second patterned dielectric layer exposes a portion of the semiconductor device layer and a portion of the current spreading layer;

forming an electrode material layer entirely; and removing the patterned photoresist layer to strip the electrode material layer thereon and form a plurality of electrodes, wherein the plurality of electrodes are electrically connected with the semiconductor device layer and the current spreading layer.

2. The method for fabricating the light emitting diode chip as claimed in claim 1, wherein the step of forming the semiconductor device layer, the first patterned dielectric layer and the current spreading layer comprises:

forming a semiconductor layer on the substrate;

patterning the semiconductor layer to form the semiconductor device layer;

forming the first patterned dielectric layer on the semiconductor device layer; and forming the current spreading layer on the semiconductor device layer to cover the first patterned dielectric layer.

3. The method for fabricating the light emitting diode chip as claimed in claim 2, wherein the semiconductor device layer, the first patterned dielectric layer and the current spreading layer are fabricated by different mask processes respectively.

4. The method for fabricating the light emitting diode chip as claimed in claim 1, wherein the step of forming the semiconductor device layer, the first patterned dielectric layer and the current spreading layer comprises:
forming a semiconductor layer on the substrate;
forming the first patterned dielectric layer on the semiconductor layer;
forming a conductive layer on the semiconductor layer to cover the first patterned dielectric layer; and
patterning the conductive layer and the semiconductor layer to form the current spreading layer and the semiconductor device layer simultaneously.

5. A method for fabricating a light emitting diode chip, comprising:
forming sequentially a semiconductor device layer on a substrate, a first patterned dielectric layer on the semiconductor device layer, and a current spreading layer covering the first patterned dielectric layer on the semiconductor device layer;
forming a dielectric layer on the semiconductor device layer and the current spreading layer;
forming a patterned photoresist layer on the dielectric layer;
removing partially the dielectric layer to form a second patterned dielectric layer with the patterned photoresist layer as a mask, wherein the second patterned dielectric layer exposes a portion of the semiconductor device layer and a portion of the current spreading layer;
forming an electrode material layer entirely; and
removing the patterned photoresist layer to strip the electrode material layer thereon and form a plurality of electrodes, wherein the plurality of electrodes are electrically connected with the semiconductor device layer and the current spreading layer;
wherein the step of forming the semiconductor device layer, the first patterned dielectric layer and the current spreading layer comprises:
forming a semiconductor layer on the substrate;
patterning the semiconductor layer to form the semiconductor device layer;
forming the first patterned dielectric layer on the semiconductor device layer; and
forming the current spreading layer on the semiconductor device layer to cover the first patterned dielectric layer.

6. The method for fabricating the light emitting diode chip as claimed in claim 5, wherein the semiconductor device layer, the first patterned dielectric layer and the current spreading layer are fabricated by different mask processes respectively.

7. A method for fabricating a light emitting diode chip, comprising:
forming sequentially a semiconductor device layer on a substrate, a first patterned dielectric layer on the semiconductor device layer, and a current spreading layer covering the first patterned dielectric layer on the semiconductor device layer;
forming a dielectric layer on the semiconductor device layer and the current spreading layer;
forming a patterned photoresist layer on the dielectric layer;
removing partially the dielectric layer to form a second patterned dielectric layer with the patterned photoresist layer as a mask, wherein the second patterned dielectric layer exposes a portion of the semiconductor device layer and a portion of the current spreading layer;
forming an electrode material layer entirely; and
removing the patterned photoresist layer to strip the electrode material layer thereon and form a plurality of electrodes, wherein the plurality of electrodes are electrically connected with the semiconductor device layer and the current spreading layer;
wherein the step of forming the semiconductor device layer, the first patterned dielectric layer and the current spreading layer comprises:
forming a semiconductor layer on the substrate;
forming the first patterned dielectric layer on the semiconductor layer;
forming a conductive layer on the semiconductor layer to cover the first patterned dielectric layer; and
patterning the conductive layer and the semiconductor layer to form the current spreading layer and the semiconductor device layer simultaneously.

* * * * *